US009236892B2

(12) United States Patent
Dupuy et al.

(10) Patent No.: US 9,236,892 B2
(45) Date of Patent: Jan. 12, 2016

(54) COMBINATION OF STEERING ANTENNAS, CPL ANTENNA(S), AND ONE OR MORE RECEIVE LOGARITHMIC DETECTOR AMPLIFIERS FOR SISO AND MIMO APPLICATIONS

(71) Applicant: DockOn AG, Zurich (CH)

(72) Inventors: Alexandre Dupuy, San Diego, CA (US); Patrick Rada, San Jose, CA (US); Forrest Brown, Carson City, NV (US)

(73) Assignee: DOCKON AG, Zurich (CH)

( * ) Notice: Subject to any disclaimer, the term of this patent is extended or adjusted under 35 U.S.C. 154(b) by 0 days.

(21) Appl. No.: 14/214,579

(22) Filed: Mar. 14, 2014

(65) Prior Publication Data

US 2014/0287704 A1    Sep. 25, 2014

Related U.S. Application Data

(60) Provisional application No. 61/798,521, filed on Mar. 15, 2013.

(51) Int. Cl.

| | |
|---|---|
| *H04B 1/04* | (2006.01) |
| *H04B 1/18* | (2006.01) |
| *H04B 1/525* | (2015.01) |
| *H01Q 3/24* | (2006.01) |
| *H01Q 3/36* | (2006.01) |
| *H01Q 7/00* | (2006.01) |
| *H01Q 9/42* | (2006.01) |
| *H01Q 21/28* | (2006.01) |

(52) U.S. Cl.

CPC .............. *H04B 1/0475* (2013.01); *H01Q 3/24* (2013.01); *H01Q 3/36* (2013.01); *H01Q 7/00* (2013.01); *H01Q 9/42* (2013.01); *H01Q 21/28* (2013.01); *H04B 1/18* (2013.01); *H04B 1/525* (2013.01); *H04B 2001/0408* (2013.01)

(58) Field of Classification Search

USPC .................. 455/91, 114.1, 114.2, 115.1, 126, 455/127.1, 129, 219, 223, 226.1, 73, 78; 375/219, 295, 296

See application file for complete search history.

(56) References Cited

U.S. PATENT DOCUMENTS

| | | | |
|---|---|---|---|
| 1,424,065 | A | 7/1922 | Armstrong |
| 2,363,651 | A | 11/1944 | Crosby |
| 2,644,081 | A | 6/1953 | Donald |
| 3,092,779 | A | 6/1963 | De Niet |

(Continued)

FOREIGN PATENT DOCUMENTS

| | | |
|---|---|---|
| EP | 1384281 A2 | 1/2004 |
| GB | 2354329 A | 3/2001 |

(Continued)

OTHER PUBLICATIONS

Insam; "Designing Super-Regenerative Receivers"; Electronic World; Apr. 2002; 19 pages.

(Continued)

*Primary Examiner* — Thanh Le

(74) *Attorney, Agent, or Firm* — Baker & Hostetler LLP

(57) ABSTRACT

Logarithmic Detector Amplifiers (LDAs), multiple antennas, active antennas, and multiple active antennas and receivers are provided in a variety of configurations that are synchronized to reduce or eliminate interference so at to provide, a greater range and bandwidth between wireless routers and their clients in WLAN and WAN environments.

48 Claims, 43 Drawing Sheets

(56) References Cited

U.S. PATENT DOCUMENTS

| | | |
|---|---|---|
| 3,320,530 A | 5/1967 | Pearman |
| 3,337,807 A | 8/1967 | Brown |
| 3,602,819 A | 8/1971 | Abbott et al. |
| 3,668,535 A | 6/1972 | Lansdowne |
| 3,724,954 A | 4/1973 | Dreyfoos |
| 3,791,272 A | 2/1974 | Nobusawa |
| 4,034,298 A | 7/1977 | McFadyen et al. |
| 4,393,514 A | 7/1983 | Minakuchi et al. |
| 4,510,624 A * | 4/1985 | Thompson et al. ............ 455/223 |
| 4,609,994 A | 9/1986 | Bassim et al. |
| 4,660,192 A | 4/1987 | Pomatto |
| 5,479,442 A | 12/1995 | Yamamoto |
| 5,621,756 A | 4/1997 | Bush et al. |
| 5,771,026 A | 6/1998 | Stengel |
| 5,789,996 A | 8/1998 | Borodulin |
| 5,995,814 A | 11/1999 | Yeh |
| 6,035,002 A | 3/2000 | Schleifer |
| 6,054,900 A | 4/2000 | Ishida et al. |
| 6,389,275 B1 | 5/2002 | Kawashima et al. |
| 6,420,937 B1 | 7/2002 | Akatsuka et al. |
| 6,421,535 B1 | 7/2002 | Dickerson et al. |
| 6,518,856 B1 | 2/2003 | Casale et al. |
| 6,538,528 B2 | 3/2003 | Louzir et al. |
| 6,574,287 B1 | 6/2003 | Swaminathan et al. |
| 6,668,165 B1 | 12/2003 | Cloutier |
| 6,668,619 B2 | 12/2003 | Yang et al. |
| 6,670,849 B1 | 12/2003 | Damgaard |
| 7,215,936 B2 | 5/2007 | Sadowski |
| 7,423,931 B2 | 9/2008 | Martin et al. |
| 7,567,099 B2 | 7/2009 | Edwards et al. |
| 7,612,616 B2 | 11/2009 | Deng |
| 7,751,996 B1 | 7/2010 | Ardizzone et al. |
| 7,819,022 B2 | 10/2010 | Hope |
| 7,848,384 B2 | 12/2010 | Pelissier et al. |
| 7,911,235 B2 | 3/2011 | Brown |
| 8,040,204 B2 | 10/2011 | Brown |
| 8,064,864 B2 | 11/2011 | Rofougaran |
| 8,144,065 B2 | 3/2012 | Brown |
| 8,149,173 B2 | 4/2012 | Brown |
| 8,164,532 B1 | 4/2012 | Brown |
| 8,265,769 B2 | 9/2012 | Denison |
| 8,326,340 B2 * | 12/2012 | Nalbantis et al. ............. 455/522 |
| 8,364,098 B2 | 1/2013 | Ridgers |
| 8,368,485 B2 | 2/2013 | Brown |
| 8,462,031 B2 | 6/2013 | Belot et al. |
| 8,542,768 B2 | 9/2013 | Kim et al. |
| 8,644,776 B1 * | 2/2014 | Nobbe et al. ................ 455/115.1 |
| 8,676,521 B2 | 3/2014 | Vennelakanti et al. |
| 2002/0109607 A1 | 8/2002 | Cumeral et al. |
| 2004/0229585 A1 | 11/2004 | Lu et al. |
| 2004/0240588 A1 | 12/2004 | Miller |
| 2005/0009480 A1 | 1/2005 | Vakilian et al. |
| 2005/0069051 A1 | 3/2005 | Lourens |
| 2005/0270172 A1 | 12/2005 | Bailey et al. |
| 2006/0028297 A1 | 2/2006 | Kang et al. |
| 2006/0226897 A1 | 10/2006 | Ruijter |
| 2007/0030099 A1 | 2/2007 | Carpentier et al. |
| 2007/0066265 A1 | 3/2007 | May |
| 2007/0105521 A1 | 5/2007 | Granata |
| 2007/0139130 A1 | 6/2007 | Kim et al. |
| 2007/0207749 A1 | 9/2007 | Rozenblit et al. |
| 2008/0101185 A1 | 5/2008 | Rozenblit et al. |
| 2008/0176529 A1 | 7/2008 | Lau |
| 2008/0269841 A1 | 10/2008 | Grevious et al. |
| 2009/0079524 A1 | 3/2009 | Cyr et al. |
| 2009/0079607 A1 | 3/2009 | Denison et al. |
| 2009/0147837 A1 | 6/2009 | Lau |
| 2009/0322544 A1 | 12/2009 | McDowell |
| 2010/0080270 A1 * | 4/2010 | Chen et al. ................ 375/219 |
| 2010/0152644 A1 | 6/2010 | Pesach et al. |
| 2010/0225417 A1 | 9/2010 | Mistretta et al. |
| 2010/0308999 A1 | 12/2010 | Chornenky |
| 2010/0313958 A1 | 12/2010 | Patel et al. |
| 2011/0007844 A1 | 1/2011 | Park et al. |
| 2011/0018777 A1 | 1/2011 | Brown |
| 2011/0037516 A1 | 2/2011 | Nejati et al. |
| 2011/0093220 A1 | 4/2011 | Yang et al. |
| 2011/0212692 A1 | 9/2011 | Hahn et al. |
| 2011/0234316 A1 | 9/2011 | Kim et al. |
| 2011/0301882 A1 | 12/2011 | Andersen |
| 2012/0019336 A1 | 1/2012 | Khan et al. |
| 2012/0106560 A1 | 5/2012 | Gumaste |
| 2012/0112852 A1 | 5/2012 | Manssen et al. |
| 2012/0121030 A1 | 5/2012 | Luo et al. |
| 2012/0164644 A1 | 6/2012 | Neely et al. |
| 2012/0190317 A1 | 7/2012 | Martineau et al. |
| 2012/0280754 A1 | 11/2012 | Gorbachov |
| 2013/0029350 A1 | 1/2013 | Cooper et al. |
| 2013/0059548 A1 | 3/2013 | Umeda et al. |
| 2013/0113666 A1 | 5/2013 | Orsi et al. |
| 2013/0128934 A1 | 5/2013 | Kang et al. |
| 2014/0150554 A1 | 6/2014 | Rada et al. |
| 2014/0154991 A1 | 6/2014 | Brown et al. |
| 2014/0266420 A1 | 9/2014 | Brown et al. |
| 2014/0266962 A1 | 9/2014 | Dupuy et al. |
| 2014/0269972 A1 | 9/2014 | Rada et al. |
| 2014/0273898 A1 | 9/2014 | Brown et al. |

FOREIGN PATENT DOCUMENTS

| | | |
|---|---|---|
| JP | 56-138340 A | 10/1981 |
| JP | 56-138342 A | 10/1981 |
| JP | S60-249436 A | 12/1985 |
| JP | 10-075273 A | 3/1998 |
| WO | WO 00/35124 A2 | 6/2000 |
| WO | WO 02/084782 A2 | 10/2002 |
| WO | WO 2008/075066 A2 | 6/2008 |
| WO | WO 2012/153147 A1 | 11/2012 |

OTHER PUBLICATIONS

International Patent Application No. PCT/US2014/029832; Int'l Preliminary Report on Patentability; dated Mar. 11, 2015; 7 pages.
U.S. Appl. No. 14/213,529, filed Mar. 14, 2014, Rada et al.
U.S. Appl. No. 14/216,945, filed Mar. 17, 2014, Rada et al.
Sanders B.J.; "Radical Combiner Runs Circles Around Hybrids," MicroWaves; Nov. 1980; vol. 19, No. 12; p. 55-58.
Caloz et al.;"Metamaterials for High-Frequency Electronics"; Proceedings of the IEEE; vol. 93; No. 10; Oct. 2005; p. 1744-1752.
International Patent Application No. PCT/US2014/029577; Int'l Preliminary Report on Patentability; dated Jun. 19, 2015; 17 pages.

* cited by examiner

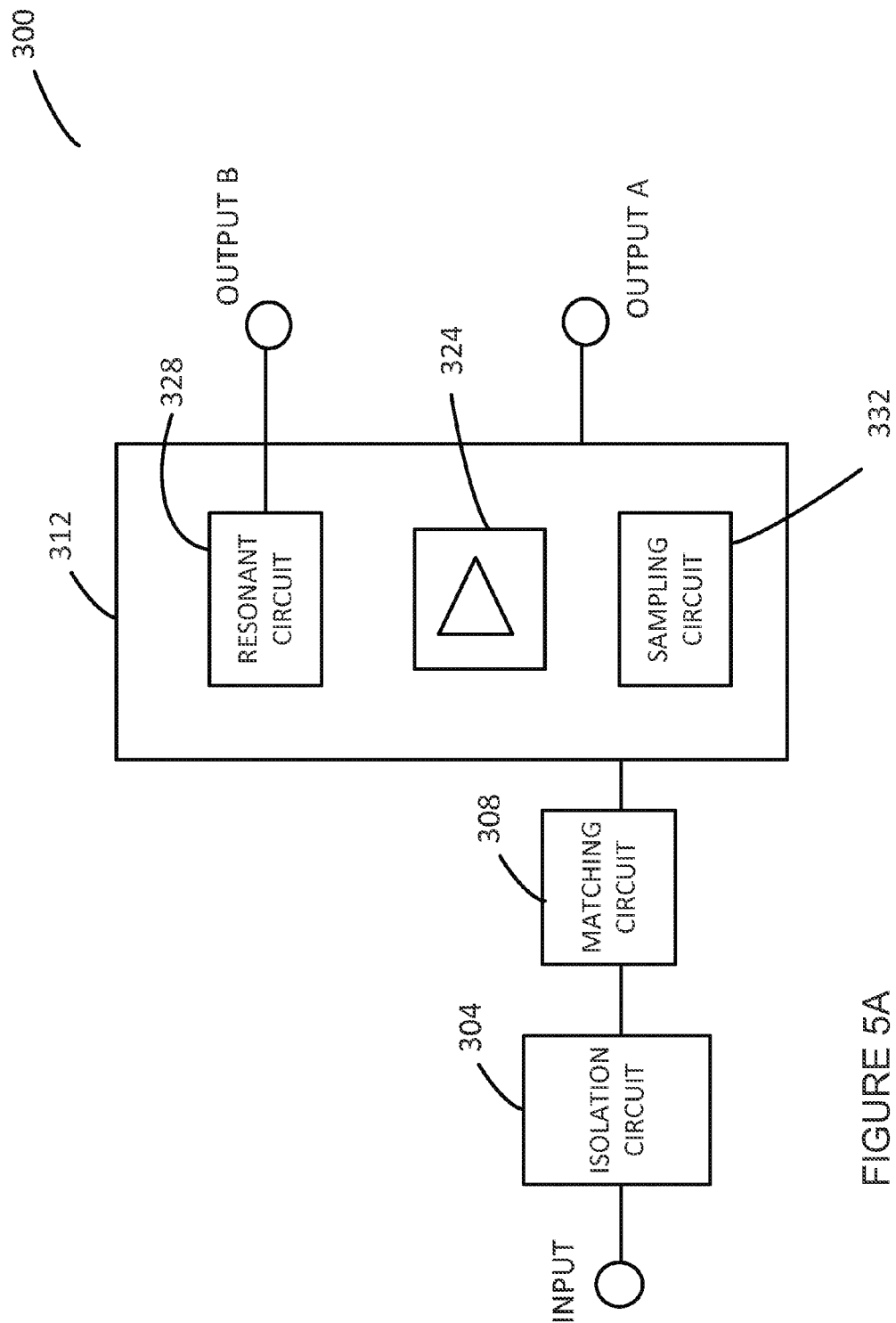

COMBINATION OF STEERING ANTENNAS, CPL ANTENNA(S), AND ONE OR MORE RECEIVE LOGARITHMIC DETECTOR AMPLIFIERS FOR SISO AND MIMO APPLICATIONS

CROSS REFERENCE TO RELATED APPLICATION

This application claims benefit of U.S. Provisional Patent Application No. 61/798,521 filed Mar. 15, 2013. The contents of that application are hereby incorporated by reference herein.

TECHNICAL FIELD

The invention relates to several methods and implementations of a logarithmic detector amplifier (LDA) to cancel radio interference in wireless and wired modes. Such methods include multiple antenna selection, adjustment, and steering on top of MIMO as well as methods where one LDA per receive antenna is used in conjunction with steering or CPL antennas for improving receiver performance. Under the umbrella of the invention includes subsets, one more specifically dealing with an embodiment in new high performance high integration RF front end making use of one or more LDAs, another one describing bidirectional uses of LDA including LDA as a transmit power amplifier, and finally integrated topology of LDA and active antennas

BACKGROUND

As new generations of cellular phones and other wireless communication devices become smaller and embedded with increased applications, new antenna designs are required to address inherent limitations of these devices and to enable new capabilities. With conventional antenna structures, a certain physical volume is required to produce a resonant antenna structure at a particular frequency and with a particular bandwidth. However, effective implementation of such antennas is often confronted with size constraints due to a limited available space in the device.

Antenna efficiency is one of the important parameters that determine the performance of the device. In particular, radiation efficiency is a metric describing how effectively the radiation occurs, and is expressed as the ratio of the radiated power to the input power of the antenna. A more efficient antenna will radiate a higher proportion of the energy fed to it. Likewise, due to the inherent reciprocity of antennas, a more efficient antenna will convert more of a received energy into electrical energy. Therefore, antennas having both good efficiency and compact size are often desired for a wide variety of applications.

Conventional loop antennas are typically current fed devices, which generate primarily a magnetic (H) field. As such, they are not typically suitable as transmitters. This is especially true of small loop antennas (i.e. those smaller than, or having a diameter less than, one wavelength). The amount of radiation energy received by a loop antenna is, in part, determined by its area. Typically, each time the area of the loop is halved, the amount of energy which may be received is reduced by approximately 3 dB. Thus, the size-efficiency tradeoff is one of the major considerations for loop antenna designs.

Voltage fed antennas, such as dipoles, radiate both electric (E) and H fields and can be used in both transmit and receive modes. Compound antennas are those in which both the transverse magnetic (TM) and transverse electric (TE) modes are excited, resulting in performance benefits such as wide bandwidth (lower Q), large radiation intensity/power/gain, and good efficiency. There are a number of examples of two dimensional, non-compound antennas, which generally include printed strips of metal on a circuit board. Most of these antennas are voltage fed. An example of one such antenna is the planar inverted F antenna (PIFA). A large number of antenna designs utilize quarter wavelength (or some multiple of a quarter wavelength), voltage fed, dipole antennas.

Use of MIMO (multiple input multiple output) technologies is increasing in today's wireless communication devices to provide enhanced data communication rates while minimizing error rates. A MIMO system is designed to mitigate interference from multipath environments by using several transmit (Tx) antennas at the same time to transmit different signals, which are not identical but are different variants of the same message, and several receive (Rx) antennas at the same time to receive the different signals. A MIMO system can generally offer significant increases in data throughput without additional bandwidth or increased transmit power by spreading the same total transmit power over the antennas so as to achieve an array gain. MIMO protocols constitute a part of wireless communication standards such as IEEE 802.11n (Wi-Fi), 4G, Long Term Evolution (LTE), WiMAX and HSPA+. However, in a configuration with multiple antennas, size constraints tend to become severe, and interference effects caused by electromagnetic coupling among the antennas may significantly deteriorate transmission and reception qualities. At the same time, efficiency may deteriorate in many instances where multiple paths are energized and power consumption increases.

Such deterioration in transmission and reception quality is particularly problematic for WLAN and WAN applications as coverage, effective throughput delivered at any point, and the level of interference, and capacity are particularly important parameters for effective wideband connectivity. The performance expectations for WLAN and WAN with new applications such as casual video streaming are very high and antennas used in such systems must be able to address these performance issues to improve performance.

There are many opportunities to improve the performance as experienced by the end-user whether on a WAN with his smart phone or on private or public WLAN network with his PC or handheld device. Specifically, WLAN has room for improvement in residential deployment in a residential scenario where each dwelling has one or more Wi-Fi access point(s) or router(s). The coverage and throughput at range has improved drastically over the years and, on average, the majority of users get good coverage and throughout data in their home. However, an increasing problem is the scarcity of available bandwidth and the related interference problems increasing each year. The first ISM band for a WLAN use was 900 MHz in the USA. With the abundance of devices such as cameras and cordless phones and various protocols and different modulation schemes, the 900 MHz band became rapidly overcrowded. The 2.4 GHz band was then allocated and used for IEEE 802.11b and 802.11g devices on 11 channels but only 3 non-overlapping channels.

New cordless phones (e.g: Digital Enhanced Cordless Telecommunications DECT 6.0) were also introduced in the 2.4 GHz band and the current status is that, on average, in any metropolitan area or suburb, each WLAN node sees 5 or 10 routers in the vicinity. For routers it means competition for bandwidth since they see each-other as rogue applications. Algorithms for decreasing transmit power and back off (delay) transmission exist, but on the practical side they are not applied too often in Wi-Fi applications. Whereas for LTE, WCDMA there is a constant power adjustment between the mobile handset user equipment (UE) and the evolved node B (enode B), base transceiver station in GSM. On average, the 2.4 GHz band is also overcrowded. The relatively new use of the 5 GHz band provides much more non-overlapping channels but the continuous hunger for more bandwidth exacerbated by the need for more video at a higher definition suggests a need for more bandwidth resources such as 802.11ac with the provision of a 160 MHz bandwidth.

The performance problems with WLAN and WAN systems generally have been addressed by the development of new generation 802.11b/g/a/n wireless cards and modules. However, nearby wireless LANs conflict with each other, due largely to interference cancellation of overlapping channels. This conflict reduces bandwidth as the client gets farther from a router, and closer to competing routers in neighboring WLANs. Also, weak throughput data or underperformance for video applications due to interference remains a problem and provides a major opportunity for performance improvement. Moreover, the current 802.11 systems must be compared with new competing wireless standards such as an LTE-Advanced release 10 that promise up to 3 Gbps of data in download (DL) and up to 1.5 Gbps in upload (UL) for cellular devices, tablets and PC through bridging modes. A major difference is the synchronization aspect of cellular networks such as LTE versus Wi-Fi in residential environments. Interference problems should not exist or be much lower with LTE versus Wi-Fi; however, less than perfect capacity and low throughput due to multipath fading still exists even for a synchronized WAN.

The present applicant has developed logarithmic detector amplifiers (LDAs) that address the above issues by enabling a receiver to receive lower level systems more reliably in the presence of noise. Also, LDAs permit the transmit power of the transmitter to be proportionately decreased to provide lower levels of interference for neighboring devices. An exemplary LDA is described in U.S. Pat. No. 7,911,235, the contents of which are incorporated herein by reference. As explained therein, an LDA includes an amplifier (e.g., a discrete transistor or an operational amplifier), means for setting a frequency of operation of the detector (e.g., a tuned L-C or R-C tuned feedback circuit or phase-locked loop), and a controller. An input signal to the amplifier causes an oscillation in the amplifier, and the controller senses a threshold indicative of oscillation and in response to detecting oscillation interrupts the oscillation of the amplifier such that the frequency of the interruption is proportional to a logarithm of the power of the input signal.

During operation, electrical noise at the input of the amplifier sets up oscillations in the circuit at the frequency determined by the L-C tuned feedback circuit. Noise outside the bandwidth of the tuned circuit has minimal effect on the operation of the circuit. On the other hand, incoming signals lying within the bandwidth of the L-C tuned feedback circuit cause the oscillator to oscillate more rapidly than if random noise alone were exciting the circuit. In the event that there is a wanted signal amongst received noise, the relative level of the input signal at the set frequency of operation is higher and a threshold will be reached sooner than would be the case for random noise alone. The higher the level of the wanted signal, the sooner the threshold is reached and the interruption of the oscillation will be more frequent. Accordingly, wanted signals having the desired frequency cause oscillations to occur more quickly than will random noise alone. Such LDAs have been shown to be quite effective in canceling interference.

It is desired to address the afore-mentioned problems in the art by providing greater spatial diversity. In traditional mobile cellular network systems, the base station has no information on the position of the mobile units within the cell and radiates the signal in all directions within the cell in order to provide radio coverage. This results in wasting power on transmissions when there are no mobile units to reach, in addition to causing interference for adjacent cells using the same frequency, so called co-channel cells. Likewise, in reception, the antenna receives signals coming from all directions including noise and interference signals. By using smart antenna technology and differing spatial locations of mobile units within the cell, space-division multiple access techniques offer attractive performance enhancements. The radiation pattern of the base station, both in transmission and reception, is adapted to each user to obtain highest gain in the direction of that user. This is often done using phased array techniques.

In view of the increased spatial diversity using such antennas and the significant improvements in interference cancellation when using LDAs, it is desired in accordance with the invention to explore the use of LDAs in new applications in wireless and wired communications. In particular, it is desired to synchronize LDAs, multiple antennas, active antennas, and multiple active antennas and receivers to reduce or eliminate interference, thereby providing greater range and bandwidth between wireless routers and their clients. The invention addresses these and other needs in the art.

SUMMARY

The claimed antenna systems address the above mentioned needs in the art by implementing one or more solutions including antennas adapted to improve spatial diversity with LDAs adapted to reduce or substantially eliminate interference in wireless communications. As noted above, nearby wireless LANs conflict with each other, due largely to interference cancellation of overlapping channels. This conflict reduces bandwidth as the client gets farther from a router, and closer to competing routers in neighboring WLANs. Through use of LDAs, multiple antennas, active antennas, and multiple active antennas and receivers synchronized to reduce or eliminate this cancellation, a greater range and bandwidth between wireless routers and their clients may be provided using the invention as described herein.

The invention described herein tackle this problem of interference and looks at various solutions using LDAs, multiple antennas, active antennas, and multiple active antennas and receivers to reduce interference in part or totally. Various embodiments are described herein including:

1. An LDA as a receiver low noise amplifier (LNA) at the base of an antenna, such as a Compound Printed Loop (CPL) antenna.

2. An RF front end including a transmitter power amplifier, and RF transmit/receive switch, optional bandpass filter, further including an LDA as a receiver LNA with the same input/output frequency.

3. LDAs as an RF front end to antennas where the LDA is used:
   a. as a bidirectional full duplex or half-duplex amplifier device,
   b. as a transmitter power amplifier,
   c. as a transmitter power amplifier with integral logarithmic conversion power detector output to baseband for transmit power level feedback,
   d. as a replacement for an RF front end with multibands or variable transmitter and receiver to cover different bands for full duplex or half-duplex time division multiplex or frequency division multiplex applications, e. as a replacement for an RF front end with a splitter (and optional band pass filter), or f. as a replacement for an RF front end without a splitter (and optional band pass filter) where the receiver path is at another frequency for full or half duplex configurations.

4. An RF front end LDA-based with one LDA system per antenna for a SISO or MIMO transceiver, receiver, or transmitter.

5. Various architectures that permit reduction of interference in SISO or MIMO with an adjustable antenna and an LDA-based RF front end.

6. Various architectures that permit reduction of interference in SISO or MIMO with an adjustable CPL antenna and a non-LDA RF front end.

7. An architecture using one or more selectable, adjustable, steerable antenna(s) in conjunction with one receive LDA per antenna to control the antenna for SISO or MIMO.

8. An architecture using one or more selectable, adjustable, steerable antenna(s) in conjunction with one transmit/receive LDA per antenna to control the antenna for SISO or MIMO.

9. An architecture using one or more selectable, adjustable, steerable antenna(s) in conjunction with one integrated LDA power amplifier per module at the base of the antenna to control the antenna.

10. An architecture using one or more selectable, adjustable, steerable antenna(s) in conjunction with a bidirectional LDA at an RF frequency where the LDA is used as a transmitter power amplifier in reverse, a receiver LNA in direct, and an RF switch is replaced by a splitter for the transmit and receive paths, including control for the adjustable antenna.

11. An architecture using one or more selectable, adjustable, steerable antenna(s) in conjunction with a bidirectional LDA including receiver demodulation where the LDA is used as a transmitter power amplifier in reverse, a receiver LNA in direct, an RF switch is replaced by a splitter for the transmit and receive paths, and a receiver LNA-like LDA feeds a QPSK demodulator, including control for the adjustable antenna.

12. An architecture using one or more selectable, adjustable, steerable antenna(s) directly connected to nodes of the unidirectional or bidirectional LDA where the phase, the between the antenna's signals can be electronically controlled by parameters of the LDA.

13. An architecture using one or more selectable, adjustable, steerable antenna(s) directly connected to nodes of the unidirectional or bidirectional LDA where one or more of a group of antenna phase, antenna frequency bandwidth, antenna frequency central frequency, steering between the antenna can be electronically controlled by parameters of the LDA.

Adding an LDA in the receiver chain may provide added selectivity and interference rejection, while using a MIMO or other diversity scheme allows the system to use the multipath fading at an advantage and to send multiple streams of data when the spatial diversity is large enough. Steerable antennas or related means allows one to adjust dynamically the pattern, direction, or gain of the antennas. Finally, the embodiments described herein are provided to show the breadth of options and advantages made possible by using LDAs with antennas as described herein and that the embodiments herein do not show all possible such configurations possible within the scope of the invention.

BRIEF DESCRIPTION OF THE DRAWINGS

The foregoing and other beneficial features and advantages of the invention will become apparent from the following detailed description in connection with the attached figures, of which:

FIG. 5A is a block diagram illustrating another embodiment of an LDA system.

FIG. 33 illustrates a SP4T switch that can be connected to different electrical phases, where these phases can be implemented with microstrip, CPWG, lumped elements, waveguides, and the like.

DETAILED DESCRIPTION OF ILLUSTRATIVE EMBODIMENTS

Figure 1:
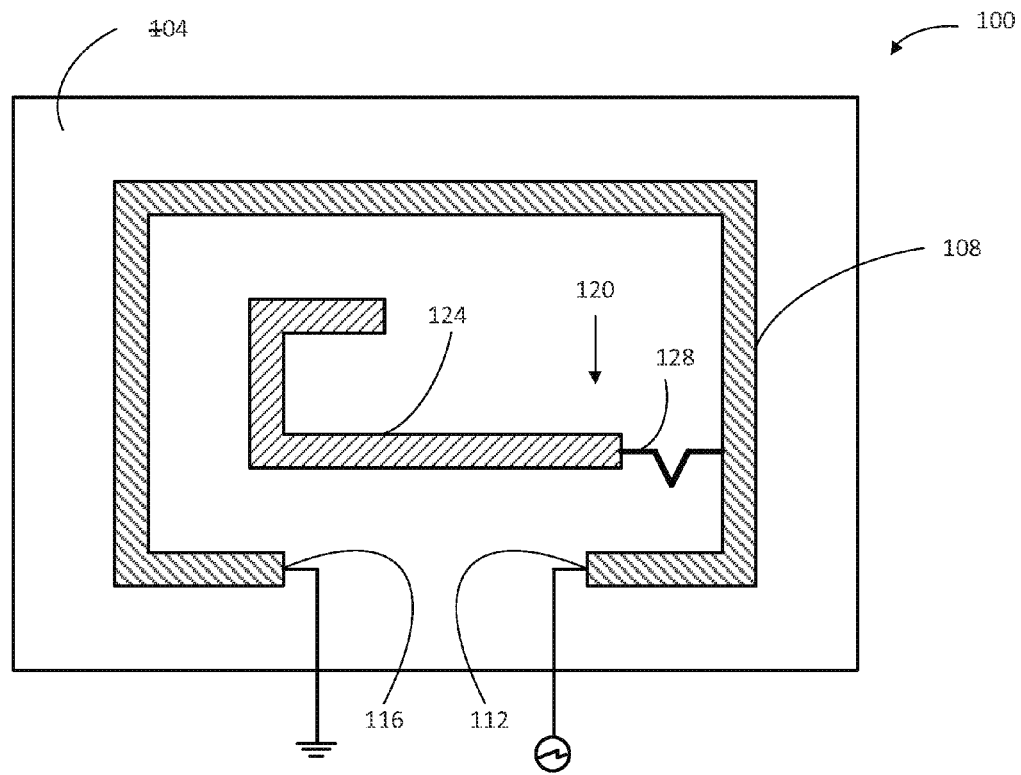
FIG. 1 illustrates an example of a planar CPL antenna.

The present invention may be understood more readily by reference to the following detailed description taken in connection with the accompanying figures and examples, which form a part of this disclosure. It is to be understood that this invention is not limited to the specific products, methods, conditions or parameters described and/or shown herein, and that the terminology used herein is for the purpose of describing particular embodiments by way of example only and is not intended to be limiting of any claimed invention. Similarly, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer both to methods and software for implementing such methods.

A detailed description of illustrative embodiments of the present invention will now be described with reference to FIGS. 1-42. Although this description provides a detailed example of possible implementations of the present invention, it should be noted that these details are intended to be exemplary and in no way delimit the scope of the invention.

As noted above, the invention combines various configurations of LDAs with various adjustable antennas to provide systems with significantly reduced interference in WLAN and WAN environments, enhanced RF performance in term of receive sensitivity, interference rejection, EMI reduction due to minimized RF lines lengths, and improvements in term of integration and deployment in commercial products, that is reduction of numbers of components, easy integrated circuit integration, affordability, low power consumption and low size. Several possible antenna configurations, LDA configurations and combinations of same will be described herein to exemplify the features and advantages of the invention.

Active CPL Antenna

A broad range of antennas can be used in exemplary embodiments. An exemplary antenna is the (Compound Printed Loop) CPL antenna which can excite both TE and TM. These antennas have a high gain, high efficiency, low return loss, low voltage standing wave ratio (VSWR), and a wide bandwidth of more than one octave. Depending of the application, the radiation pattern may be omnidirectional or directional. CPL antennas are the first commercially viable compound planar antennas that utilize both magnetic loop radiators and co-located electric fields. When using a CPL antenna, it is possible to implement a diode in the loop to change the impedance when the diode is placed in a forward biased position by changing its bias. It is also possible to put a variable capacitor in the loop to load it with different impedance. The variable capacitor may also be a varactor, a digital capacitor, or an array of capacitors that are commuted. A variable inductor may also be placed in the loop of the antenna to change its impedance.

In view of known limitations associated with conventional antennas, in particular with regard to radiation efficiency, a compound loop antenna (CPL), also referred to as a modified loop antenna, has been devised to provide both transmit and receive modes with greater efficiency than a conventional antenna with a comparable size. Examples of structures and implementations of the CPL antennas are described in U.S. Pat. No. 8,144,065, issued on Mar. 27, 2012, U.S. Pat. No. 8,149,173, issued on Apr. 3, 2012, and U.S. Pat. No. 8,164, 532, issued on Apr. 24, 2012. Key features of the CPL antennas are summarized below with reference to the example illustrated in FIG. 1.

FIG. 1 illustrates an example of a planar CPL antenna 100. In this example, the planar CPL antenna 100 is printed on a printed circuit board (PCB) 104, and includes a loop element 108, which in this case is formed as a trace along rectangle edges with an open base portion providing two end portions 112 and 116. One end portion 112 is a feed point of the antenna where the current is fed. The other end portion 116 is shorted to ground. The CPL antenna 100 further includes a radiating element 120 that has a J-shaped trace 124 and a meander trace 128. In this example, the meander trace 128 is configured to couple the J-shaped trace 124 to the loop element 108. The radiating element 120 essentially functions as a series resonant circuit providing an inductance and a capacitance in series, and their values are chosen such that the resonance occurs at the frequency of operation of the antenna. Instead of using the meander trace 128, the shape and dimensions of the J-shaped trace 124 may be adjusted to connect directly to the loop element 108 and still provide the target resonance.

Similar to a conventional loop antenna that is typically current fed, the loop element 108 of the planar CPL antenna 100 generates a magnetic (H) field. The radiating element 120, having the series resonant circuit characteristics, effectively operates as an electric (E) field radiator (which of course is an E field receiver as well due to the reciprocity inherent in antennas). The connection point of the radiating element 120 to the loop element 108 is critical in the planar CPL antenna 100 for generating/receiving the E and H fields that are substantially orthogonal to each other. This orthogonal relationship has the effect of enabling the electromagnetic waves emitted by the antenna to effectively propagate through space. In the absence of the E and H fields arranged orthogonal to each other, the waves will not propagate effectively beyond short distances. To achieve this effect, the radiating element 120 is placed at a position where the E field produced by the radiating element 120 is 90° or 270° out of phase relative to the H field produced by the loop element 108. Specifically, the radiating element 120 is placed at the substantially 90° (or 270°) electrical length along the loop element 108 from the feed point 112. Alternatively, the radiating element 120 may be connected to a location of the loop element 108 where current flowing through the loop element 108 is at a reflective minimum.

In addition to the orthogonality of the E and H fields, it is desirable that the E and H fields are comparable to each other in magnitude. These two factors, i.e., orthogonality and comparable magnitudes, may be appreciated by looking at the Poynting vector (vector power density) defined by P=E×H (Volts/m×Amperes/m=Watts/m2). The total radiated power leaving a surface surrounding the antenna is found by integrating the Poynting vector over the surface. Accordingly, the quantity E×H is a direct measure of the radiated power, and thus the radiation efficiency. First, it is noted that when the E and H are orthogonal to each other, the vector product gives the maximum. Second, since the overall magnitude of a product of two quantities is limited by the smaller, having the two quantities (|H| and |E| in this case) as close as possible will give the optimal product value. As explained above, in the planar CPL antenna, the orthogonally is achieved by placing the radiating element 120 at the substantially 90° (or 270°) electrical length along the loop element 108 from the feed point 112. Furthermore, the shapes and dimensions of the loop element 108 and the radiating element 120 can be each configured to provide comparable, high |H| and |E| in magnitude, respectively. Therefore, in marked contrast to a conventional loop antenna, the planar CPL antenna can be configured not only to provide both transmit and receive modes, but also to increase the radiation efficiency.

Size reduction can be achieved by introducing a series capacitance in the loop element and/or the radiating element of the CPL antenna. Such an antenna structure, referred to as a capacitively-coupled compound loop antenna (C2CPL), has been devised to provide both transmit and receive modes with greater efficiency and smaller size than a conventional antenna. Examples of structures and implementations of the C2CPL antennas are described in U.S. patent application Ser. No. 13/669,389, entitled "Capacitively Coupled Compound Loop Antenna," filed Nov. 5, 2012.

LDA+CPL Antenna

In an exemplary embodiment, a Logarithmic Detector Amplifier (LDA) is integrated directly on the antenna. The LDA circuit of the type generally described in the aforementioned U.S. Pat. No. 7,911,235 incorporated by reference or described in related and co-pending PCT applications filed even date herewith (client reference number 101607.000129, 101607.000131, and 101607.000145 and also incorporated herein by reference, can perform various functions, some simultaneously, including: logarithmic detection and amplification, signal regeneration, low noise amplification at the same input and output frequency, frequency conversion, noise filtering, interference rejection, and analog/digital amplitude, phase and frequency demodulation. These functions increase sensitivity and bandwidth, lower the power consumption, improve interference rejection and signal to noise ratios, and extend wireless range of digital and analog AM, FM, and PM inputs. The specific applications of LDA technology are numerous.

The combination of an LDA with a CPL antenna in exemplary embodiments can greatly improve the wireless communications for wireless LAN applications, for example. As noted above, an important limitation in wireless communication is the level of interference that can reduce severely the throughput and the wireless reach. This is probably one of the main limitations for Wi-Fi when deployed in residential areas where many wireless routers are present and none of them are synchronized together (residence to residence). Each router is seen by the others as rogue-access point and this generates a significant level of interferences when in near proximity. Interferences force each router to back-off the data rate and reduce it to a lower level to maintain a minimum bit error rate (BER). More and more people have wireless routers, access points, repeaters, computers, tablets, cellphones, televisions, game consoles, and the like. In addition, each neighbor has a similar setup in his house and, as a result, nearby wireless LANs of other neighbors may create conflicts. This is due largely to interference cancellation of overlapping channels. This conflict reduces the bandwidth as the client gets farther from its router and closer to competing routers in neighboring WLANs. The combination of an LDA with a CPL antenna can be synchronized on each client and its router to reduce or eliminate this cancellation, and thereby providing greater selectivity, range and bandwidth between wireless routers and their clients.

WLAN, WAN, and Wi-Fi achieves superior receive sensitivity, interference cancellation, and bandwidth via two LDAs synchronized with the desired channel in combination with CPL™ antennas having low IF conversion, and (in the case of digital input/output) replacement of the two analog/digital converters by frequency to digital converters. The LDA enhances the regenerative digital output of devices using QPSK modulation, which in turn reduces interference cancellation by improving discrimination between channels. Also, by using different antennas and tuning sections, the same wireless receiver technology can also receive and demodulate WLAN, XM satellite, and Wi-Fi signals.

In exemplary embodiments, the LDA may use a phase-locked loop (PLL) circuit to find the best channel for the client-router to use and filter out adjacent or overlapping channels using intensity differences and phase differentiation. The LDA with PLL can distinguish signals that are 6 dB stronger than interference, and 3 dB better than existing systems.

In addition, the conversion of an input signal to frequency modulation in the IF range, and the use of logarithmic decompression, is particularly effective at reducing noise and expands the dynamic range of weak signals with low signal to noise ratios, thereby increasing the sensitivity and range (and decreasing the power usage) of splatter-prone radar, as well as micro-signal medical devices like ultrasound, MRIs, and CAT scans, fish finders and sonar in general, collision avoidance, and other applications.

Moreover, the ability of LDAs to filter random noise from weaker signals gives them the means to regenerate very weak signals such as several or more dBs versus the best low-noise amplifiers (LNAs). On the top of consuming generally less than LNAs the RF transmit power on both sides of the communication may be reduced by a few dB given the extra receive sensitivity that is overall better link budget. To further reduce the output power of cell phones, and thereby extend their battery life and range by up to three times, LDA technology can be integrated directly into IC chips in the phone.

The LDA also may be the core of a high performance digital radio receiver solution for multiple active antennas, plus 802.11ac/MIMO and orthogonal frequency division multiplexing (OFDM) for higher data capacity. In such configurations, each CPL antenna may have a high performance LDA-based receiver. When the LDA is connected to the antenna it helps the isolation between each antenna.

As will also be described in more detail below, the LDA can also be implemented on electronically steerable antennas. Also, the CPL antenna may be replaced by a convention wideband antenna in the embodiments described herein, as appropriate for the application.

Figure 2:
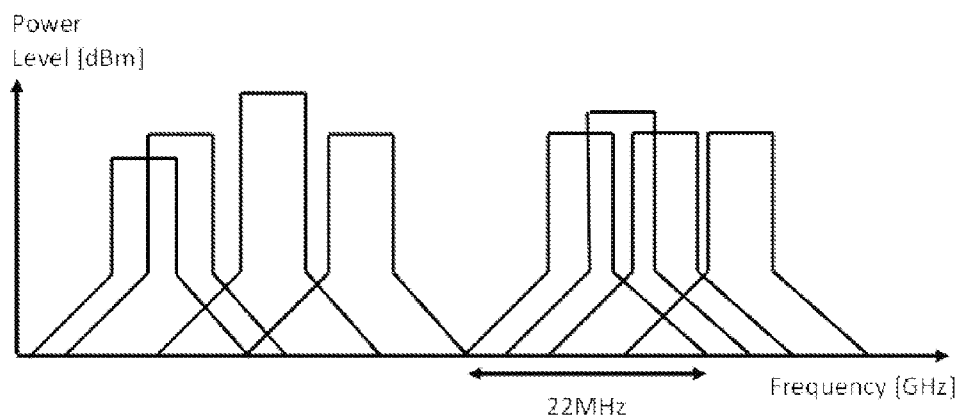
FIG. 2 illustrates power level versus frequency for a Wi-Fi 802.11 2.4-2.5 GHz spectrum where several OFDM signals may coexist or interfere in alternate or adjacent channels or worse due to co-channel interference.

FIG. 2 illustrates power level versus frequency for a Wi-Fi 802.11 2.4-2.5 GHz spectrum where several OFDM signals may coexist or interfere in alternate or adjacent channels or worse due to co-channel interference. It will be appreciated that an LDA could help in every one of these situations when its frequency bandwidth is limited to the width of one channel, selecting it and suppressing the signals outside of its frequency bandwidth. The LDA may also be locked to the channel with a PLL and also help for co-channel interference since locked in phase with the master clock of the receiver and the other side desired transmitter (and out of phase with rogue APs).

Exemplary LDAS

Figure 3:
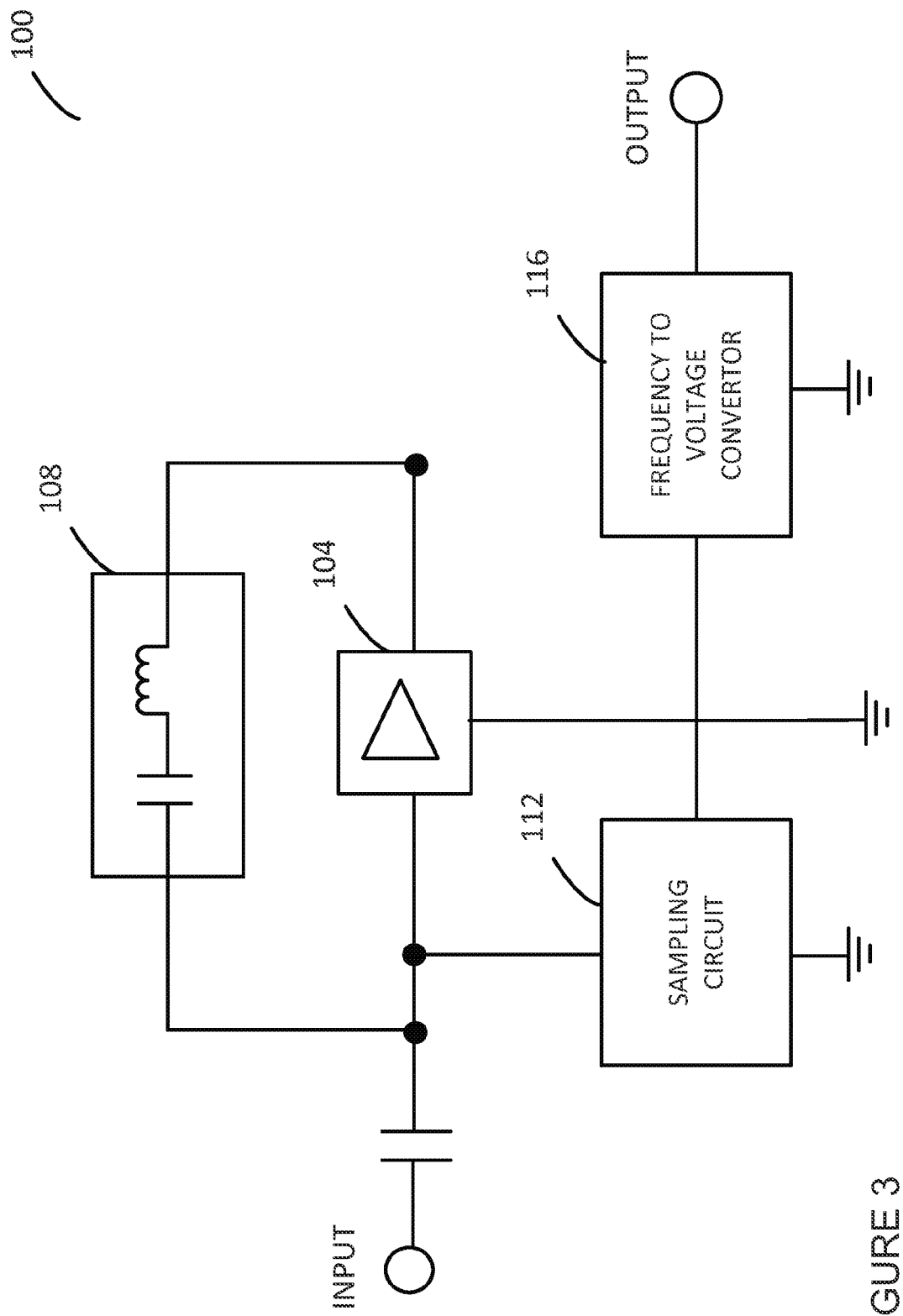
FIG. 3 is a block diagram illustrating an embodiment of an logarithmic detector.

In addition to the LDAs described in the afore-mentioned U.S. Pat. No. 7,911,235, the invention may implement any of variety of LDAs depending upon the configuration. For example, FIG. 3 is a block diagram illustrating an embodiment of the logarithmic detector 100. In this embodiment, the input signal from the input terminal, labeled INPUT, may be received by an amplifying circuit 104. The amplifying circuit 104 may be configured to amplify the input signal and may include any suitable amplifying element, such as an operational amplifier, a bipolar junction transistor (BJT), a field-effect transistor (FET) or other discrete transistor, a vacuum tube, a RF amplifier, and the like. Oscillation may be initiated in the amplifying circuit 100 in response to electrical noise and/or a desired signal. The oscillation may be terminated periodically in response to the magnitude of the input signal. A resonant circuit 108, which may be configured to be a feedback circuit, may be coupled in parallel with the amplifying circuit 104 to control a frequency of operation. In the embodiment of FIG. 3, the resonant circuit 108 may include a series LC circuit, wherein the L and C values may be selected to have a resonant frequency corresponding to the frequency of operation of the logarithmic detector 100. The oscillations may be set up in the amplifying circuit 104 at the frequency determined by the L and C values. Thus, noise outside of the LC resonance may have a minimal effect on the operation of the LC circuit. Input signals within the bandwidth of the LC resonance may commence oscillation more rapidly than random noise alone. The factor of merit or factor Q of the circuit may be determined mostly by the components used in the resonant circuit 108. A high-Q circuit may be achieved by use of a crystal resonator, for example, within the resonant circuit 108.

A sampling circuit 112 may be coupled to the amplifying circuit 104. The sampling circuit 112 may be configured to effectively sample the current flowing in the voltage supply line to the amplifying circuit 104; once a predetermined threshold is reached, the sampling circuit 112 may act to cease the oscillation. That is, the sampling circuit 112 may be used to periodically interrupt the oscillation each time when the threshold is reached. A frequency to voltage convertor 116 may be coupled to the sampling circuit 112. The input to the frequency to voltage convertor 116 may include a series of voltage spikes, denoted as repetition frequency Frep as further described herein, the frequency of which may vary substantially as the logarithm of the power of the input signal. The OUTPUT from the frequency to voltage convertor 116 may be a DC voltage that is proportional to the frequency of the input spikes.

In the case where the input signal is modulated, the OUTPUT of the frequency to voltage converter 116 may include a DC voltage component and an AC voltage component. The AC component may correspond to the input modulation and effectively be a copy of the demodulated input signal in baseband.

Figure 4:
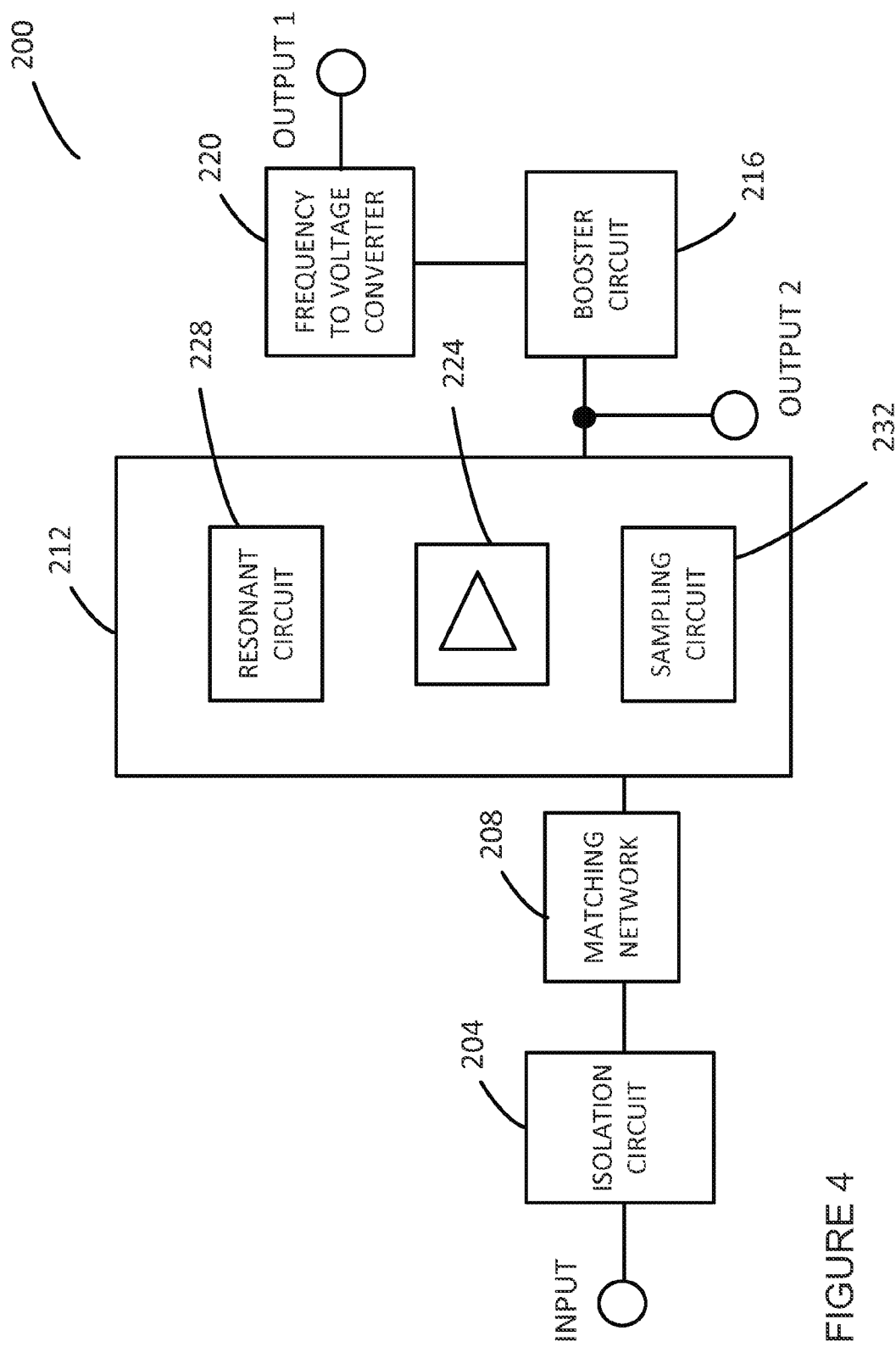
FIG. 4 is a block diagram illustrating an embodiment of an LDA system where the output frequency is not the same as the input.

The embodiment of the logarithmic detector explained above may be adapted in a variety of ways to be implemented for various electronics applications. A logarithmic detector amplifier (LDA) system may be provided with certain basic properties and may be modified for suitable performance enhancement in target applications. FIG. 4 is a block diagram illustrating an embodiment 200 of an LDA system. The LDA system 200 may include an isolation circuit 204, a matching network 208, an LDA core 212, a booster circuit 216, and a frequency to voltage converter 220. The output may be coupled to the frequency to voltage converter 220 in this example, as labeled OUTPUT 1. The booster circuit 216 and/or the frequency to voltage converter 220 may be optional elements; one of them or both may be omitted depending on the target application. When the LDA system 200 does not include the booster circuit 216 and the frequency to voltage converter 220, the output port may be placed directly off the LDA core 212, as represented by OUTPUT 2 in FIG. 4. The LDA core 212 may include an amplifying circuit 224, a resonant circuit 228, and a sampling circuit 232, which may be configured to operate and function similarly to the amplifying circuit 104, the resonant circuit 108, and the sampling circuit 112 of the logarithmic detector 100 of FIG. 3.

The isolation circuit 204 may be used to filter out power leaks, reflected signals from the LDA core 212, and other interference effects from the surrounding circuits, in particular the Tx chain, to protect the Rx chain and optimize regeneration. In particular, signals reflected back from the LDA core input to the isolation circuit 204 with an unknown phase relative to the input signal may have a detrimental effect on signal regeneration when the regeneration buildup process is synchronous. With a reflected, out of phase signal mixing with the input signal, the regeneration process cannot be achieved as desired and poor performance may result.

Leaked power may also find a way into the receiver input, likely an antenna, and be radiated as unwanted emission or EMI. The isolation circuit 204 may include a circulator for such isolation purposes. A circulator in the Rx chain may be configured to pass the Rx signals and short out unwanted leaks and reflections to ground. A typical circulator includes a ferromagnetic element, such as ferrite, to correct non-linearity. However, ferromagnetic elements are generally bulky and expensive. Instead of a circulator, the isolation circuit 204 may be configured to have a low noise amplifier (LNA) or any passive or active device, which may provide enhanced gain (for an active circuit), improved isolation, signal-to-noise ratio, and bandwidth. The matching network 208 may be used for impedance matching and/or phase correction purposes. Based on a mechanism similar to the one explained with reference to FIG. 3, the LDA core 212 may output a series of voltage spikes, Frep, the frequency of which varies substantially as the logarithm of the power of the input signal. The signal Frep may be outputted from OUTPUT 2 or sent to the booster circuit 216 and/or the frequency to voltage circuit 220 to be further processed and outputted from OUTPUT 1. The booster circuit 216 may include one or more transistors or any other suitable amplifying components to amplify the signal Frep, for example, from about 100 mV to several V. The booster circuit may further include a Schmidt trigger circuit or any simple digital circuit, such as a digital inverter, to digitize the amplified Frep to obtain cleaner and sharper spikes. The output signal from the booster circuit 216 may be sent to the frequency to voltage converter 220, where the signal is converted to a DC plus AC voltage, such as in an audio range, to be outputted from OUTPUT 1.

As mentioned earlier, the LDA system 200 may include certain basic properties of the logarithmic detector as illustrated in FIG. 3, as well as suitable performance enhancements for target applications. For example, the frequency of operation may be determined by selecting the L and C values in the resonant circuit; therefore, in conjunction with the LDA core amplifying circuit, high out-of-band rejection, high skirt ratio, and high signal-to-noise ratio may be achieved by using the LDA system 200 as variously modified. That is, the LDA system 200 may be implemented for highly frequency-selective applications. Furthermore, the sampling circuit may be used to periodically interrupt the oscillation each time when the threshold is reached, providing a self-quenching and time-dependent sampling function. Thus, the regeneration properties of the oscillations may be enhanced by the low instantaneous regenerative gain of the amplifying circuit and the clamping and restarting of the oscillations, giving rise to high Rx sensitivity. The low instantaneous regenerative gain of the amplifying circuit may be in the range of 1-5 in embodiments. However, the LDA gain over an entire cycle of regeneration may be substantially higher. In general it may be low to high and for instance in a range of −10 dB to +50 dB. As compared to a typical LNA, the signal-to-noise ratio may be enhanced, and the output received signal strength indicator (RSSI) level may become higher. This may be an advantage for the receive stages that follow or the communication device with which the LDA system 200 is used since less or no further amplification may be required. The LDA's Rx sensitivity may be increased by reducing the frequency bandwidth of the LDA core that may be achieved by using high Q components in the resonant circuit, such as capacitors, inductors, SAW filters, BAW filters, ceramic resonators, mechanic resonators, etc. The high Q values for inductors and capacitors may be in the range of 25-200 in embodiments. In particular, the high Q values for a SAW filter, a BAW filter, a ceramic filter, and a mechanic filter may be in the range of 500-20,000.

Embodiments may be able to regenerate a weak to strong receive signal and amplify it selectively with minimal noise addition without any conversion of frequency that is usually associated with logarithmic amplifiers.

FIG. 5A is a block diagram illustrating another embodiment 300 of an LDA system. The LDA system 300 may include an isolation circuit 304, a matching network 308, and an LDA core 312. The LDA core 312 may include an amplifying circuit 324, a resonant circuit 328, and a sampling circuit 332, which are configured to operate and function similarly to the amplifying circuit 104, the resonant circuit 108, and the sampling circuit 112 of the logarithmic detector 100 of FIG. 3. OUTPUT A is equivalent to OUTPUT 2 of FIG. 4, where the LDA core 312 may output a series of voltage spikes, Frep. Alternatively, the Frep may be left open here without being outputted. In the example 300 of the LDA system, the resonant circuit 328 may be configured to output RF signals through OUTPUT B. Contrary to the LDA of FIGS. 3 and 4 where the OUTPUT or OUTPUT2 are at a different frequency versus the INPUT frequency, OUTPUT B has substantially the same frequency as the INPUT frequency. The signal is a copy of the INPUT signal, sampled in time and may look such as FIG. 15. This makes this configuration of LDA particularly suitable for LNA replacement or LNA complementing applications such as shown in 300 in FIG. 6.

Figure 5B:
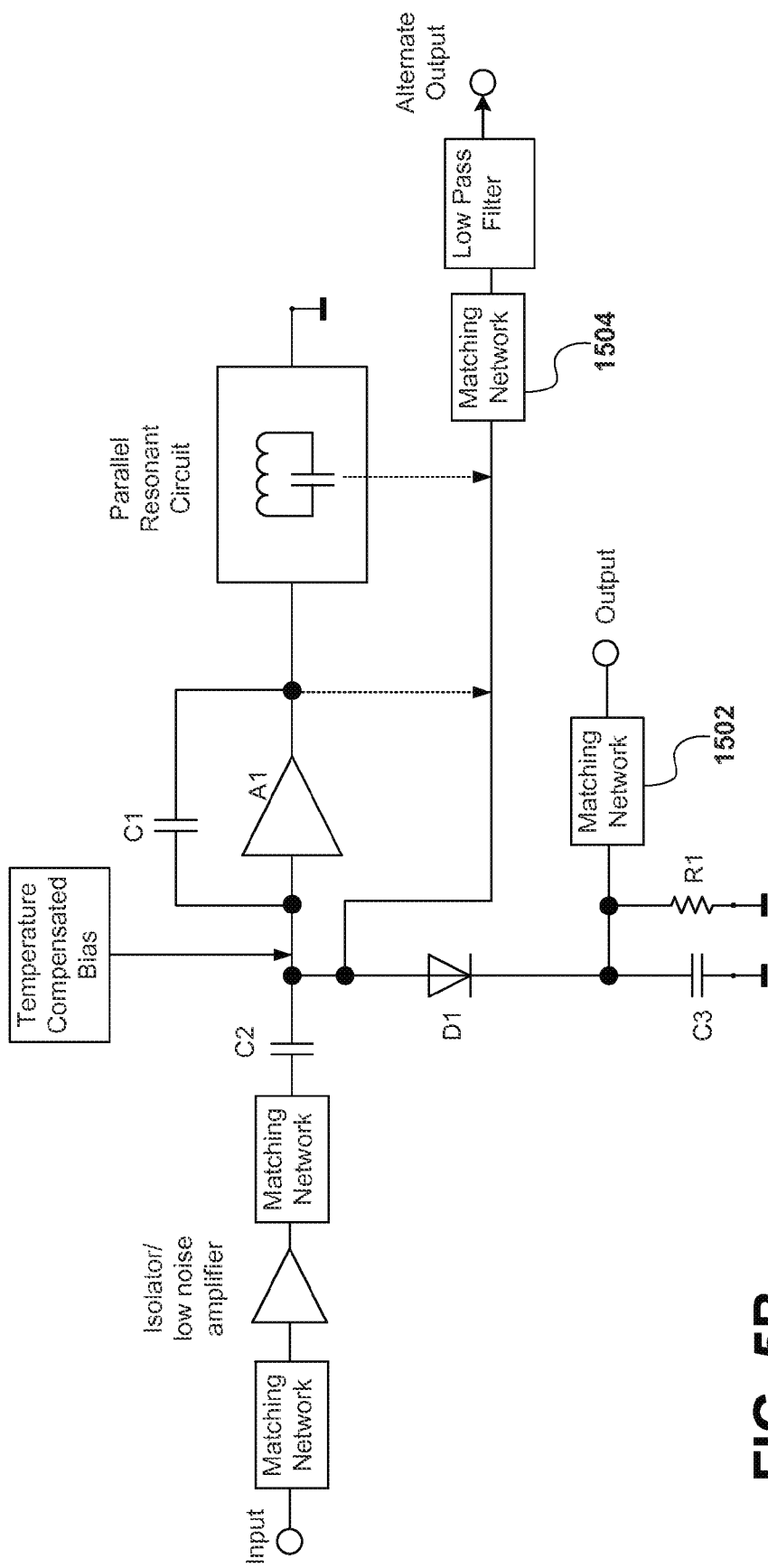
FIG. 5B is a block diagram illustrating another embodiment of an LDA system where the Frep signal can be tapped at various nodes and output through a low pass filter.

A further embodiment of a LDA with integral AM/ASK/OOK demodulation circuitry is illustrated in FIG. 5B. FIG. 5B is essentially the same as FIG. 5A, but with the addition of a matching network and a following low pass filter generating an alternate output. The signal on the alternate output may be substantially a regenerated time sampled copy of the input signal including any AM/ASK/OOK after the RF frequency component has been removed with the low pass filter. A matching circuit may be added before the low pass filter to isolate and maximize the transfer of energy.

Tapping of the output signal may be done in conducted mode, such as on the output of the amplifier, or wireless mode, such as magnetic coupling with mutual coupled inductance. Due to the time sampling, the frequency spectrum may look repetitive. In some cases, the quenching frequency pulses may be so little that the system acts as if there is no quenching frequency and the modulated signal on the output may appear continuous in time. However, tapping at the alternative output node may alleviate this problem and provide a higher power output signal F_rep(t).

The frequency spectrum on alternate output before the low pass filter contains the RF signal with modulation (if any), the repetition rate f_rep(t) frequency in an intermediate frequency IF with the modulation (if any), and the modulated signal in baseband at zero hertz (if any). At this point two cases as possible:

1. Low pass filter the RF signal and IF frequency (f_rep) and recover the baseband signal that has been regenerated/amplified. The baseband signal happens to be the demodulated AM output. Optional follow up with an anti-aliasing filter and ADC to create a digital signal v(k) is possible.
2. Low pass filter (or band pass filter) the RF signal and baseband (BB) frequency and recover the f_rep(t) signal that has been regenerated/amplified.
   a. Process f_rep(t) in an analog fashion with a frequency to voltage converter, f/v converter and improved amplifier to recover the baseband demodulated AM signal. Optional follow up with an anti-aliasing filter and ADC to create a digital signal v(k) is possible.

b. Process f_rep(t) digitally with digital shaping, instantaneous frequency meter (or period meter followed by a digital 1/x function), and scaling to obtain the digital demodulated output signal.

A further embodiment is illustrated in FIG. 5B. FIG. 5B illustrates a LDA with integral AM/ASK/OOK demodulation circuitry output and an alternate output. In FIG. 5B and as listed in the section above, the f_rep(t) signal can be tapped at various nodes, such as the output on R1, C3 after the matching network2. Alternatively the output can be derived from the output of the amplifier, or on a split capacitor central node from the parallel resonator, or alternatively on the input side of the amplifier. Any of these alternatives are followed by a matching network and low pass filter to get an output.

Figure 5C:
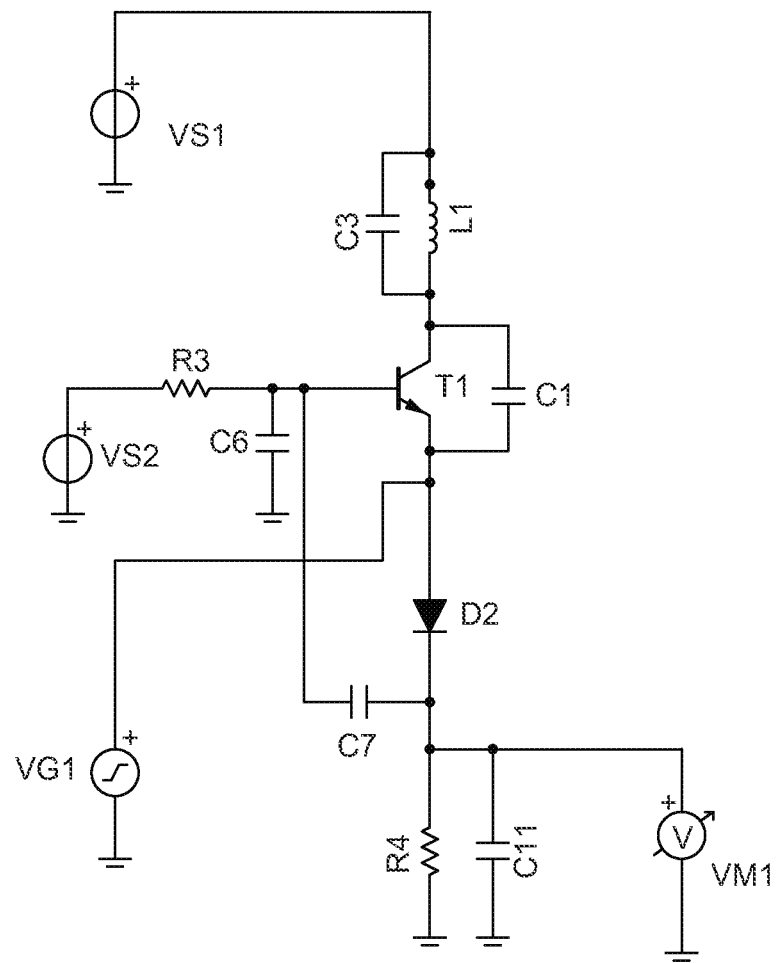
FIG. 5C depicts an embodiment of a schematic of an LDA with AM and PM demodulation capabilities.

FIG. 5C depicts an embodiment of a schematic of an LDA with AM and PM demodulation capabilities. A typical implementation of the LDA with AM demodulation capability is shown in FIG. 5C. The parallel and series resonators circuits L1, C3 are found on the collector of the amplifier T1, in this case a NPN transistor. The transistor T1 providing a 180 degree phase shift between the collector and the emitter. C1 is the feedback oscillator capacitor. VG1 is the input source signal coupled through a capacitor (not shown, but like capacitor C2 shown in FIGS. 5 to 8). The bias is VS2, R3, and C6. D2 is the diode coupling to the RC circuit R4, C11. The output is VM1. An optional C7 is shown for improving the quenching process.

Coming back to FIG. 5A, the isolation circuit 304 may be used to filter out power leaks, reflected signals and other interference effects from the surrounding circuits, in particular the Tx chain, to protect the Rx chain and as explained earlier to avoid the reduction of regeneration efficiency or radiated power leaks as EMI. The isolation circuit 304 may include a circulator for isolation purposes. Such a circulator in the Rx chain may be configured to pass the Rx signals and short out unwanted leaks and reflections to ground. A typical circulator may include a ferromagnetic element, such as ferrite, to correct non-linearity. However, ferromagnetic elements are generally bulky and expensive. An alternative is to use a nanotube meta-material circulator that may reduce the size drastically. Instead of a circulator, the isolation circuit 304 may be configured to have an LNA, or any passive or active device, which may provide enhanced gain (for an active circuit), isolation, signal-to-noise ratio, and bandwidth.

The matching network 308 may be used for impedance matching and/or phase correction purposes. Based on the mechanism similar to the one explained with reference to FIG. 3, the LDA core 312 may output a series of voltage spikes, Frep. The Frep may be outputted from OUTPUT A or simply left open without being outputted.

Figure 6:
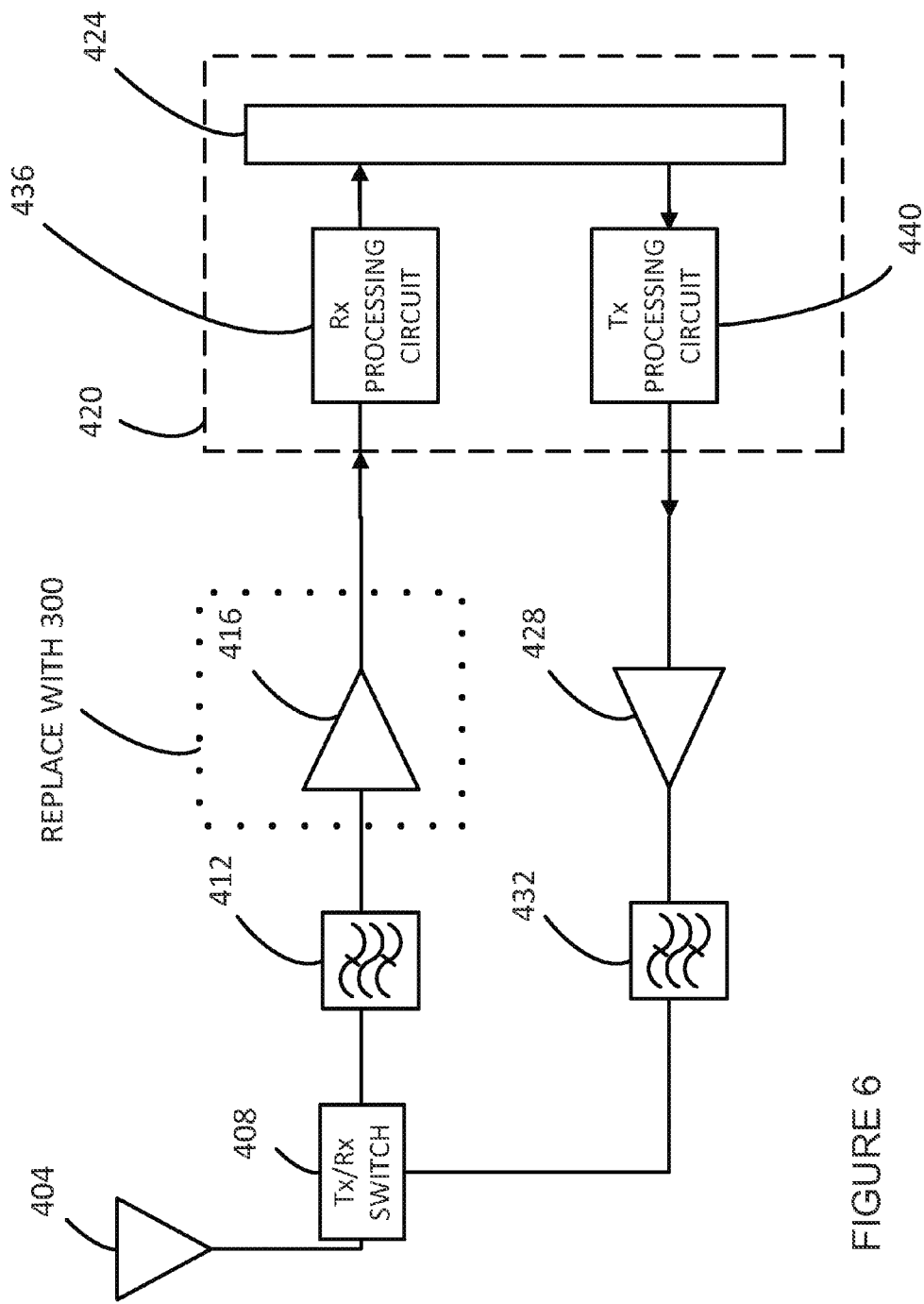
FIG. 6 illustrates a first embodiment of a communication device for transmitting and receiving RF signals where the low noise amplifier (LNA) is replaced with the LDA system.

By configuring the resonant circuit 328 so as to output RF signals through OUTPUT B, the LDA system as illustrated in FIG. 5 may be implemented for various RF applications, while providing enhanced performance levels as compared to conventional RF communication devices. FIG. 6 illustrates an embodiment of a conventional communication device for transmitting and receiving RF signals. A single antenna 404 may be used in this example for both transmit (Tx) and receive (Rx) modes. A Tx/Rx switch 408 may be coupled to the antenna 404 to select either the Tx chain or the Rx chain depending on the mode during the time interval. The Rx chain typically may have an Rx filter 412 and an LNA 416. An additional Rx filter may be added either before or after the LNA 416 or both depending on the filtering level and the frequency range. An LNA may generally be used to amplify the Rx signal while adding as little noise and distortion as possible to increase sensitivity. The Rx signal may be amplified and outputted from the LNA 416 to a transceiver 420 to eventually reach a baseband processor 424, such as a modem. The Tx chain may have a power amplifier (PA) 428 and a Tx filter 432. An additional Tx filter may be added either before or after the PA 428 or both depending on the filtering level and the frequency range. The Tx signal outputted from the transceiver 420 may be sent to the PA 428, where the Tx signal may be amplified and outputted to the Tx filter 432, as illustrated in this embodiment, and sent to the antenna 404. The transceiver 420 may include various circuits to process the RF signals. These circuits are represented in FIG. 6, as an Rx signal processing circuit 436 for the Rx chain and a Tx signal processing circuit 440 for the Tx chain. The Rx signal processing circuit 436 may include a down converter for down-converting the frequency, a demodulator for demodulating the modulated signal, an analog to digital converter to generate digital signals to be inputted to the baseband processor 424, and a synchronization function for synchronizing in time the incoming symbol data stream from the remote transmitter and with the receiver.

In the conventional RF communication device such as illustrated in FIG. 6, the LNA 416 amplifies the Rx signal while, typically, adding as little noise and distortion as possible. As explained earlier, the LDA system can provide amplified signals while minimizing unwanted noise. Therefore, a new type of RF communication devices with enhanced performance levels may be provided by replacing the LNA 416 with the LDA system 300 by coupling the RF output, OUTPUT B, to the transceiver 420, as indicated with the dotted box in FIG. 6. Alternatively, the LDA system may be added as the first or later amplification stage(s) as a receive sensitivity booster to complement the LNA. Unconventionally the LDA can be added after a LNA of high gain in a receive chain and still reduce the system noise figure which is not possible with linear circuits. This is due to the regeneration factor of the LDA that permits to increase the signal to noise ratio when a repetitive signal is present over a number of CW cycles. The Rx filter 412 and other components may also be included in the LDA system. In the case where the communication device is a WiFi system, the RF signal at about 2.4 GHz may be amplified by the LDA system 300 and outputted into the transceiver 420, which includes a down converter. A typical down converter converts an intermediate frequency signal centered at an intermediate frequency to a baseband signal centered at very low frequency. Therefore, by taking the RF Rx signal at about 2.4 GHz from the RF output, OUTPUT B, of the LDA system 300, the existing transceiver technology including a down converter may be used without modification to obtain the down converted signal on the order of 20 MHz to 160 MHz for Wi-Fi 802.11b to 802.11ac to be sent to the baseband processor 424.

Other applications may concern sub-1 GHz narrow band transceivers for use at 168 MHz, 433 MHz or 868 MHz, where the modulated signal bandwidth may be as low a few KHz.

Yet other applications may concern satellite communication, for instance, GPS at 1.5 GHz, where the received radio signal is at a very low power level, typically down to 10 dBm below the noise floor before receive de-spreading. The LDA may be a good candidate as a receive booster for such very low received levels, low data rate relative to the carrier and relative low data rate applications.

Yet other applications may concern a very high frequency such as the 60 GHz band where a simple electronic topology with very fast transistors is needed. The 60 GHz CMOS process may be used to design such a receive booster or an LNA replacement to provide very sensitive receivers.

Yet other applications may pertain to various modulated communication signals transmitted from a wireless or through cable, a power wire, a telephone wire, a fiber optic, and so on where the power of the carrier and/or the modulated signal is desired to be amplified with high sensitivity and with low addition of noise and further processed by a receiver unit.

The LDA system in FIG. 5 may amplify either a CW RF signal (un-modulated) or an RF carrier signal with a modulation signal. The modulation signal may be either analog amplitude, frequency modulation or phase modulation, respectively abbreviated as AM, FM, PM, or digital modulation such as ASK, OOK, quadrature m-AM, FSK, MSK, GFSK, GMSK, 4-FSK, 4GMSK, m-FSK, PSK, QPSK, m-PSK, m-QAM, all of which are abbreviations known in the art for different types of modulation. More complex modulations may be used, such as FH-SS, DS-SS, OFDM, MIMO NxN with BPSK, QPSK, m-QAM, and OFDM, which are also abbreviations known in the art. In a general sense, the LDA system 300, as illustrated in FIG. 5, regenerates and amplifies with high receive sensitivity and low noise figure the input signals from INPUT within its regeneration frequency bandwidth, and outputs the signals without frequency conversion (i.e., with same frequency, same spectrum) on OUTPUT B. This includes carrier and modulation.

As mentioned earlier, the LDA system 300 may be implemented in the communication device of FIG. 6 as a receive booster, not by replacing the LNA 416, but rather by adding the LDA system 300 in a complimentary fashion within the receive path between blocks 412 and 416. In this configuration the receive sensitivity may be increased by virtue of the LDA high receive sensitivity, low noise figure, and amplification.

In another embodiment, the filter 412 may be removed since the LDA system may be a selective frequency circuit due to a pulsed oscillator and amplifier that has an increased skirt ratio. This may relax the filter 412 requirements, replace it, and even exceed the out-of-band rejection performance.

Figure 7:
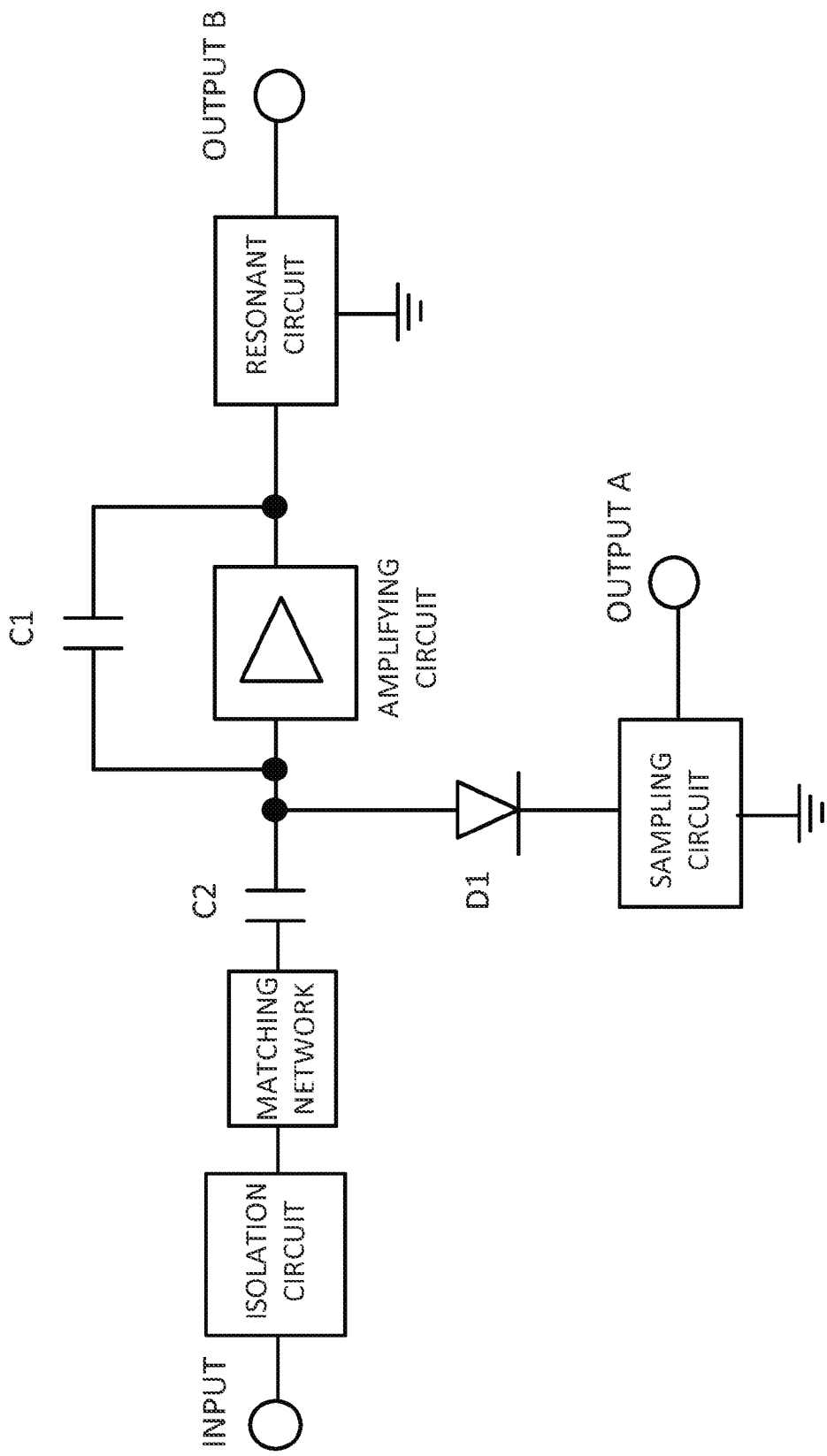
FIG. 7 illustrates an embodiment of a circuit configuration of the LDA system.

FIG. 7 illustrates an embodiment of a circuit configuration of the LDA system 300. The isolation circuit may be coupled to the input port and used to filter out power leaks, reflected signals, and other interference effects from the surrounding circuits to protect the Rx chain, and to avoid the reduction of regeneration efficiency or radiated power leaks as EMI. The isolation circuit may include a circulator for the isolation purpose. Instead of a circulator, which generally includes a bulky, expensive ferromagnetic element, the isolation circuit may be configured to have an LNA, or any passive or active device, which may provide enhanced gain (for an active circuit), isolation, signal-to-noise ratio, and bandwidth. The matching network may be used for impedance matching and/or phase correction purposes. The matching network may be critically coupled to the input section of the amplifying circuit, via a capacitor C2 in this embodiment. Under-coupled coupling may affect the regeneration process adversely because not enough input energy is injected in the LDA. In the opposite case where the system is over-coupled, the regeneration may also be affected because too much input energy is transferred to the LDA. The amplifying circuit may be configured to amplify the input signal and may include any suitable amplifying element, such as an operational amplifier, a BJT, a FET, an RF amplifier, or other discrete transistor.

The LDA system of FIG. 7 may include the resonant circuit coupled in series with the amplifying circuit at the output side of the amplifying circuit, and a capacitor C1 coupled in parallel with the amplifying circuit. Alternatively, the resonant circuit may be coupled in series with the amplifying circuit at the input side of the amplifying circuit. The frequency of operation may be set by choosing L values and C values in the resonant circuit. The oscillations may be set up in the amplifying circuit at the frequency so determined. The sampling circuit may be coupled to the amplifying circuit through a diode D1 in this embodiment. The sampling circuit may be configured to effectively sample the current flowing in the voltage supply line to the amplifying circuit; once a predetermined threshold is reached, the sampling circuit may act to cease the oscillation. That is, the sampling circuit may be used to periodically interrupt the oscillation each time when the threshold is reached. The output from the sampling circuit may thus be a series of voltage spikes, Frep. The Frep may be outputted from OUTPUT A or simply terminated without being outputted. Those skilled in the art will appreciate that OUTPUT A provides different frequencies in and out for FM demodulation. For FM modulation, the resonant circuit needs at least a parallel and series resonant circuits.

Figure 8:
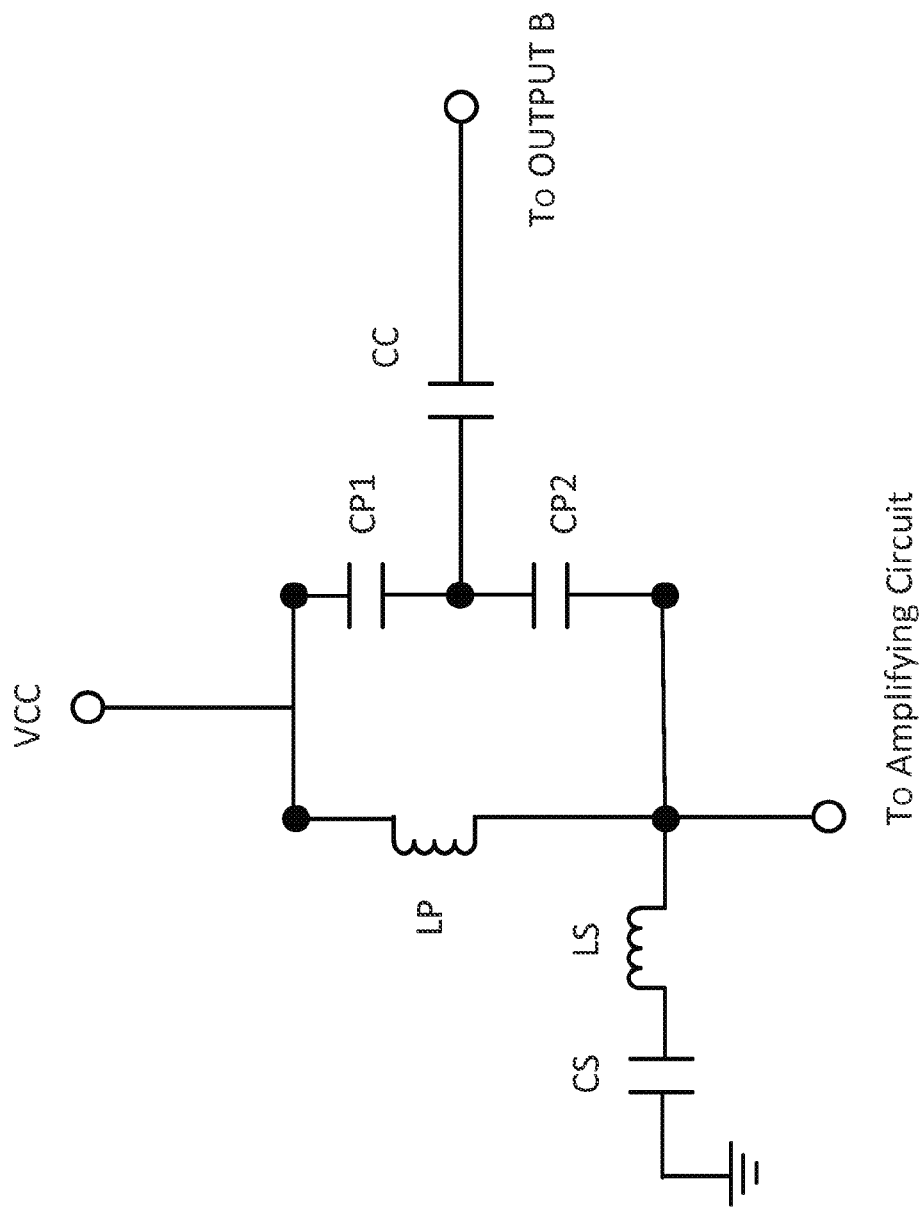
FIG. 8 illustrates an embodiment of a resonant circuit for outputting RF signals without affecting the LDA properties.

To output signals at the RF frequency without affecting the properties of the LDA system, the resonant circuit of the LDA system in FIG. 5 or FIG. 7 may be configured as differently from the resonant circuit 228 of the LDA system 200 in FIG. 4. FIG. 8 illustrates and embodiment of a resonant circuit for outputting RF signals without affecting the LDA properties. This resonant circuit may include two main parts: a series resonant circuit portion and a parallel resonant circuit portion. In this figure, VCC represents a DC voltage supply, the input port of the resonant circuit may be configured to be coupled to the amplifying circuit, and the output port may be coupled to OUTPUT B for outputting RF signals. Those skilled in the art will appreciate that OUTPUT B provides the same frequency in and out for any types of analog and digital modulations such as AM, FM and PM. For direct FM demodulation using the OUTPUT A, the resonant circuit may need at least a parallel and series resonant circuits. However, it is possible to demodulate narrow band FM without series resonant circuit by virtue of slope detection where the INPUT signal is placed slightly left of the LDA central frequency such as being positioned roughly in the middle of the right slope or left slope of the Bell curve of the LDA frequency response. A wideband FM signal can be directly discriminated as well if the Q factor of the LDA is reduced such as accommodate the wideband deviation of the input signal on the right or left slope. For AM and PM demodulation through OUTPUT A, the series resonant is not necessary. The series resonant portion may include a capacitor CS and an inductor LS, providing a series resonance. The parallel resonant circuit portion may include an inductor LP in parallel with split capacitors CP1 and CP2 and a third capacitor CC coupled to the common node of CP1 and CP2. By determining the values of CP1, CP2, and CC so as to critically couple each other and optimize for the output impedance, the RF signal may be optimally tapped out. Furthermore, some of the inductors and the capacitors in the parallel resonant circuit portion may be configured to be high Q inductors and high Q capacitors in order to have a small bandwidth with enhanced sensitivity.

Figure 9:
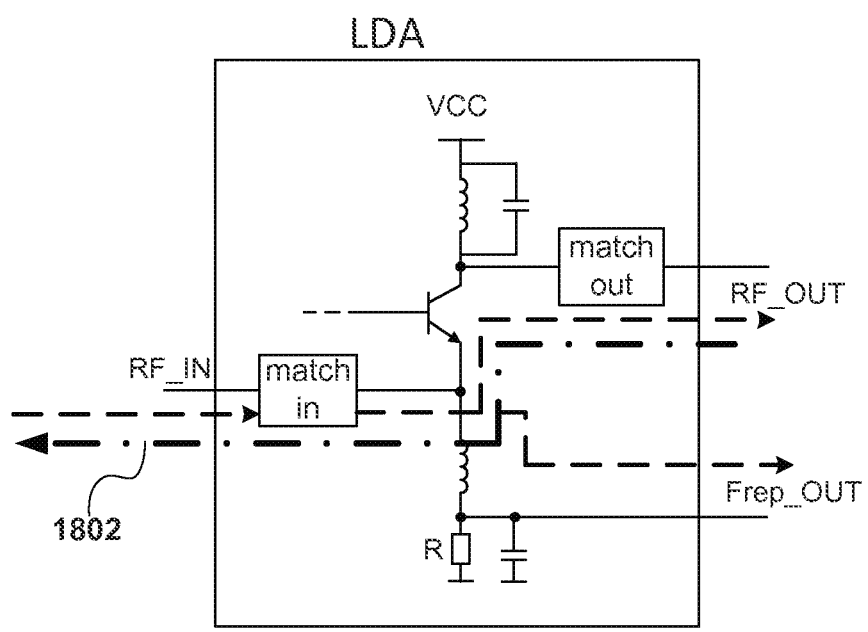
FIG. 9 is an illustration of an embodiment in which an LDA is used in a reverse direction to drive an antenna from the RF transmit output.

FIG. 9 is an illustration of an embodiment in which an LDA is used in a reverse direction to drive an antenna from the reverse RF output RF_IN, which is illustrated by the darker line 902 going from the RF_OUT to RF_IN. In such an embodiment, the LDA may be modeled like an input and output coupled resonator/amplified/quenching device and may provide higher output in reverse direction since the coupling node (a) of FIG. 11 is lower impedance than the amplifier output (transistor emitter in FIG. 9). Coupling may be done on the RF_IN or the RF_OUT. However, in reverse direction the input port becomes RF_OUT and the output port RF_IN. In normal forward direction RF_IN is the input port and RF_OUT is the output port. Simulations of the LDA illustrated in FIG. 10A show that there is gain in both directions.

Figure 10A:
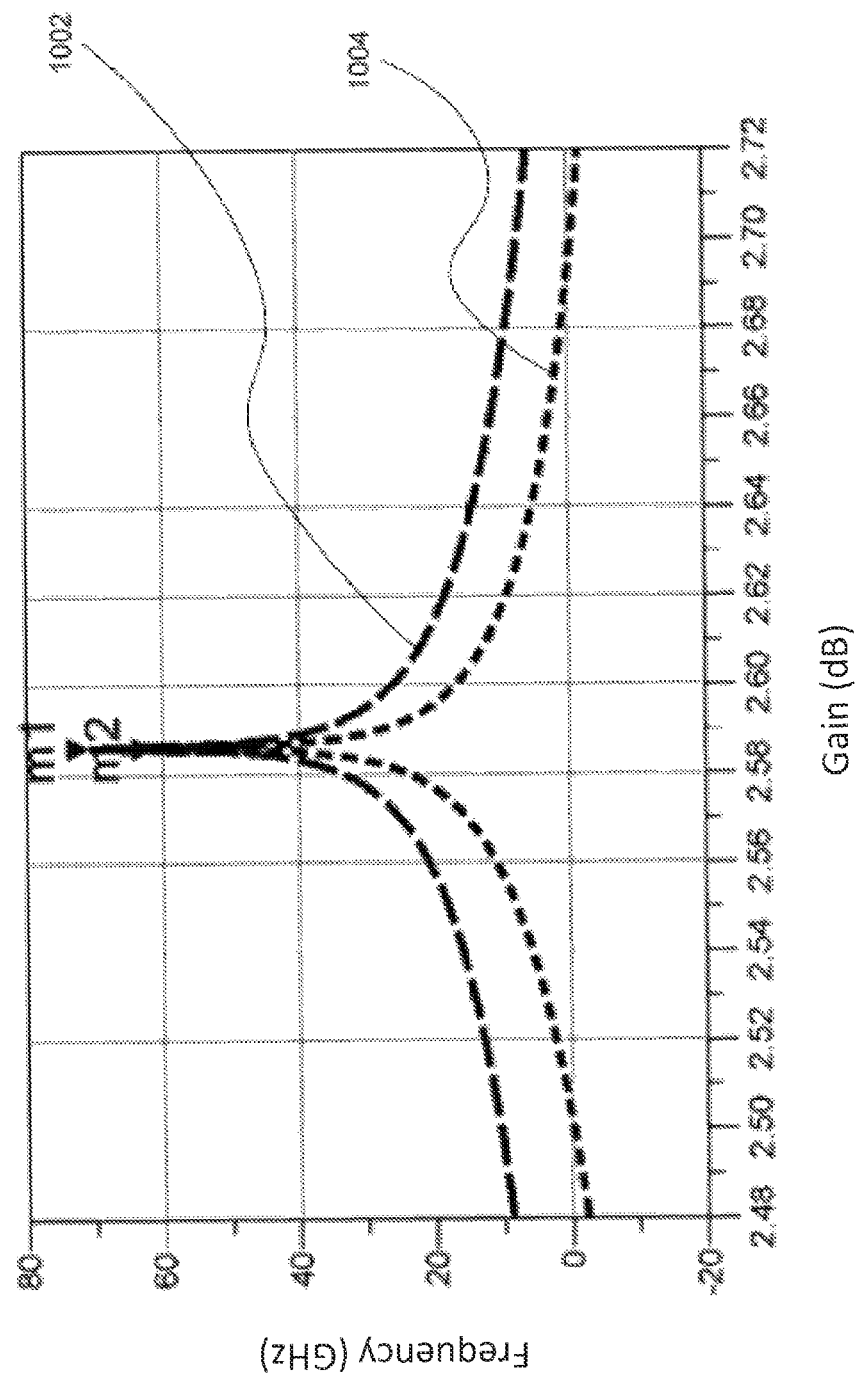
FIG. 10A is a graph illustrating the gain in the reverse direction (top line, longer dashes) in the forward direction (bottom line, shorter dashes) of the embodiment of FIG. 5.
Figure 11:
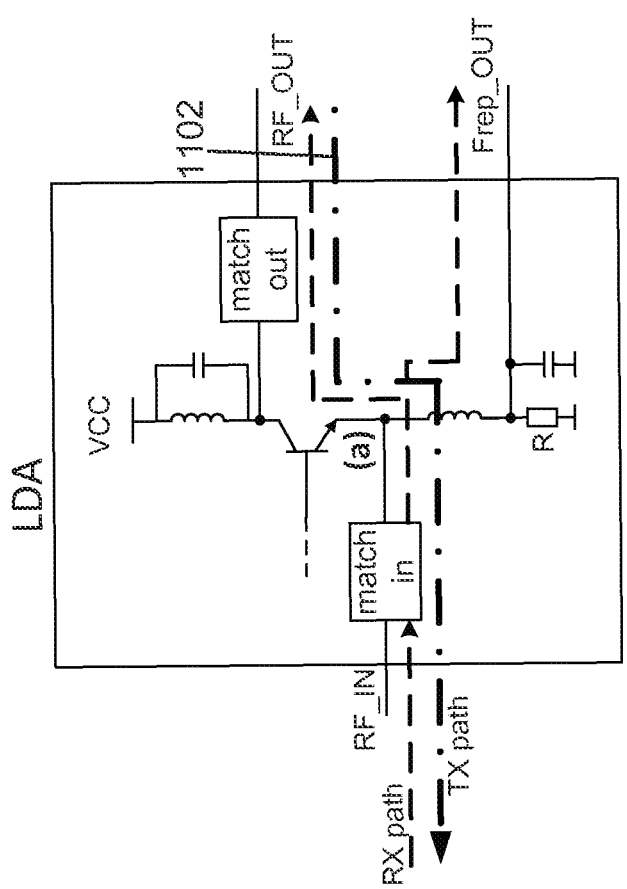
FIG. 11 illustrates an embodiment in which an LDA is used as a transmit power amplifier in a reverse direction configuration to drive an antenna from the RF output.

FIG. 10A further illustrates direct mode, versus reverse mode, of operation of the LDA depicted in FIG. 9. FIG. 10A is a graph illustrating gain of the LDA in reverse mode, shown by line 1002 and direct mode, shown by line 1004. As noted, the gain values at resonance are much greater than 1, which illustrates that the LDA may be used in reverse mode. This is unconventional and not possible with typical amplifier or LNA. As an example a LNA in reverse direction exhibits typically −20 dB to −30 dB of gain that is an attenuation of a factor 100 to 1000 in power.

Figure 10B:
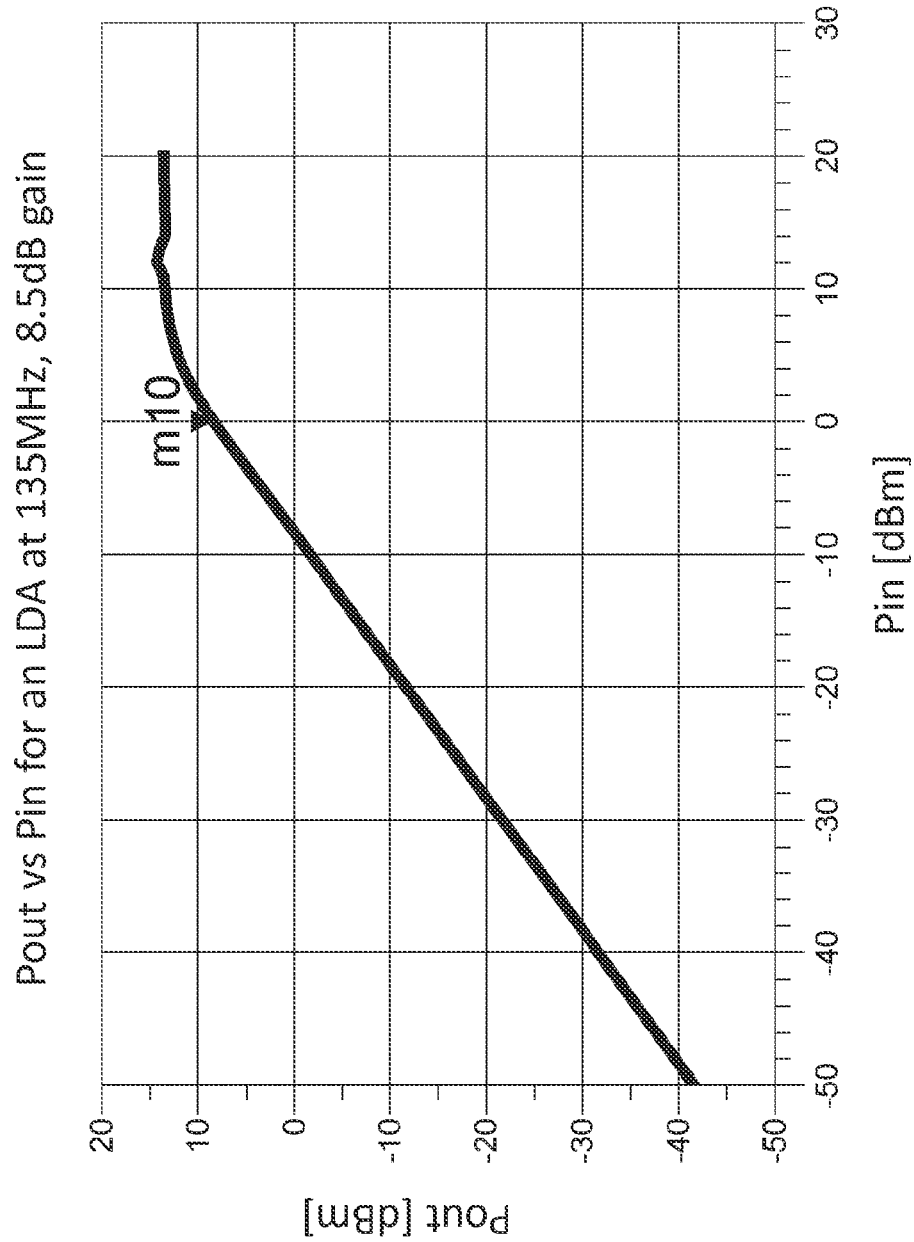
FIG. 10B illustrates simulation results of an LDA in reverse and in transmit power amplifier PA mode.

The LDA can operate in lots of different modes including receive or transmit mode. FIG. 10B illustrates simulation results of the LDA in a power amplifier PA mode. The simulation with a non-optimized LDA circuit shows a 8.5 dB gain, an output of 8 dBm for an input of 0 dBm, a compression power of 1 dB $P_{1dB}$ of 5 dBm with still a gain of 6 dB at 135 MHz. This is to be compared with the direct mode where the LDA behaves as a LNA and is able to process weak input signals of less than −100 dBm.

Figure 12:
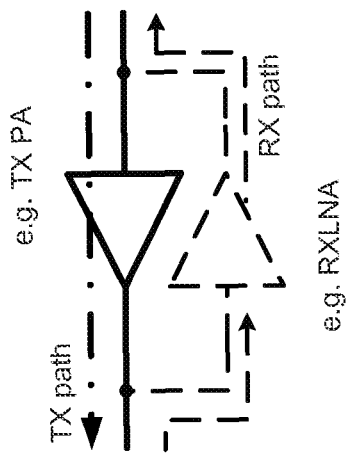
FIG. 12 illustrates a high level block diagram of the bidirectional transmit power amplifier and LNA replacement illustrated in FIG. 11.

An embodiment of the reverse mode operation of the LDA is further illustrated in FIGS. 11 and 12. FIG. 11 illustrates a LDA as a transmit power amplifier (TX PA) operating in reverse, shown by the darker line 1102 going from RF_OUT to RF_IN, where node (a) of the amplifier is low impedance and suitable for higher power as shown in FIG. 10B. FIG. 12 illustrates a high-level block schematic of the transmit power amplifier illustrated in FIG. 11 and in dotted line and opposite direction, the receive low noise amplifier.

Figure 13:
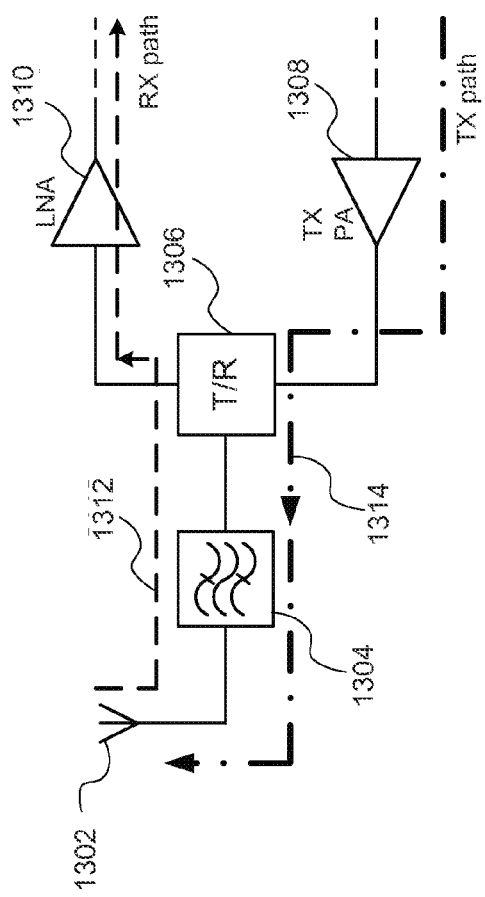
FIG. 13 is a block diagram illustrating a non-LDA based implementation of a bidirectional amplifier as used in the prior art.

The LDA may also be used as a full duplex bidirectional amplifier, operating in both directions simultaneously. A typical, non-LDA based implementation of a conventional bidirectional amplifier is illustrated in FIG. 13. This amplifier has a RF front end for half duplex operation composed of one antenna 1302, one band pass filter 1304, a transmit/receive RF switch 1306, a TX power amplifier PA 1308, and a RX low noise amplifier LNA 1310. The direct RX path is represented by the dashed line 1312, while the reverse TX path is represented by the solid darker line 1314. In this configuration, there are three active components, a band pass filter plus the antenna.

Figure 14:
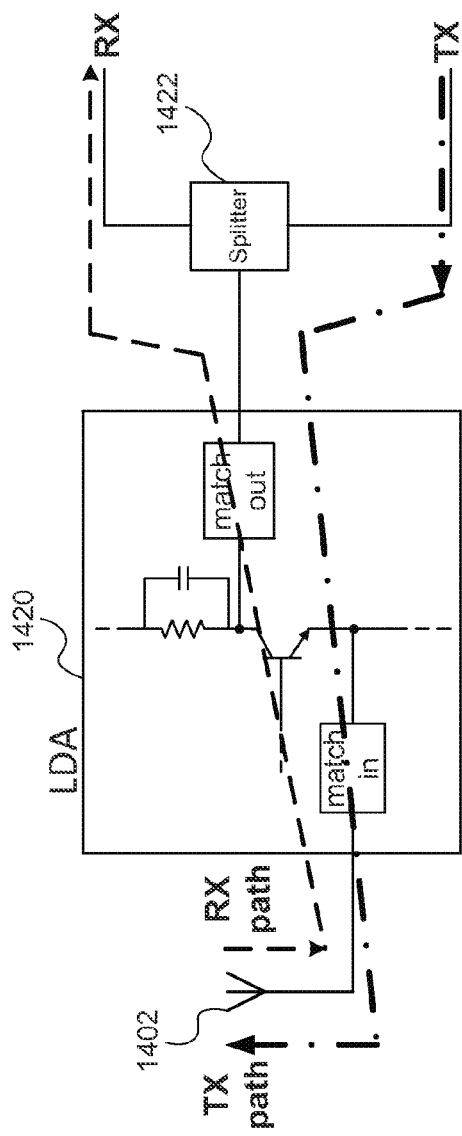
FIG. 14 is a block diagram illustrating an LDA-based alternative to FIG. 13 in accordance with an embodiment.

FIG. 14 illustrates a simple alternative embodiment to FIG. 13 with a different RF front end for half duplex operation, as well as full duplex operation, based on a LDA. This embodiment is composed of the antenna 1402, one bidirectional LDA 1420 as in FIG. 11, and a splitter 1422, which may be resistive, Wilkinson, coupler, circulator, metamaterial, lamped passive components, etc. In this configuration, there are only one active component, a simple splitter, plus the antenna. This implementation may be attractive on many levels: low size, lower number of components, lower power consumption due to the economic regenerative mode of the LDA, affordable solution. Due to the small size, the LDA may be positioned at the base of the antenna and minimize the real estate on a printed circuit board and distance/losses/reflections from the transmit PA to the antenna and as well losses from the antenna to the receive LNA on a line of transmission. Another interesting characteristic may be the possibility to match to other than 50 ohm the LDA and the antenna at the "match in" port of the LDA. There may be reasons to match usually to the complex conjugate other than 50 Ohm in a range of 5 ohm to 130 Ohm, amongst other narrower or wider traces width, antenna size, easy matching to the LDA, etc.

The splitter is important and permits a good isolation between the transmit and receive path of 20 to 30 dB. A good splitter has around 3.5 dB attenuation. Its position in the TX and RX is ideally located in FIG. 14. For the receive path, it is after the LNA LDA-based and its loss does not impact the system NF since after the first amplifier. In transmit the splitter is placed before the PA which permits to maximize the transfer of energy from the PA output to the antenna. Another advantage is the removal of a bandpass filter or the selection of a degraded one since the LDA is frequency selective. with a high skirt ratio. Also no transmit/receive T/R switch is needed that save the component and the control from baseband as well as switching timing problems.

In one embodiment, the LDA provides a power meter with log scale and huge dynamic range. Another interesting feature provided by the LDA is shown in FIG. 11 and consists to be able to measure the transmitted power in transmit PA mode while the PA transmits and directly without the need of external components such as per the state of art. In reverse mode, the system continues to self-quench and produces a Frep_OUT output. As described before in FIG. 4, Frep may be followed by a simple F/V converter that outputs an average voltage that is proportional to the log of the input voltage. The output voltage is proportional to the output power in dB (log scale), which is extremely desirable for as power meter. The dynamic range is wide and in the range of 50 to 100 dB. The output voltage issued from the F/V converted may feed a lower resolution ADC due to the intrinsic log conversion, to provide a feedback to baseband on the actual transmitted power. Full duplex may be provided for FDD and CDMA.

In another embodiment, the bidirectional LDA may be used as a RF LNA, a AM/FM demodulator or both simultaneously in receive mode. FIG. 11 shows that the bidirectional LDA provides 2 receive outputs: First, RF_OUT in a receive LNA mode at the same frequency versus the input receive signal RX_IN and second, Frep_OUT that is a demodulated output in a IF band. If the modulation is simple such as analog or digital AM, FM, or AM+FM the LDA can demodulate directly with the use of a digital or analog f/v converter.

Figure 15:
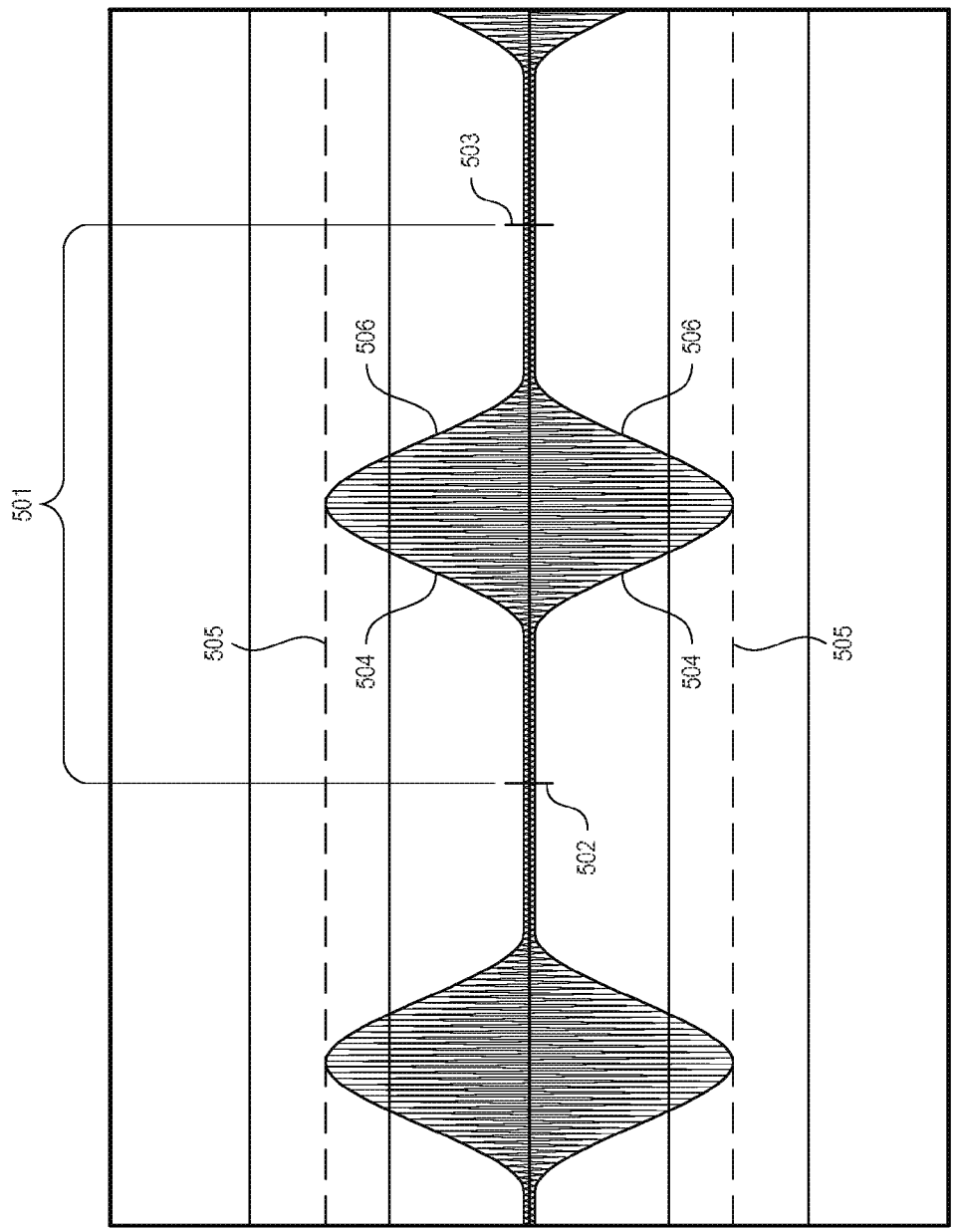
FIG. 15 depicts time variant oscillations and quenching cycle of an LDA.

In one embodiment, the LDA can be regarded as a LC circuit with a variable conductance, the latter varying cyclically from positive to negative. FIG. 15 depicts time variant oscillations and quenching cycle of an LDA with AM/FM demodulation capability. More specifically, FIG. 15 depicts a cycle 501 from the start of the cycle 502 to the end of the cycle 503. The oscillation builds up 504 until it reaches a threshold level 505 where the oscillation is shunt 506 progressively to zero.

Figure 16:
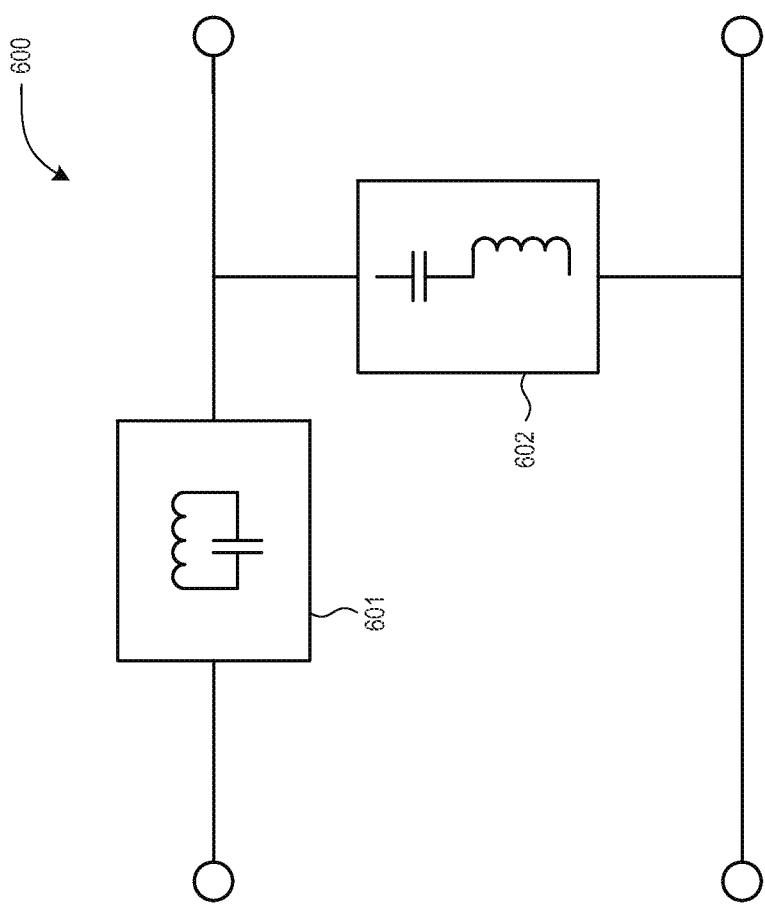
FIG. 16 depicts a quadripole with a parallel resonant circuit and a series resonant circuit.

FIG. 16 depicts a quadripole 600 with a parallel resonant circuit 601 and a series resonant circuit 602. The LDA with FM demodulation capability is based on the use of a quadripole made of a parallel and series resonator circuits 601 and 602 as shown in FIG. 16. It is designed to be a bandpass filter with a null phase in the passband. An example of parallel resonant circuit is a L and C connected in parallel, a line of transmission having open(s) or short(s) stub(s) adequately placed, a crystal resonator, a SAW circuit, a BAW, or a combination of these, etc. An example of series resonant circuit is a L an C mounted in series, a line of transmission having open(s) or short(s) stub(s) adequately placed, a crystal resonator, a SAW circuit, BAW, or a combination of these, etc.

Figure 17:
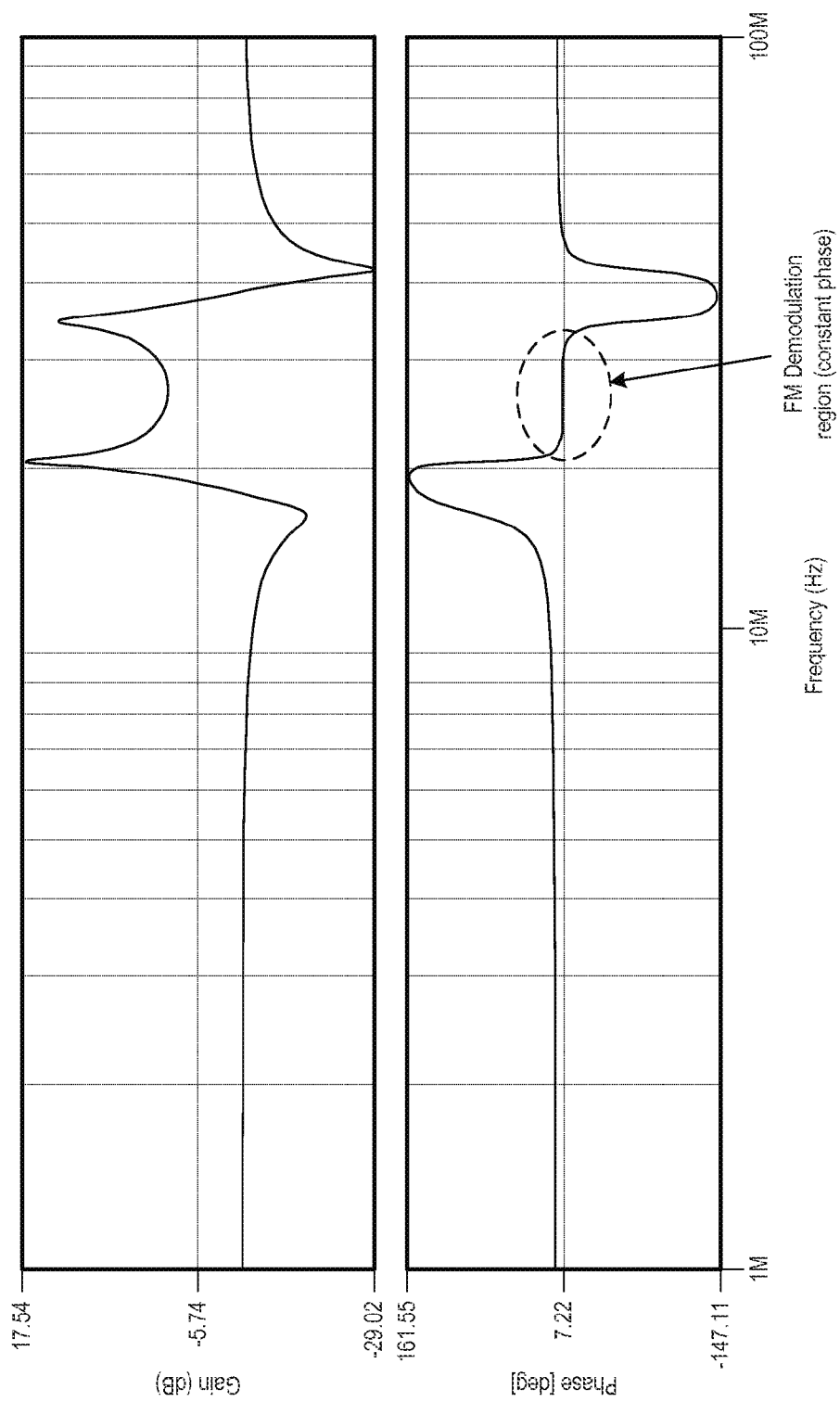
FIG. 17 depicts a bode plot showing the approximate response of the quadripole.

The transfer function in amplitude and phase of the quadripole of FIG. 16 is shown in FIG. 17. Horizontal scale is frequency in Hz and vertical scales are respectively gain in dB and phase in degree.

FIG. 17 depicts a bode plot showing the approximate response of the quadripole. The useful operating range for FM/AM demodulation in shown in the ellipse with dashed lines. The plots in FIG. 17 show the amplitude versus the frequency (top) and response phase vs. frequency (bottom). Depending on the design of the quadripole and interaction with the rest of the LDA, the gain can be designed to be flat or rounded versus pointy with the two spikes as shown in the diagram.

Figure 18A:
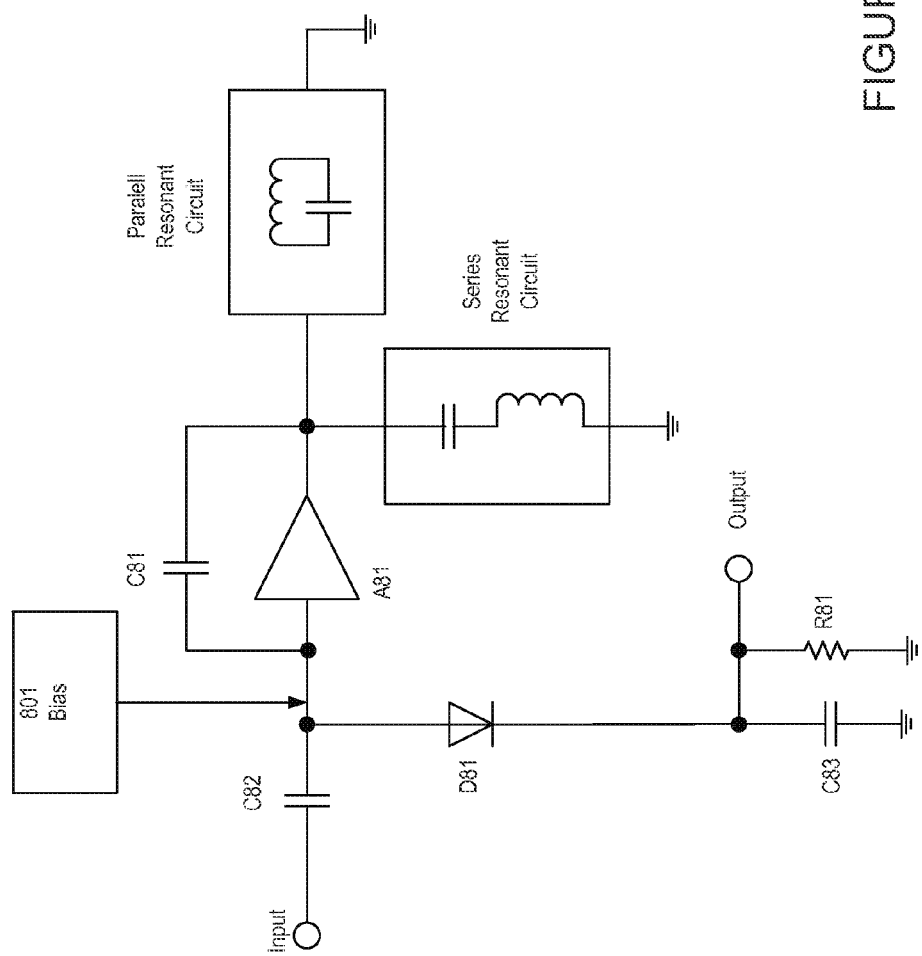
FIGS. 18A, 18B, and 18C depict various embodiments of a block Diagram of LDA with integral FM demodulation circuit.

FIG. 18A depicts a block Diagram of LDA with integral FM demodulation circuit. The behavior principle is the following: An amplifier A81 is made to oscillate with the capacitor C81 in loopback. A typical amplifier may be a NPN, PNP transistor, a FET transistor, A MOS transistor, a dual gate FET transistor, etc. Also, the configuration of the active circuit can be Darlington, common-base, common collector, common emitter, Cascode, differential pair, etc. Other types of amplifier, such as single or multiple stages amplifiers, logic amplifier may be used. An amplifier can be made by any number of processes, such as Silicon, Bi-CMOS, GaAs, or any other process.

The simplest implementation is to have a 180-degree shift from the input 801 to the output of the amplifier A81 and the oscillation to be maintained with C81 as a weak or strong coupling. In other word, the value of C81 reduces the amplifier gain to a low value as desired. The quadripole is added to the output of A81 and due to its high lower attenuation in the passband makes the amplifier resonate at or around the center frequency. The optimal FM demodulation mode happens when the circuit is adjusted to the center of the null phase range and operates there as shown in FIG. 17. Moreover the maximum frequency deviation that can be demodulated without distortion is equal or larger than the null phase bandwidth, so the bandpass filter quadripole can be designed to accommodate the target deviation, whether narrow or wide.

Another important piece of the LDA behavior is the RC circuit R81 and C83 acting as a sampling circuit. When connected to the amplifier, it charges cyclically and as its potential grows, the voltage across R81 grows that increase the output current of the amplifier. At the same time, the input bias current of the amplifier reduces and at a given threshold switches off the amplifier and therefore the oscillations. At this point, the charge accumulated into C83 discharges in R83 and as a consequence the voltage on R81 and C83 decreases to zero. The cycle restarts and since the potential on R81 and C83 is low the amplifier bias current tends to increase and after a little period of time the oscillation build up again.

After low pass filtering, the signal on R81 and C83 is the output repetition frequency and its shape may resemble the envelope of the cyclic oscillation frequency shown in FIG. 15.

The diode D81 couples the amplifier to the RC circuit R81 and C83 and acts as a low pas filter with good RF behavior. It has a low impedance when in conduction (positive half cycle of the input voltage) and high impedance when in non-conduction (negative half cycle of the input voltage) acting as a rectifier and low pass filter when loaded with a RC circuit.

The input is weakly coupled to the top of diode D1. The input matching is important and a good matching can improve the performance by a significant factor. An optional capacitor may be connected between the cathode of D81 and the bias of the amplifier to increase the coupling and facilitate the repetitive cycling.

In another implementation, the diode D81 can be replaced with an inductor of relatively high value e.g. ten times the value of the inductance(s) of the resonator and in a range of 100 nH to 1 mH. If the LDA oscillation operating frequency is too high, the parasitic may impact adversely the low pass effect and a more ideal component such as a diode may be used. In a further additional implementation, D81 can be replaced by an active component such as a transistor that is properly biased.

There are several types of FM discriminator or demodulators: Foster-Seeley, Travis, quadrature detector, PLL amongst other. The Foster-Seeley discriminator uses a special center-tapped transformer that is tuned for the frequency of use and two diodes in a full wave rectification. When there is no deviation, both halves of the transformer are equal. When a FM signal is applied, the balance is destroyed and a signal appears at the output that is proportional to the frequency deviation.

The Travis discriminator is similar to Forster-Seeley whereas the secondary of the transformer has a center tap and two opposite branches, each branch connected to a tuning circuit and a slope detector. First tuning circuit resonates slightly higher than the carrier, while the second one slightly lower. The output is the difference between the voltages of slope detector 1 and 2. When a FM modulation is applied and deviates toward a frequency higher than the carrier, the voltage of detector 1 goes positive while the one of detector 2 negative. The output voltage and difference between both is positive. When a FM modulation deviates toward lower than carrier frequency, the opposite happens and the output voltage becomes negative. The addition of the two resonance curves of opposite signs, gives a nice "S" curve characteristic output, for which the large middle section is linear.

In the quadrature detector, the input is split in 2 and one of the paths is delayed by 90 degrees and applied to a resonant LC circuit. The 2 signals finally feed a phase comparator and the result that is low pass filtered is the demodulated FM output.

The PLL is one FM discriminator and was adopted with the easy access of integrated circuits. The phases of the incoming FM signal versus the one of a voltage-controlled oscillator (VCO) are compared. The result is low pass filters and controls the VCO. As the frequency of the input changes, a correction voltage appears at the phase detector that wants to compensate the phase difference by increasing or decreasing the phase and frequency of the VCO. If the loop bandwidth of the PLL is designed appropriately, the correction voltage to the VCO is also the demodulated output voltage.

In contrast, the LDA technologies disclosed herein bring some important novelties. An S-curve characteristic output is provided as other discriminators and the LDA simulates the performance of a Travis discriminator simply by having a low gain amplifier that is only oscillating if the phase of input and output are 180 degree from each of other. However in the LDA technologies disclosed herein the S-curve exceeds the quadripole passband bandwidth. In consequence the FM-LDA does not need an automatic frequency control AFC as conventional FM discriminators and it does not need to sit exactly in the center of the S curve. In our implementation there is an auto-centering effect.

When the phase is distorted into the S-curve, the LDA oscillator tries to stay at the center of it. If the deviation goes high in frequency, the repetition rate decreases, if the deviation goes below or lower in frequency, the repetition goes faster. It is similar to having a power meter which can have three readings: close to center channel, center channel or above channel. If the S-curve is very wide, it can demodulate very wide FM. On the other side, if the S-curve is narrow, it can demodulate narrow FM.

The output repetition frequency contains the phase and frequency information and is modulated at a low intermediate frequency by the FM input signal. Standard FM discriminators employ a constant amplitude. In the LDA technologies disclosed herein, this is provided intrinsically by the LDA that has a large amplitude input dynamic range and that provides an almost constant repetition rate amplitude regardless of the input amplitude large or very small. The baseband signal is recovered by an analog or digital frequency to voltage converter (FVC).

Since being regenerated by the FM-LDA, the advantages here include one or more of the following: very high sensitivity over a high dynamic range, constant repetition output amplitude, high skirt ratio (high selectivity), and simultaneous FM & AM demodulation that add a few more dB of amplitude to the baseband demodulation amplitude.

Figure 18B:
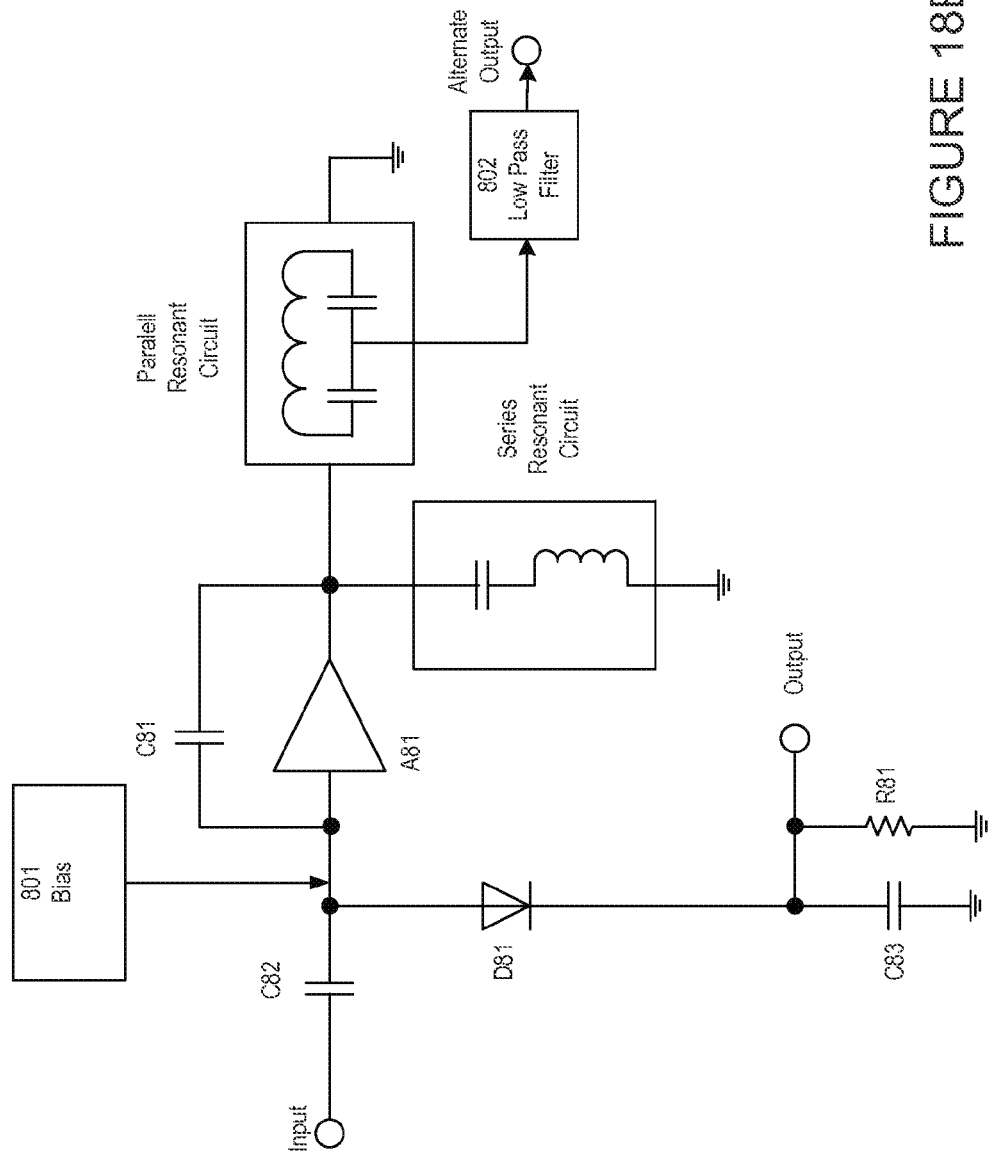
Figure 18C:
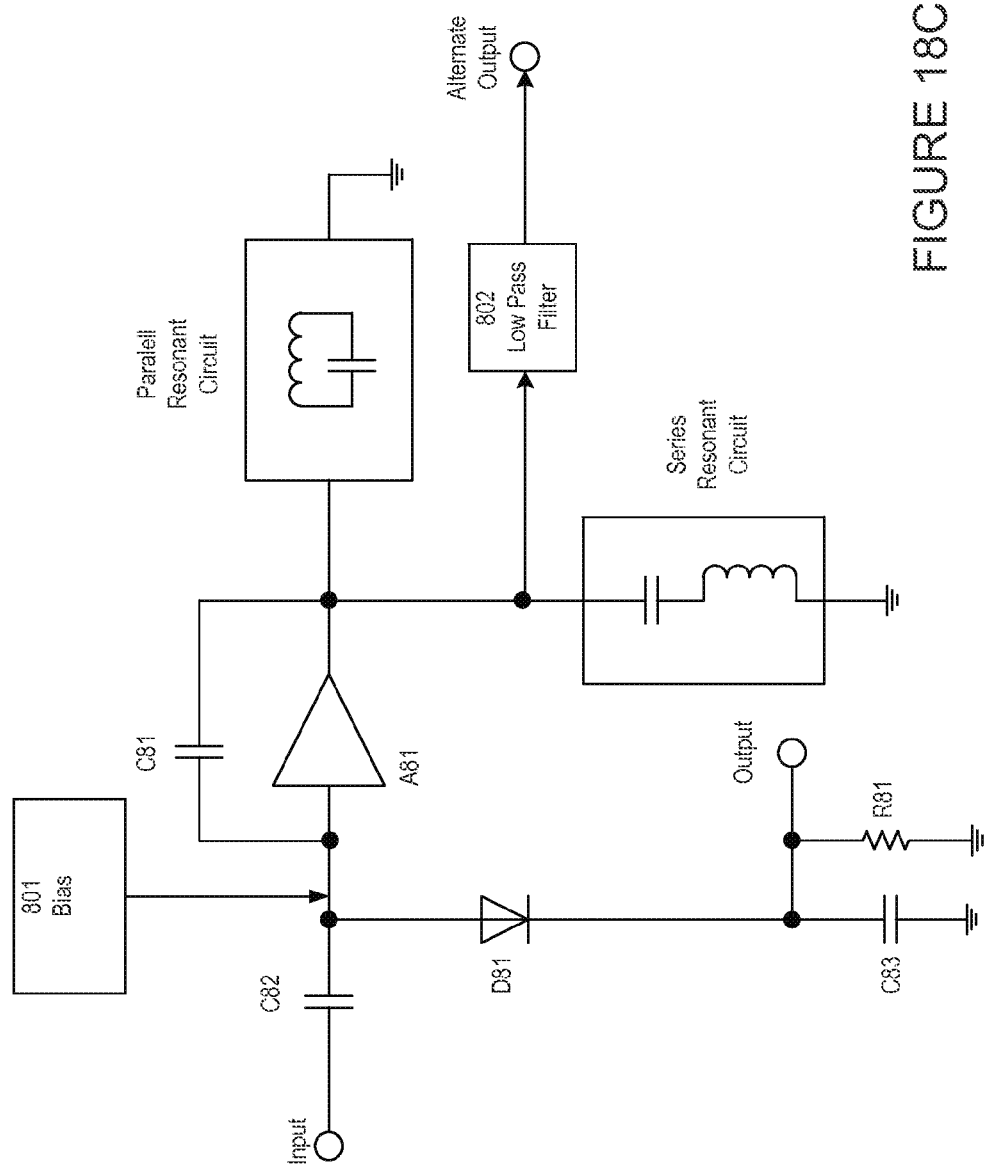

FIGS. 18B and 18C depict other embodiments of an LDA with integral FM demodulation circuit and an alternate output. The embodiments in FIGS. 18B and 18C include a low pass filter 802 configured to filter signals passing to an alternate output. In FIG. 18B, the low pas filter 802 filters signals exiting the parallel resonant circuit to the alternate output. In FIG. 18C, the lowpass filter 802 filters signals that enter the parallel and series resonant circuits. Other variations of these embodiments are possible, for instance the low pass filter may be connected to the input of the amplifier A81 and the system provides a similar alternate output (not shown). One advantage of tapping the modulation as shown in FIGS. 18B and 18C is that the demodulated signal may have a higher amplitude or "volume" for a analog FM demodulation. In some cases the Frep signal may be small and the demodulated signal become small or noisy after excess additional amplification.

Figure 19:
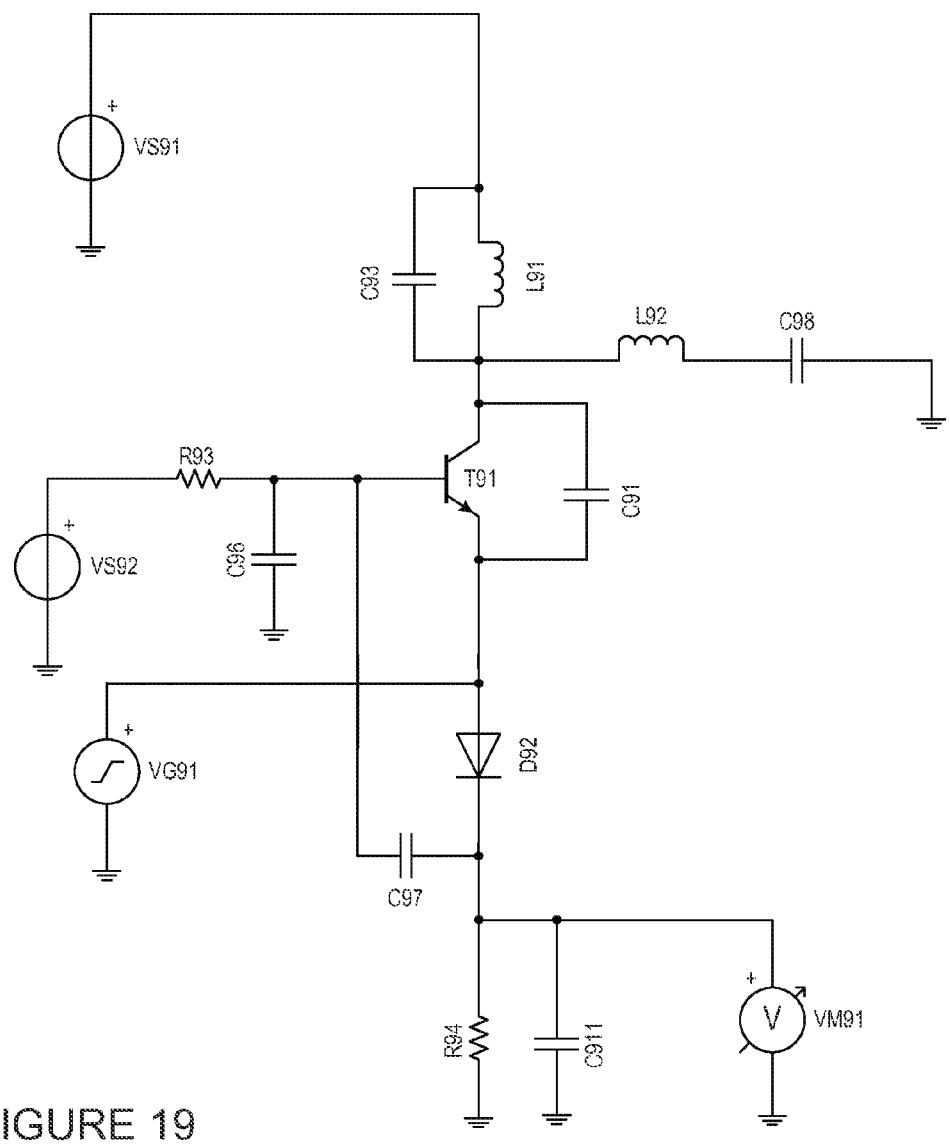
FIG. 19 depicts an embodiment of a schematic of an LDA with FM demodulation.

FIG. 19 depicts an embodiment of a schematic of an LDA with FM demodulation. FIG. 19 shows an implementation of an LDA with FM demodulation capability. The parallel resonator circuit L91/C93 and series resonators circuit L92/C98 are found on the collector of the amplifier. In one embodiment, the amplifier can be a NPN transistor. The transistor providing a 180 degree phase shift between collector and emitter, C91 the feedback oscillator capacitor, VG91 the input source signal coupled through a capacitor (not shown), the bias VS92, R93, and C96, D92 the diode coupling to the RC circuit R94, C911 and the output VM91. An optional C97 is shown for improving the quenching process.

Figure 20:
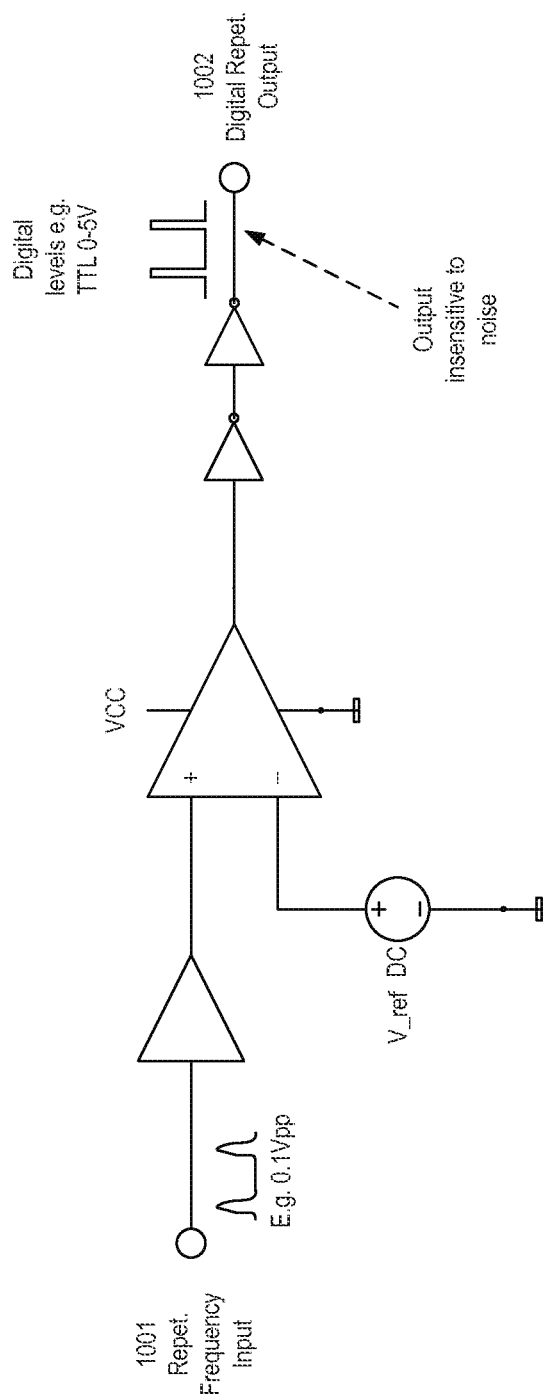
FIG. 20 depicts an example of a conversion of a pseudo-digital frequency input to a digital output pulse stream.

FIG. 20 depicts an example of a conversion of a pseudo-digital frequency input 1001 to a digital output pulse stream 1002. As discussed earlier, the repetition frequency rate is quasi-digital and needs little processing to be shaped in to a digital signal. First if the amplitude peak to peak is smaller than around 0.5 Vpp, it can be amplified. If as shown the amplitude is 0.1 Vpp, the gain is about 5 to 20. The amplification can be done in one or several steps. Thereafter the amplified signal is compared with a reference voltage V_ref and create a logic "1" when above V_ref and "0" otherwise. One or more logic gates can be added to provide sharp edges and TTL level to the now digital signal. The digital repetition frequency output signal 1002 can contain the information in phase and instantaneous frequency. As said earlier it can be carried over long distance or in a noisy environment and is noise insensitive since the information is not in amplitude.

Figure 21:
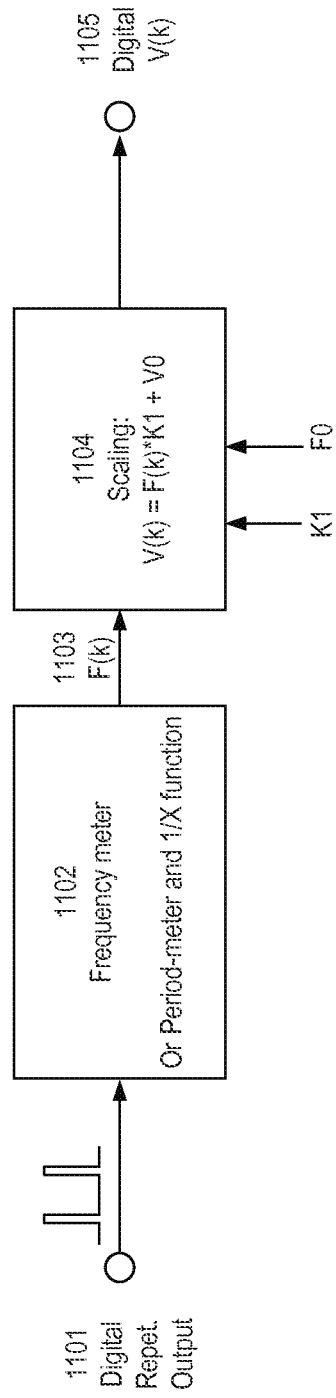
FIG. 21 depicts conversion of digital pulse stream to digital equivalent voltage sample.

FIG. 21 depicts conversion of digital pulse stream 1101 to digital equivalent voltage sample 1105. The digital repetition frequency signal 1101 can be converted into a digital voltage V(k) 1103 by going through an instantaneous frequency meter 1102. Alternatively, the digital repetition frequency signal 1101 can be passed through a period meter followed by a digital inverse function. The digital voltage V(k) 1105 is obtained after scaling 1104 as follow:

$$V(k)=F(k)*K_1+V_0$$

Figure 22:
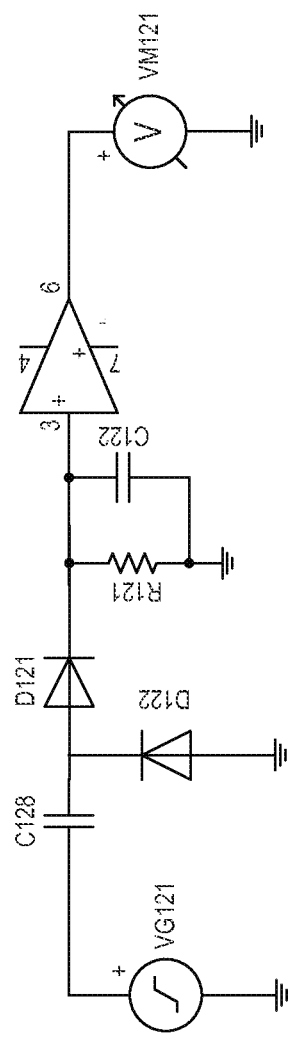
FIG. 22 depicts an example of an analog frequency to voltage converter.

Where
F(k): kth sample of instantaneous frequency,
$K_1$: a constant in V/Hz
$V_0$: constant offset voltage that corresponds to the voltage(frequency) generated when the LDA input is terminated on 50 ohm. V(0)=F(k)*K1 at 50 Ohm FIG. 22 depicts an example of an analog frequency to voltage converter (FVC). The FVC can be used in conjunction with the FM-LDA. It connects to the repetition frequency output of the LDA. As its name indicates, it provides an output with mean value being the converted voltage. Further low pass filtering may be added. This is a simple FVC but it has some limitations: the slew rate is slower than the previous digital approach for instance and typically needs a few pulses to settle to an accurate mean voltage value.

Figure 23:
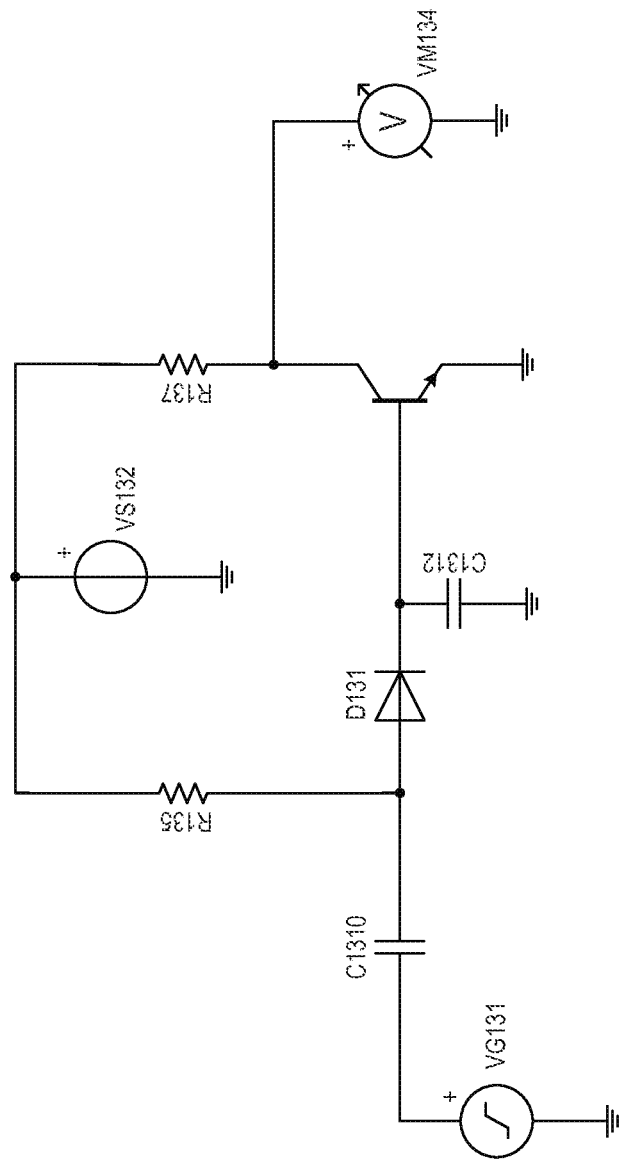
FIG. 23 depicts one embodiment of an analog detector.

FIG. 23 depicts one embodiment of an analog detector. Other embodiments are possible. The analog detector can be connected to the repetition frequency output (VM1), FIG. 19 or as well at the input of the amplifier. Further low pass filtering and amplification may be added.

Figure 24:
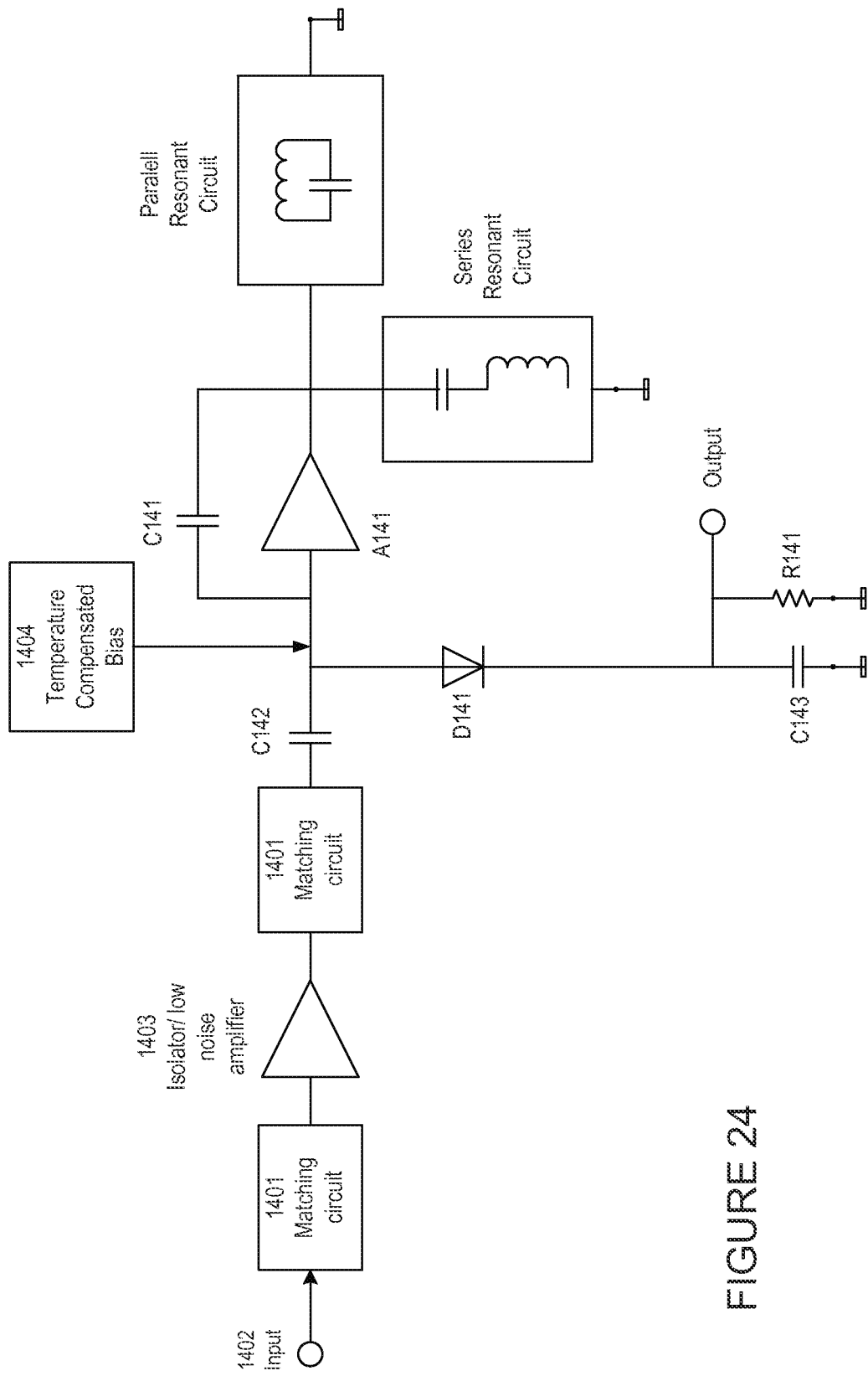
FIG. 24 depicts another implementation of an LDA.

FIG. 24 depicts another implementation of an LDA. In this preferred embodiment of a FM LDA demodulator, the temperature compensated bias 1404 for the amplifier input A141 may be designed to temperature compensates the amplifier A141. For instance if the amplifier is made of a bipolar transistor, its VBE will change with −2 mV/degree. If the DC bias voltage is made to decrease as well by −2 mV/degree, the DC voltage on the emitter will remain constant and therefore the DC current through the resistor R141 as well.

In another implementation of bias source, a temperature compensated current source may be used. When the amplifier is acting as a current amplifier with a constant low frequency gain, the output current will substantially be equal to the bias current multiplied by the gain. With a temperature compensated bias current the amplifier output current will also be temperature compensated if we assume that the low frequency gain remain constant with temperature. For instance if the amplifier is made of a bipolar transistor, and if the DC base current is temperature compensated and constant, the DC collector current will be constant as well. The DC emitter current is the addition of both base and collector currents, that is also constant. A constant current across the resistor R141 creates a constant DC voltage irrelevant of the variation of the base-emitter voltage. The input bias current source being high impedance will automatically provide a voltage that will change with the base-emitter voltage VBE of −2 mV/degree and compensate it.

An LDA with FM demodulation may suffer from some weaknesses such as leak of RF energy from its oscillator throughout the input port. This is an aggravating factor for at least two reasons. First, when the LDA is used as the first stage in a RF receiver, the RF energy is fed backward to the antenna. This causes the antenna to radiate unwanted energy in possibly unintended frequency band(s) and cause EMI noise. Second, the leaking energy can be reflected back to the LDA input with a different phase versus the input signal—a fact that defeats the purpose of regeneration (regeneration is the slow buildup of a resonance phase coherent with the input signal). Therefore it reduces the RF sensitivity.

Also additional use of gain can be obtained when a low noise amplifier LNA precedes the log detector amplifier LDA. Indeed being a regenerative device, the LDA may not fully described by the noise law for linear circuits such as in conventional receiver chain where the first amplifier of the chain is the key element in determining the noise figure of the receiver, as defined per the Friis' formula:

$$NF = 10*\log(F) \text{ in (dB) and } F = F_{A1} + \frac{F_{A2}-1}{G_{A1}} + \frac{F_{A3}-1}{G_{A1}G_{A2}} + \ldots \text{ in(.)}$$

with NF: Total noise figure, ratio in dB
F: total noise figure, ratio in linear
$F_{Ai}$: Linear noise figure of the $i^{th}$ amplifier of the amplifying chain
$G_{Ai}$: Linear gain of the $i^{th}$ amplifier In the case of a regenerative log amp, the regenerative part can improve the SNR when placed in first place or at any location in the receive chain. Therefore the regenerative LDA can make good use of a preceding low noise amplifier even in a noise limited amplifier receiver chain. Such LDA may amplify further a signal buried in the noise because the dynamic range is extended on the low side (noise level) of the signal. In such a noise-limited receiver but without LDA, the hypothetic addition of a LNA would be of little use since the system would be noise limited.

For instance adding a 20 dB gain LNA in front of a noise limited receiver without LDA would barely increase the sensitivity level by 0 to 2 dB. On the other side, by using a log amp with regeneration factor of say 8 dB would improve the sensitivity by a factor of 6 to 8 dB.

Therefore the addition of a matching circuit(s) 1401 at the LDA input may improve the coupling with the preceding circuit and reduce the input reflections. Furthermore the addition of an isolator 1403 at the input 1402 (e.g., an amplifier with high factor of isolation) may further improve regeneration and gain opportunity.

SISO, LDA and Active Antenna

Spatial diversity, interference cancellation or reduction can be achieved with a single input single output transceiver of the types described herein if the antenna is active: frequency agile or has beam forming capability or the ability to put nulls in certain direction(s) that are adjustable. The addition of the LDA may increase the sensitivity, reduce the RF frequency bandwidth, actively regenerate the signal while reducing noise, permit one to design an interface impedance to the antenna that is different than 50 ohm, provide a bidirectional operation in full or half duplex, simplify the topology, and the like.

Figure 25:
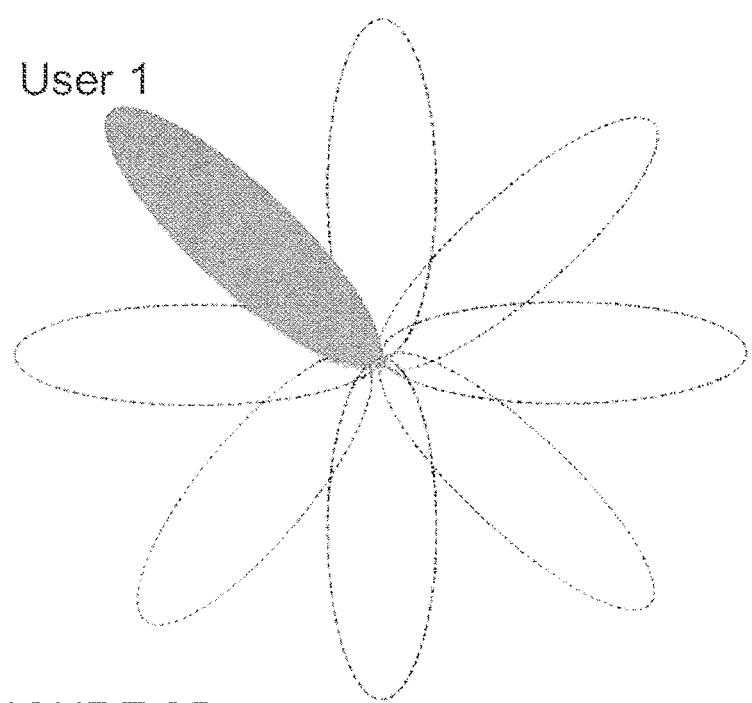
FIG. 25 illustrates a switch beam antenna where the array antenna is designed to move its beam in time with some preset angles to the users.
Figure 26:
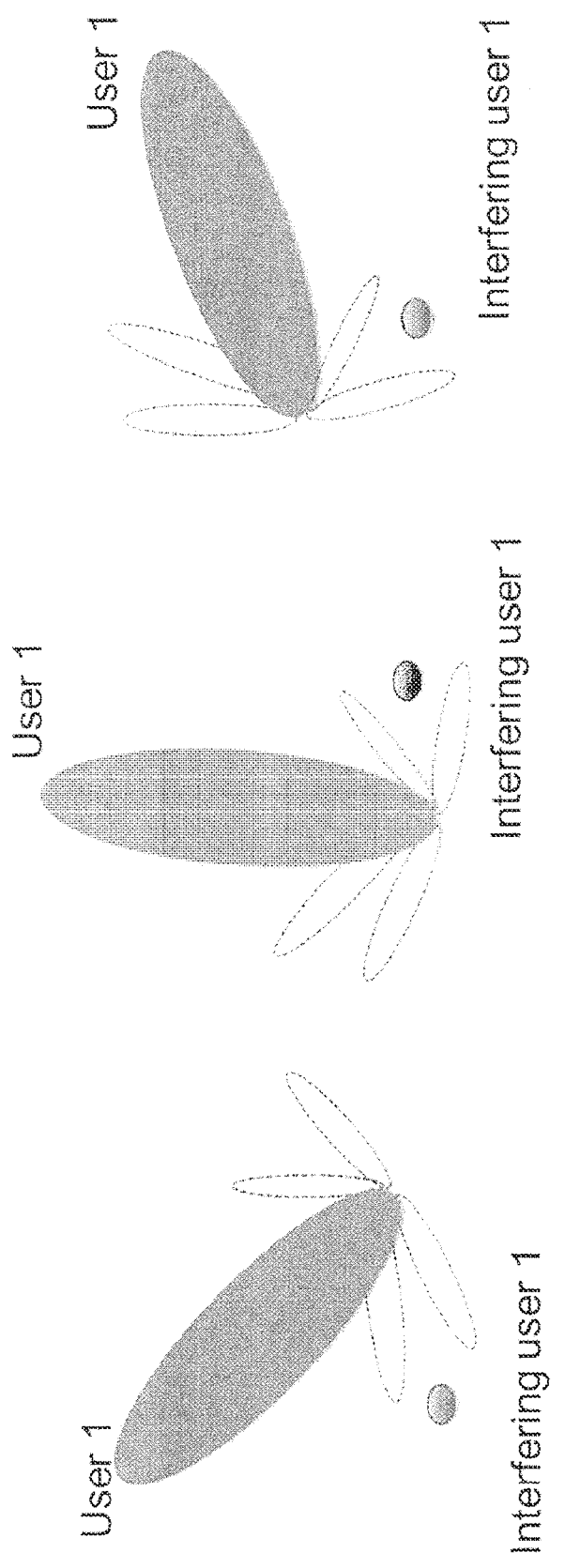
FIG. 26 illustrates how adaptive beam forming can select a beam to radiate to each user and can null the interferer users

FIG. 25 illustrates a switch beam antenna where the array antenna is designed to move its beam in time with some preset angles to the users. As shown in FIG. 26, adaptive beam forming can select a beam to radiate to each user and can null the interferer users. In the example shown in FIG. 26, a user 1 can travel around the base station such that the phone adapts its beam to maintain the best possible connection by nulling any potential interfering user.

Figure 27:
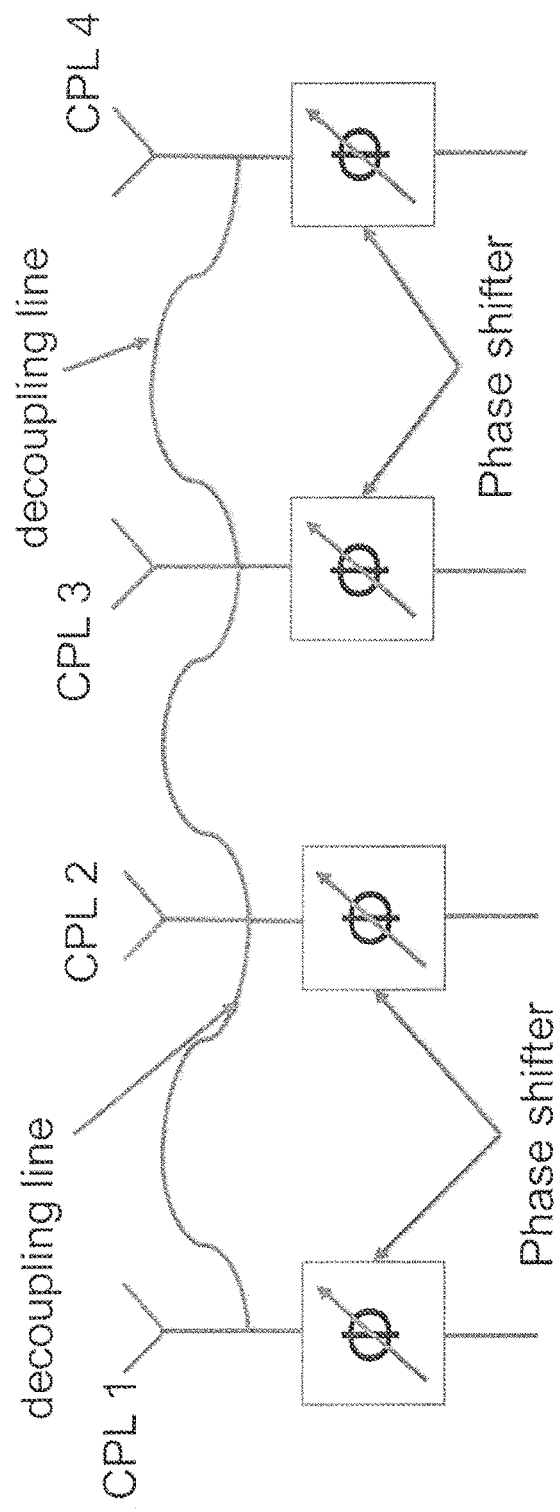
FIG. 27 illustrates different ways of improving isolation between antennas in a phased array, beam forming application.

FIG. 27 illustrates different ways of improving isolation between antennas in a phased array, beam forming application. As illustrated, CPL antennas CPL1, CPL2, CPL3, and CPL4 are ideally separated by λ/4, λ/2, and λ apart from each other. However, in some cases there is not enough room in the antenna housing to provide that much distance between antennas and the antennas are, for example, λ/10 apart. However, by using a decoupling line as shown to decouple the antennas when the antennas are close to each other (e.g., λ/10 apart), different implementations are possible, including a pure microstrip, a combination of microstrip and lumped elements, a grounded antenna placed between two adjacent antennas, a phase shifter for beam forming, and the like may be formed. The phase shifter can be controlled by an algorithm in baseband applications or through an interface, e.g., MIPI, SPI, GPIO, and the like.

Figure 28:
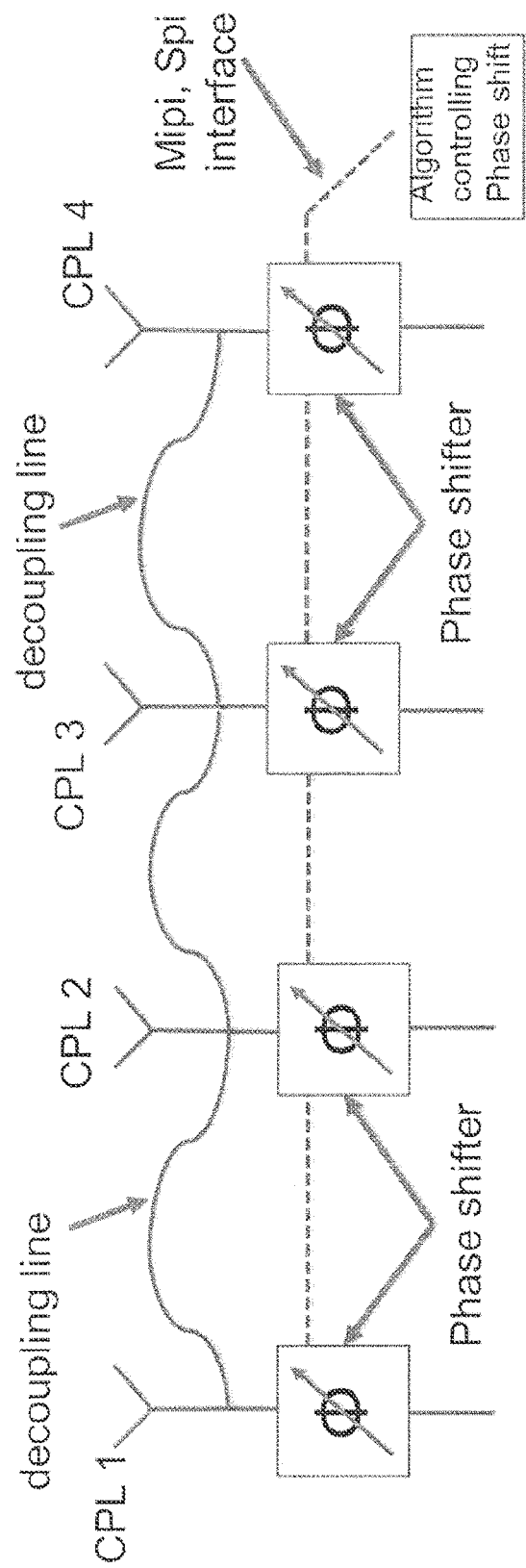
FIG. 28 illustrates that CPL antennas can be passive or active for frequency shift or by loading it with a certain impedance to prevent radiation from affecting it.
Figure 29:
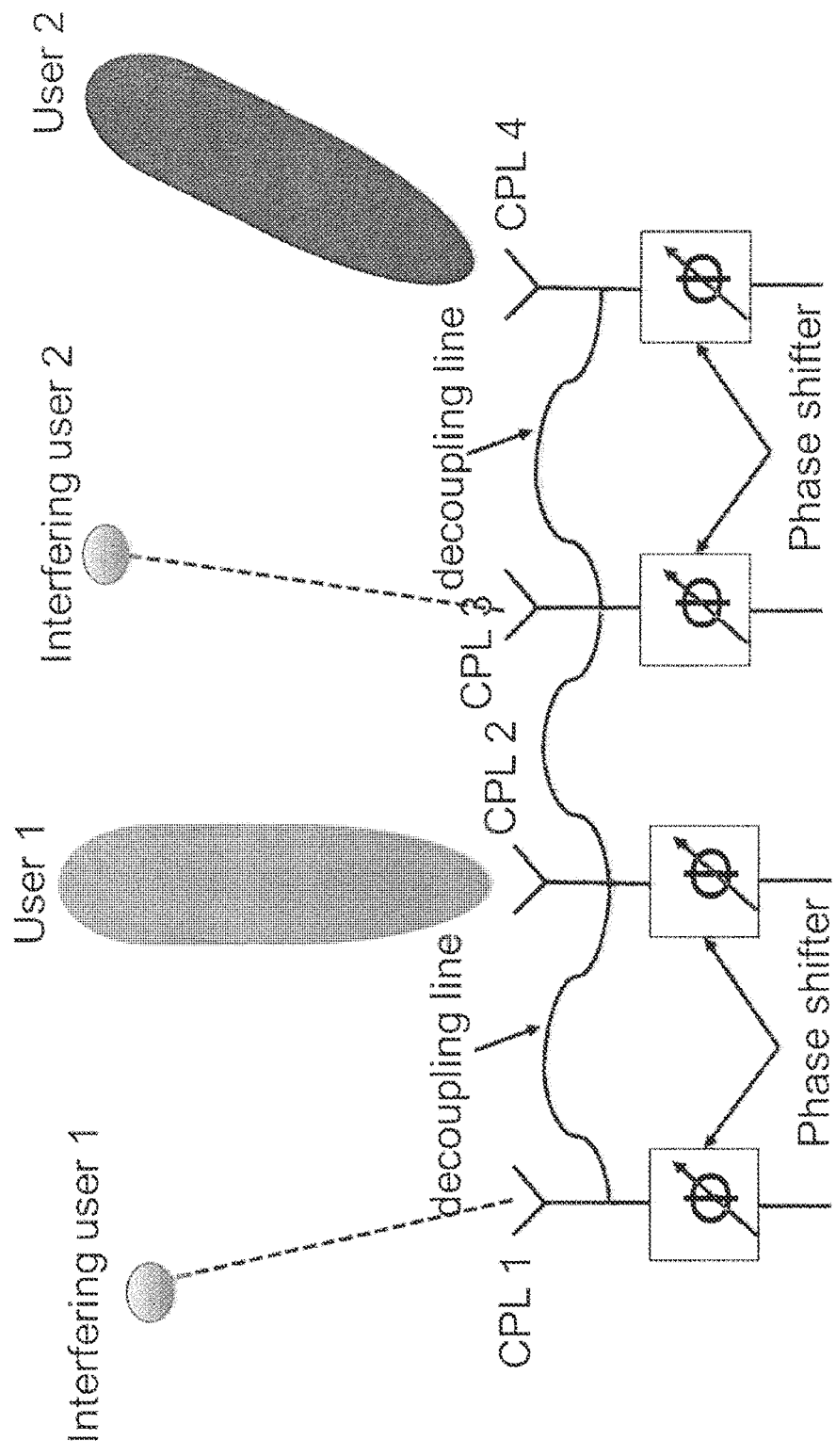
FIG. 29 shows the resultant beamforming using the switch beam antenna configuration of FIG. 28.
Figure 30:
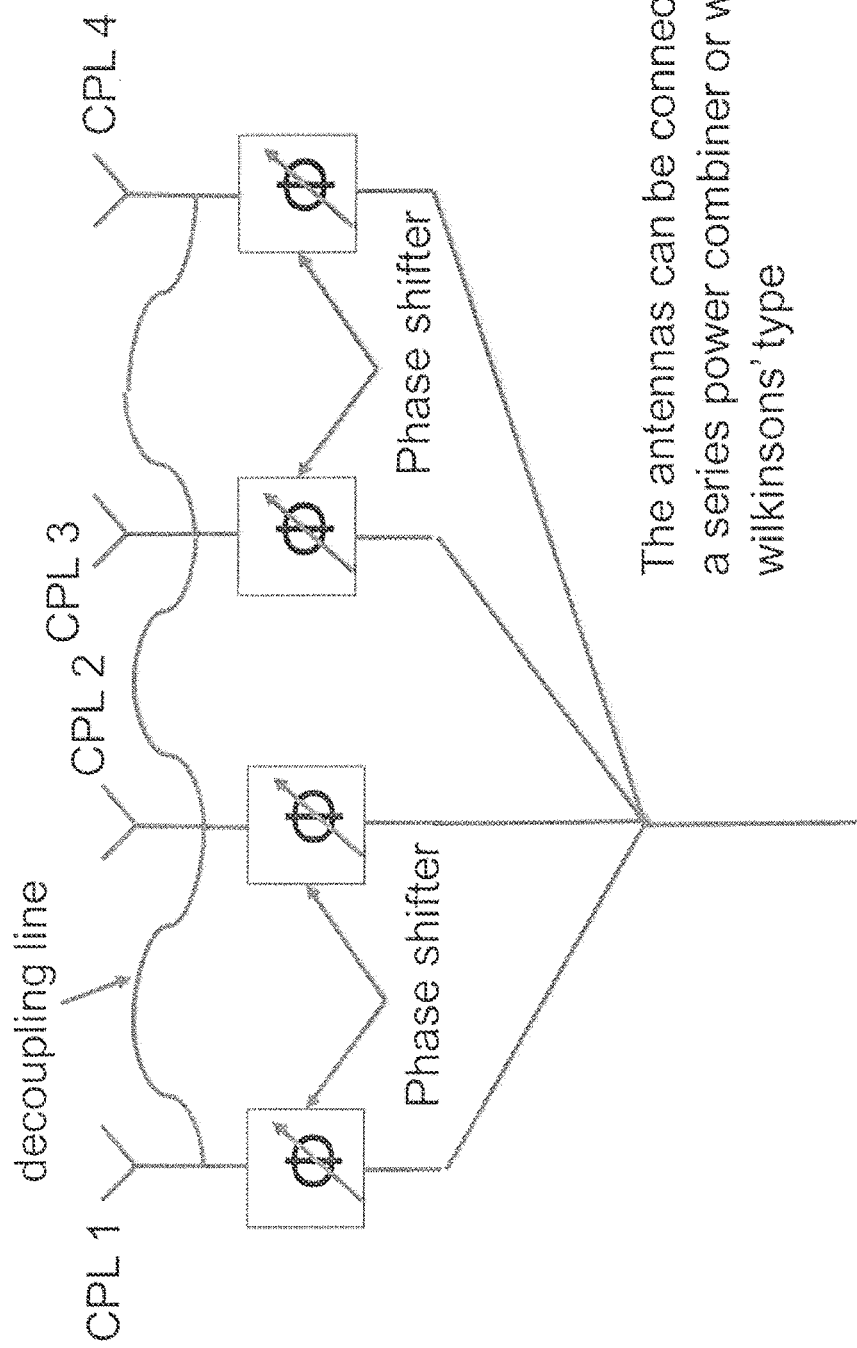
FIG. 30 illustrates the antennas connected with a series power combiner or with a Wilkinsons' type combiner.

As shown in FIG. 28, CPL antennas can be passive or active for frequency agility or by loading it with a certain impedance to prevent radiation from it, transmit and Receive will be stopped. A switch can be placed next to the radiator to ground it or to terminate it in any impedance (50 Ohms, low impedance<<50 Ohm, or high impedance >>50 Ohms). FIG. 29 shows an example of the resultant beamforming using the switch beam antenna configuration of FIG. 28. As indicated, the interfering users are nulled. Each antenna can be turned ON and OFF for best transmission and reception, less RF power is wasted. The antennas deserve only the users talking to the base station in this example of FIG. 29. It is possible to provide an enhanced connection between the user and the base station by combining active CPL antennas with a series power combiner/divider shown in FIG. 29, active phase shifters and the decoupling lines. FIG. 29 presented a serial power combiner. FIG. 30 shows that the antennas can also be connected with a planar power combiner or with a Wilkinsons' type combiner. Any type of combiners can be used for adaptive beam steering.

Figure 31:
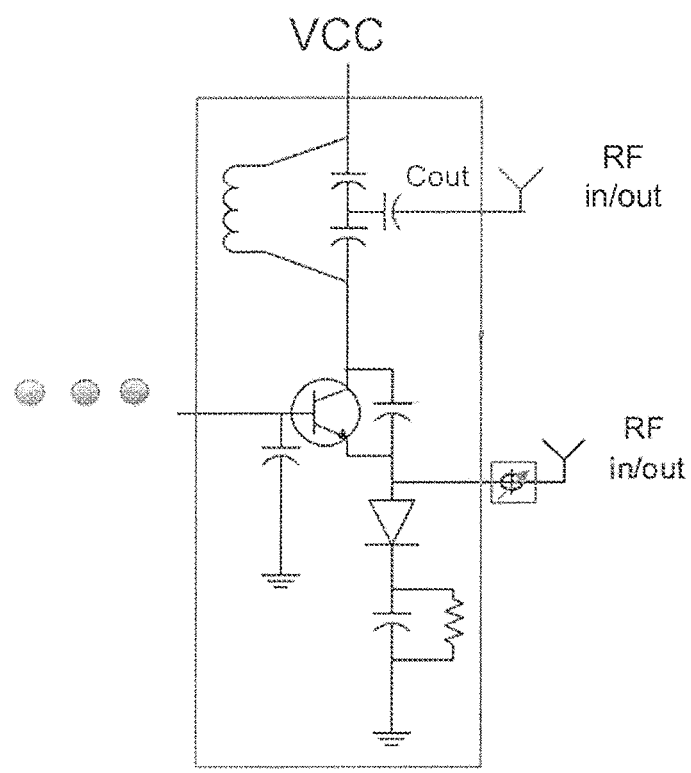
FIG. 31 illustrates a configuration with an LDA integrated to provide variable and space diversity.

FIG. 31 illustrates a configuration with an LDA integrated to provide dual time and space diversity. As illustrated, one antenna can be at the input and one at the output. It is also possible to have only one antenna at the input at the emitter of the transistor, and the LDA can be used to amplify the received signal. Alternatively, one antenna may be provided at the output, after the capacitor Cout. Also noted herein, the LDA can be used in as low noise amplification, as a power amplifier and in a bidirectional mode. In addition, each single antenna can be replaced by an array of antennas to provide adaptive beam forming. Because of the high sensitivity of the LDA, the LDA can detect signals 4-10 dB lower level than any other architecture known to the inventors.

Figure 32:
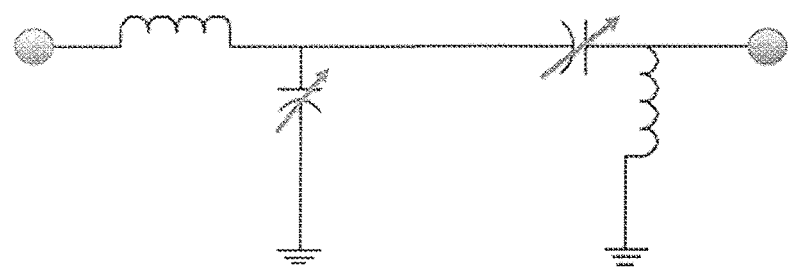
FIG. 32 illustrates a phase shifter with variable capacitors.

FIG. 32 illustrates a phase shifter with variable capacitors. By using this type of structure which is a Composite Right Left Handed transmission Line (CRLH-TL), it is possible to have different phases at different frequencies which give more flexibility for the adaptive beam forming.

Figure 33:
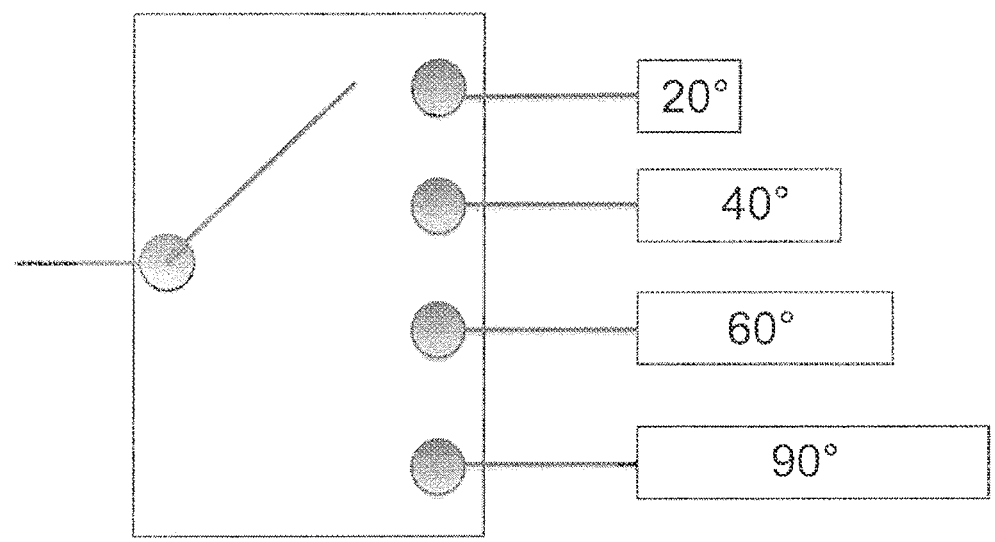

FIG. 33 illustrates a SP4T switch that can be connected to different electrical phases, where these phases can be implemented with microstrip, CPWG, lumped elements, waveguides, and the like. Each line can by implemented with variable lumped elements to increase the range of phase shifts.

Use of MIMO

Using MIMO or other diversity scheme enables multipath fading to be used advantageously and for multiple streams of data to be sent when the diversity is large enough. There is always the trade-off of maximum data rate and limited diversity versus maximum diversity with lower data rate (link/throughput robustness). When the indoor separation exceeds 20 feet, or when streaming video, less than N streams of data on N antennas is the most practical solution, for instance 4×4 but using 2 streams of data and 2 streams for spatial diversity.

Use of Multiple Selectable and/or Adjustable Antennas in Addition to MIMO

In accordance with the invention, multiple selectable and/or adjustable antennas may be used even per MIMO stream. MIMO antennas are supposed to be as omnidirectional as possible and separated by some distance. The processing can beamform to increase the gain in particular directions. However, if the antennas are directive, more range or throughput can be achieved in some cases while some useful patterns may not be feasible for other multipath fading scenarios or beamforming may be difficult to generate. In this case, an omnidirectional antenna can be sectorized into three sectors, for instance, for each to cover about 120 degrees of the space. This works relatively well in cellular radio but not well indoors due to multipath fading due to people motion and the structure of the building that includes many partitions. It is always a good idea to provide spatial diversity and to cover the space with more than one antenna even per stream. Of course, the MIMO algorithm needs an additional layer of processing to try several combinations of antennas for best throughput from the router to the device(s) for instance. Also, the transfer function from the router to each WLAN device should be measured and optimized for best performance at each WLAN device.

Use of One or More Steerable Antennas Even with MIMO

Steerable antennas may be used to adjust dynamically the pattern, direction, or gain of the antennas. This is one layer of additional complexity and of course can be used for MIMO N×N but also 1×N or 1×1. Steerable antennas are very beneficial in a small client device such as a mobile phone where there is no space for multiple antennas or for increasing the size of the device to accommodate a larger antenna. Adding an electronic steering mode can drastically improves its performance.

Figure 34:
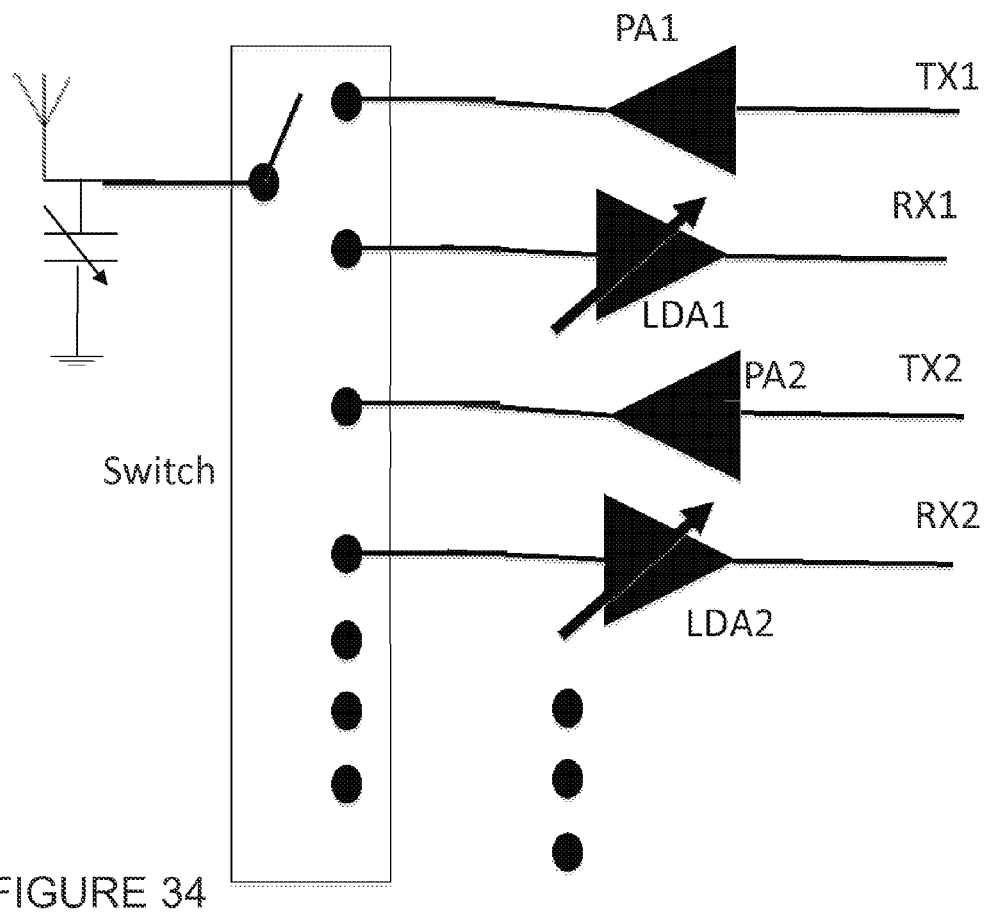
FIG. 34 illustrates an embodiment using steerable antennas to dynamically adjust the pattern, direction, or gain including adjustable LDAs on the receivers, to cover different bands for time division duplex (TDD).

FIG. 34 illustrates an embodiment using steerable antennas to dynamically adjust the pattern, direction, or gain of MIMO N×N arrays including adjustable LDAs on the receivers. The figures shows multiple transmit PAs and receive LNAs LDA-based for multiband application per each antenna and half duplex. Only one antenna is shown in FIG. 34 but multiple antennas can be connected to the switch that can be a Single Pole N Throw SPNT, or Dual Pole N Throw DPNT or a N Pole N Throw NPNT.

Figure 35:
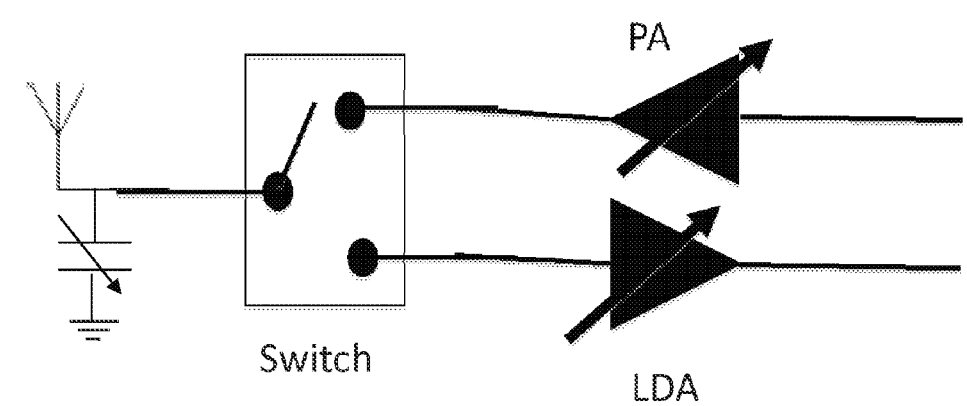
FIG. 35 illustrates an embodiment using steerable antennas in half duplex mode to dynamically adjust the pattern, direction, or gain of an RF front end with a variable transmitter and a variable receiver including an adjustable LDA.

FIG. 35 illustrates an embodiment using steerable antennas in half duplex mode to dynamically adjust the pattern, direction, or gain of an RF front end with a variable transmitter and a variable receiver including an adjustable LDA to cover different bands for time division duplex (TDD) per antenna.

Figure 36:
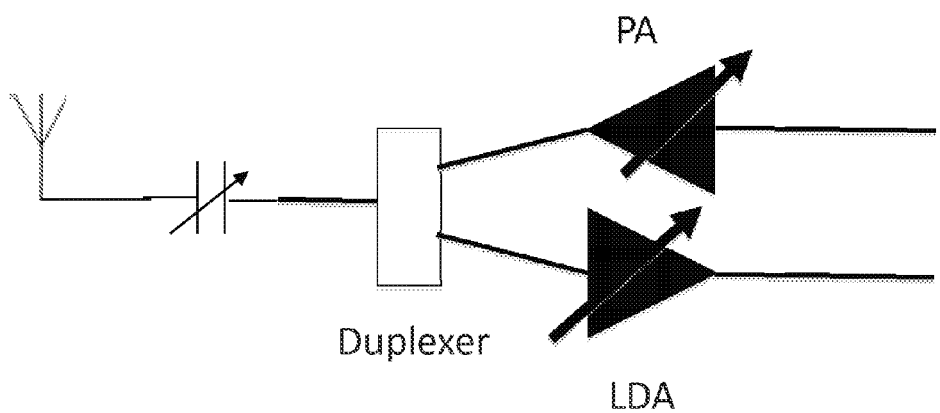
FIG. 36 illustrates an embodiment using steerable antennas in full duplex mode to dynamically adjust the pattern, direction, or gain of an RF front end with a variable transmitter and a variable receiver including an adjustable LDA to cover different bands for time division duplex (TDD).

FIG. 36 illustrates an embodiment using steerable antennas in full duplex mode to dynamically adjust the pattern, direction, or gain of an RF front end with a variable transmitter and a variable receiver including an adjustable LDA to cover different bands for time division duplex (TDD) per antenna.

Figure 37:
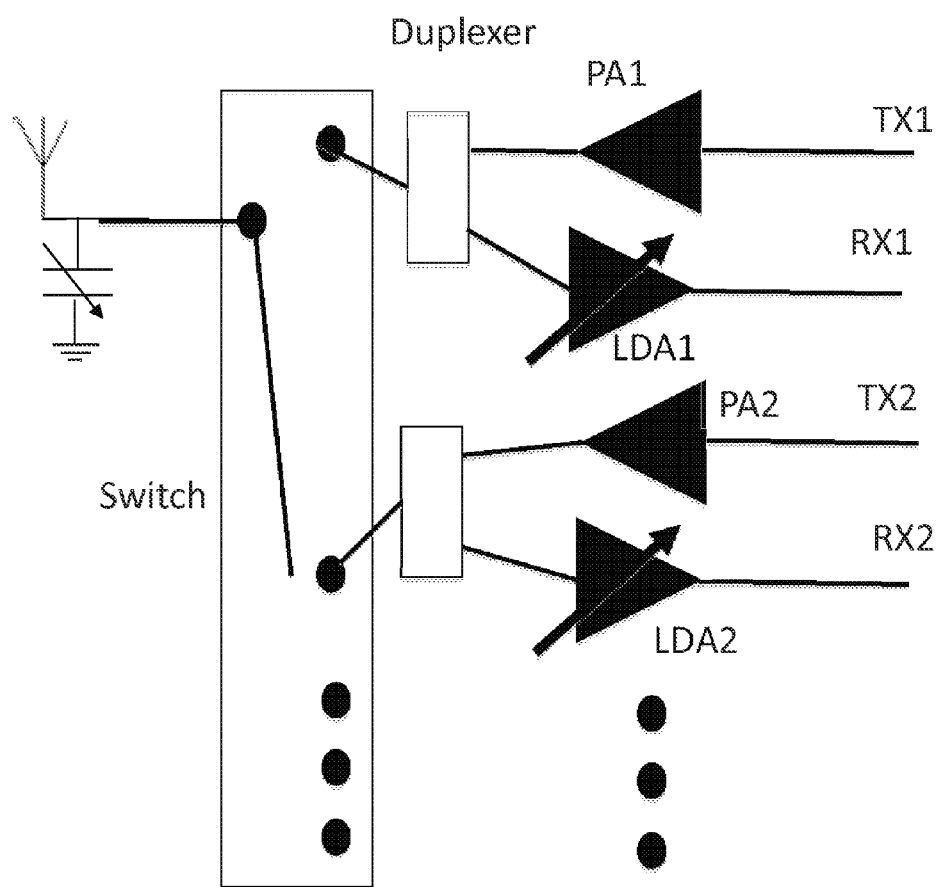
FIG. 37 illustrates an embodiment using steerable antennas in full duplex mode to dynamically adjust the pattern, direction, or gain of an RF front end with a variable transmitter and a variable receiver including an adjustable LDA to cover different bands for frequency division duplex (FDD).

FIG. 37 illustrates an embodiment using steerable antennas in full duplex mode to dynamically adjust the pattern, direction, or gain of an RF front end with a variable transmitter and a variable receiver including an adjustable LDA to cover different bands for frequency division duplex (FDD).

Figure 38:
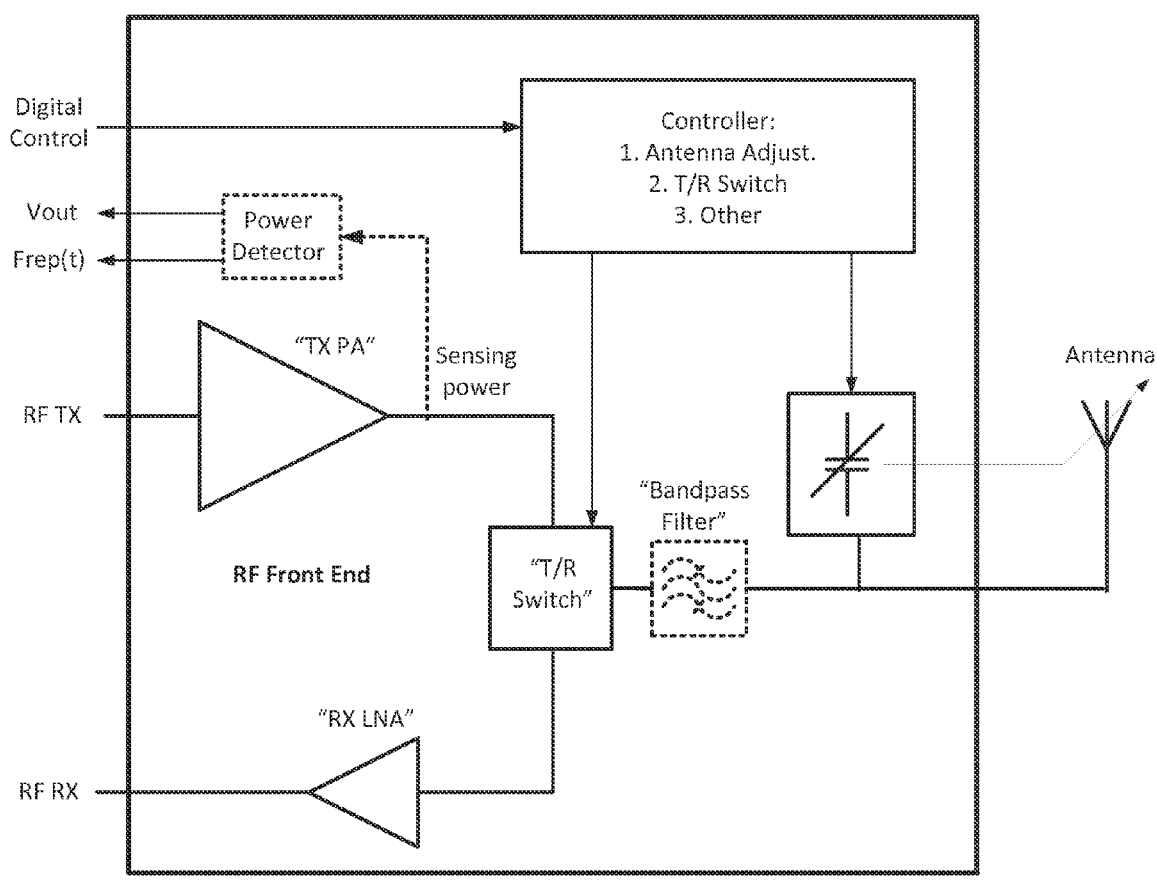
FIG. 38 illustrates an embodiment showing a RF front end with TX PA and RX LNA with same input output frequency for SISO or MIMO that can use LDAs and one adjustable, steerable antenna.

FIG. 38 illustrates an embodiment showing a RF front module made of several functions per one agile, steerable antenna. For a SISO configuration one antenna is connected to the RF front-end module. For MIMO N antennas are attached to N RF front-end module. Based on the teaching herein, the inventors learned that this module may be including one or more LDA, may be integrated in partly completely into an integrated circuit, may be tiny in size and in a preferred configuration located at the antenna.

The RF front end module contains the following block: A TX PA, a RX LNA, a T/R switch, an optional filter, a controller and digital interface, an RF active adjustment, and an optional power detector. The TX PA may be a standard PA component or a LDA configured in PA with same frequency input and output as taught previously, the RX LNA may be a standard LNA, an LDA configured in LNA with same RF input and output frequency, a T/R switch that can be a standard RF switch or a may be removed in some LDA embodiment, an optional RF filter that can be a standard RF filter such as a SAW, ceramic, active, LC, coaxial, etc. or a LDA configured as a bidirectional frequency selective amplifier, a controller that control the switch from transmit or receive, controls the antenna adjustment block and controls the LDA per channel if the LDA is channel selective and agile, an antenna adjustment block that may be a bank of capacitor in binary range controlled by analog signal or logic signal and finally an optional power detector that can be standard such as a PIN diode circuit, a coupler circuit, a Gilbert cells log amp or a LDA configure in AM demodulation including a Frep output and an optional Vout analog output.

Any configurations for mixing are possible. As an example, a MIMO 6×6 is selected. Six such RF front-ends would be attached to six agile independent antennas. The front end may be compose of the following blocks: a RX LNA LDA-base, a standard T/R switch, an LDA-based PA with its integral power detector and a f/v converter to output a Vout signal, a standard band pass filter, a capacitor digital block, and a CPL antenna of reduced size. In addition, this MIMO 6×6 would be targeting the Wi-Fi band of 2.4-2.5 GHz and the front end would be channel specific in order to increase the interference rejection in band and out band. Both TX PA and RX LNA LDA based would be channel specific and driven by the controller. Each one could be locked into a PLL in order to select the desired channel, information sent from the base-band transceiver to the front end.

In an embodiment, the agile and steering antenna is replaced by a only agile antenna that has a channel specific reduced bandwidth that can be moved in frequency for instance channel 1 to 13 for Wi-Fi 802.11n in the band of 2.4-2.5 GHz. In another embodiment, the antenna is fixed. This implementation shows one LDA per antenna at or close to the antenna for best performance and local processing with remote processing consolidation. The RF receiver performance is optimized since the active RF front end is located at the base of the antenna or very close thereto. Because the line is very short, it is less prone for EMI pickup and provides low loss from the antenna to the RF front end.

All the high performance benefits of the LDA may apply in the RF front end if used here such as high receive sensitivity, high dynamic range, very low noise, a simple receiver, and the fact that several front end modules can be put on a PCB to provide one front end per antenna. It will also be appreciated that use of the LDA permits replacement or removal of various components as listed above. For example, LNA, PA, power detector, and filter.

Figure 39:
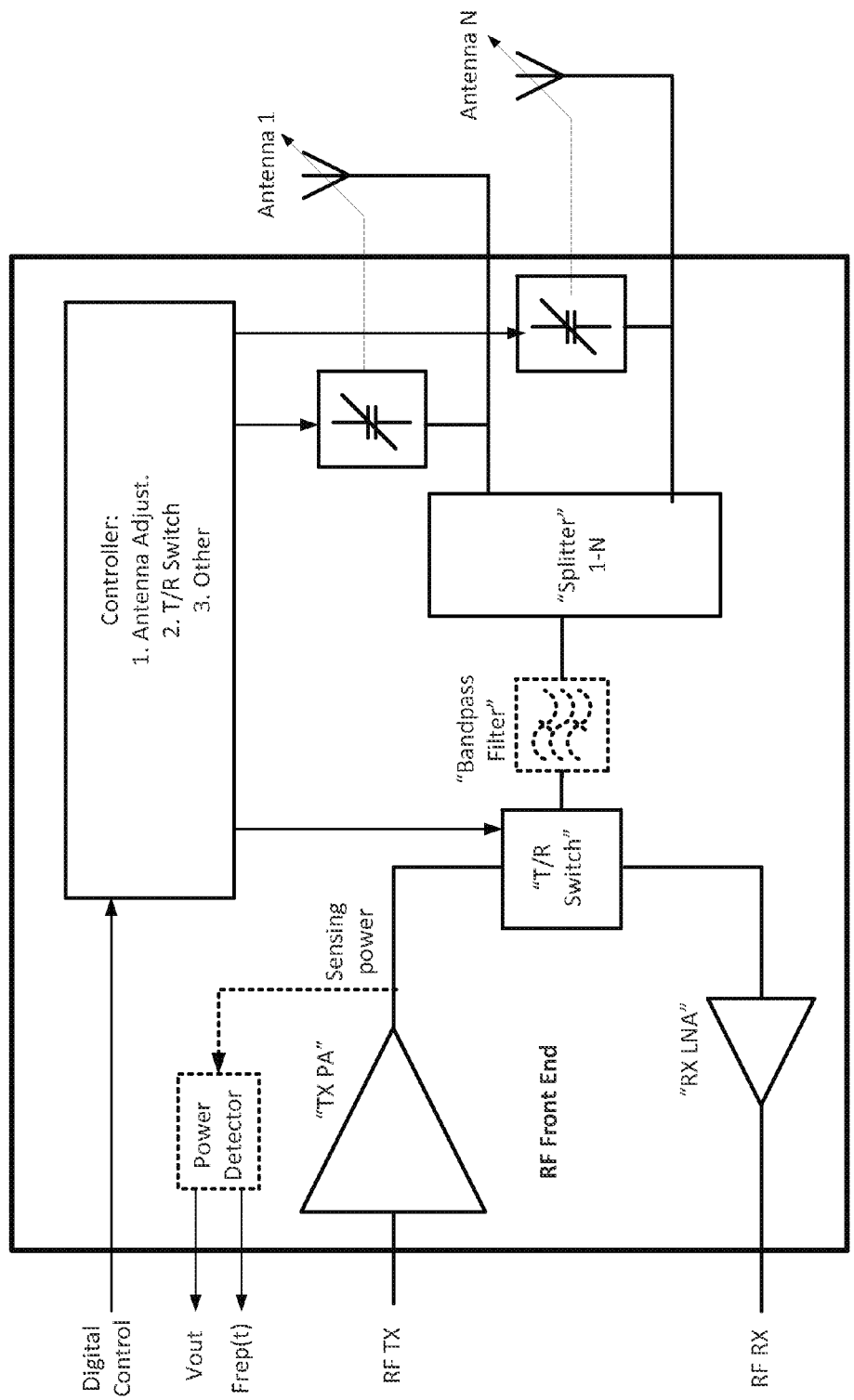
FIG. 39 illustrates an embodiment showing a RF front end with TX PA and RX LNA with same input output frequency for SISO or MIMO that can use LDAs and M adjustable, steerable antennas.

FIG. 39 illustrates an embodiment showing a RF front module made of several functions per several agile, steerable antennas. For a SISO configuration, M antennas are connected to the RF front-end module with a 1-M splitter. For MIMO N×N, N antennas are attached to N RF front-end modules. Based on the teachings herein, the inventors learned that each RF front end module may include one or more LDAs, may be integrated partly or completely into an integrated circuit, may be tiny in size and in a preferred configuration located in close proximity of its N antennas. The description of the module is identical to FIG. 38 except the addition of a 1-N splitter that can be standard such as a 1-N Wilkinson splitter or a metamaterial splitter of smaller size, etc. Another difference is the adjunction of M antenna active adjustment blocks such as digital capacitor blocks. An embodiment is a case of two antennas connected directly to a LDA as per FIG. 31. One or both of the antenna may have a phase adjustment, agile or steering ability.

The RF front end of FIGS. 38 and 39 permit one to design a flexible N or M*N antenna wireless system that may tackle various kind of modulation (OFDM/QPSK/LTE) and topologies (e.g., 802.11n, 1×1, n×n, MIMO, 802.11ac, etc.) from various host systems such as Wi-Fi, LTE, Bluetooth, etc.

Figure 40:
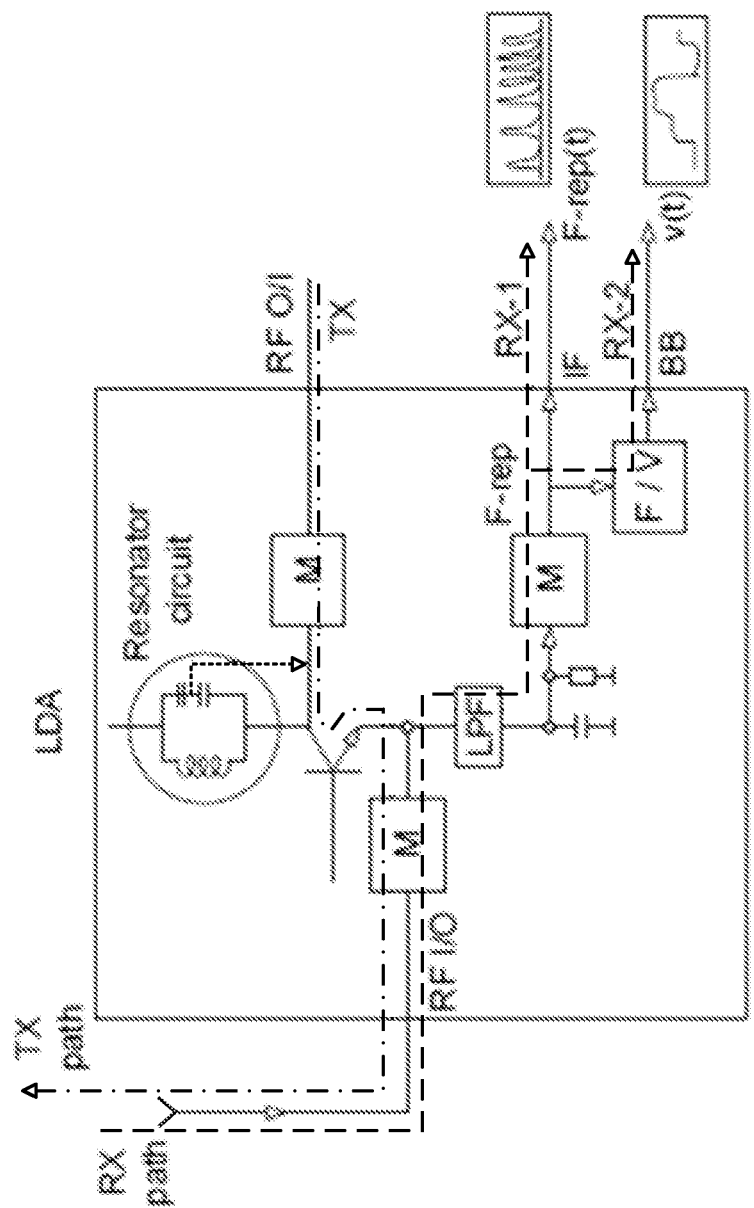
FIG. 40 illustrates an embodiment in which an LDA is used as a replacement for an RF front end without addition of splitter (and optional band pass filter) where the receiver is at a frequency different than the transmitter in full or half duplex modes.

FIG. 40 illustrates an embodiment in which an LDA is used as a replacement for an RF front end without addition of splitter (and optional band pass filter) where the receiver is at a frequency different than the transmitter in full or half duplex modes. This is a variation of the embodiment described above with respect to FIG. 38 where the LDA is used as full duplex or half duplex bidirectional amplifier. It is similar to that embodiment in FIG. 38 except that no splitter is needed since the transmitter and receiver paths are separated already in the LDA, and two receiver paths are possible (see RX option 1 and RX option 2). Also in this particular case, the antenna is fix. I another embodiment the antenna is agile and steerable. In comparison to the RF front end of FIG. 38, this solution is very economic: A single LDA embeds the PA function, the RX demodulation function, the T/R switch is removed, and the band pass filter is integral. Those skilled in the art will appreciate that the embodiment of FIG. 40 is very attractive in term of topology simplicity, affordability, and performance.

Figure 41:
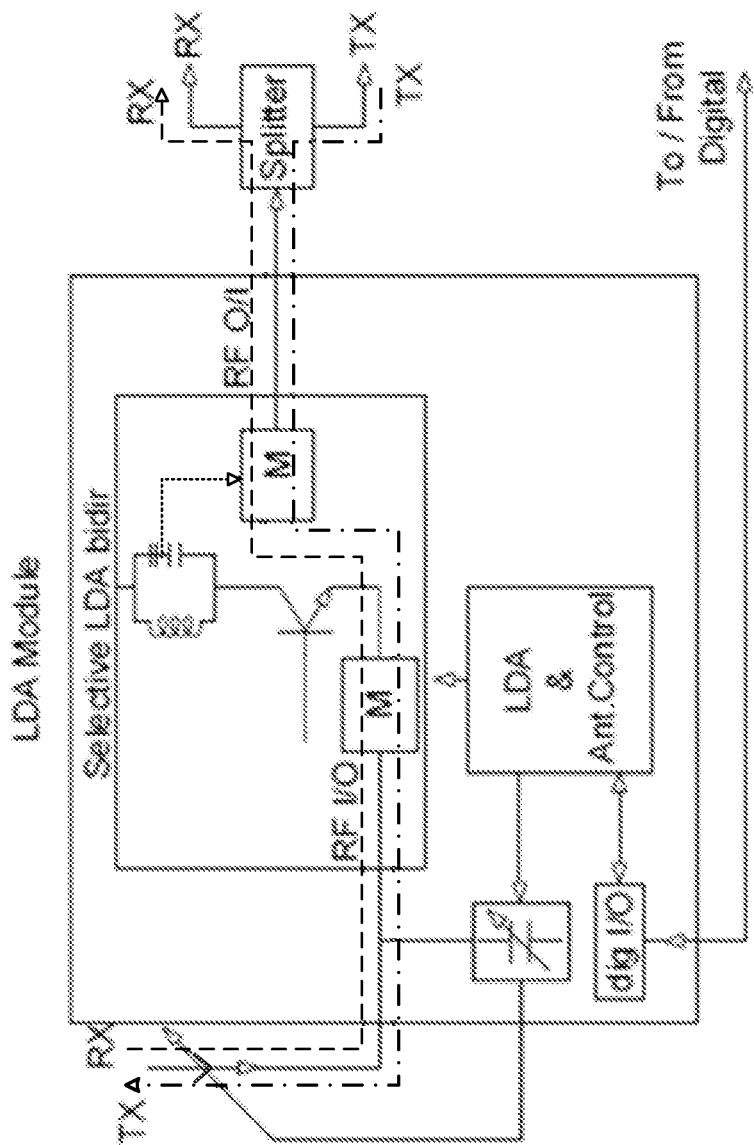
FIG. 41 illustrates an active antenna and bidirectional selective bidirectional LDA module with splitter per antenna in SISO or MIMO configurations.

FIG. 41 illustrates yet another embodiment of a RF front end with same frequency in and out in TX and RX. This is a more economical version of the RF front end of FIG. 38 with the TX PA and RX LNA as one LDA, no T/R switch, integral bandpass filter and addition of the controller, antenna adjustment block and splitter for SISO or MIMO per antenna configurations. In yet another embodiment, the integral power detector function of the LDA is added and either Frep or Vout after a f/v converter is output to feedback the emitted power value to baseband. In another implementation, the RF front end is not channel specific and covers the entire band. In yet another implementation the RF front end is channel specific and set to the selected channel controlled by the baseband.

Figure 42:
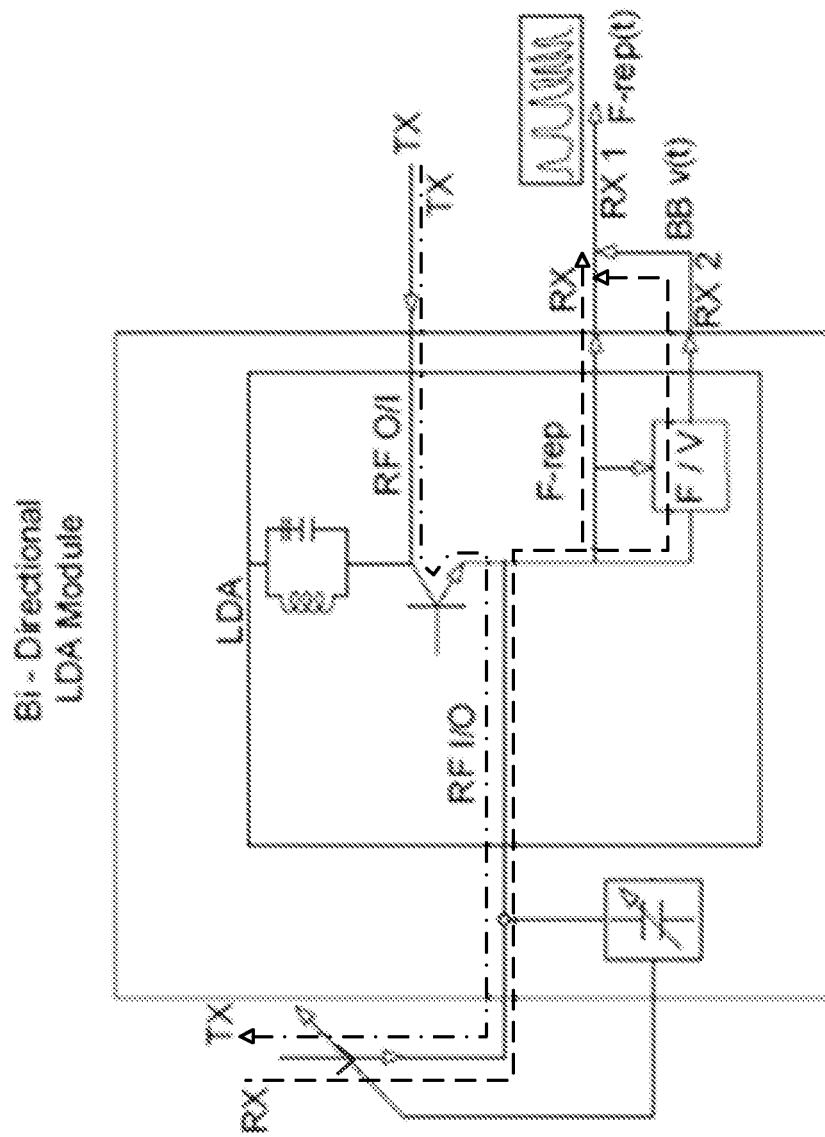
FIG. 42 illustrates an active antenna and bidirectional selective bidirectional LDA module without splitter for SISO or MIMO per antenna configurations where the receiver is at a frequency different than the transmitter in full or half duplex modes.

FIG. 42 illustrates yet another embodiment of a RF front end and very similar to the one of FIG. 40 except that the antenna may be agile and steerable and use of input output matchings.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

What is claimed:

1. An antenna system for wireless transmission, comprising:
   an antenna; and
   a logarithmic detector amplifier (LDA) connected to the antenna configured to cancel radio interference in transmission data received or transmitted by the antenna, the LDA comprising:
   an amplifying circuit having an input port, and configured to receive, at the input port, an input signal having a first frequency and to generate an oscillation based on the input signal;
   one or more resonant circuits coupled to the amplifying circuit and configured to establish a frequency of operation of the system and to generate, at a first output port, a first output signal having a second frequency, the second frequency being substantially the same as the first frequency; and
   a controller circuit connected to the amplifier input and configured to cyclically terminate oscillation of the input signal each time a pre-determined threshold of voltage is detected, the controller circuit including a low pass filter configured to generate, at a second output port, a second output signal having a repetition frequency at a third frequency,
   wherein the antenna is coupled to the input port of the amplifying circuit and is configured to transmit a first transmit signal, and wherein the first transmit signal is amplified by the LDA operating in a reverse mode.

2. The system of claim 1, wherein the antenna comprises at least one of an active, adjustable or steerable antenna.

3. The system of claim 2, further comprising:
   a second LDA coupled to a second antenna, wherein the second antenna comprises at least one of an active, adjustable or steerable antenna, wherein the antenna system is configured to support MIMO communication, and wherein the antenna and the second antenna are configured to reduce or eliminate noise interference between received or transmitted data channels.

4. The system of claim 1, wherein the LDA is located substantially at or proximate to a base of the antenna.

5. The system of claim 1, wherein the antenna is a Compound Printed Loop (CPL) antenna.

6. The system of claim 1, wherein the LDA functions as at least one of a transmit power amplifier or a receive low noise amplifier (LNA) when operating in the reverse mode.

7. The system of claim 1, wherein the first output port of the LDA is configured to:
   receive a second input signal having a fourth frequency; and
   amplify the second input signal to output the first transmit signal having a fifth frequency, wherein the fifth frequency is substantially the same as the fourth frequency.

8. The system of claim 7, wherein the second input signal comprises one or more carriers and one or more modulations, and wherein the LDA is configured to amplify the second input signal to produce the first transmit signal comprising substantially the one or more carriers and the one or more modulations.

9. The system of claim 7, wherein the LDA is configured to amplify the second input signal to output the first transmit signal at the input port along a transmit path, wherein the antenna is configured to receive the input signal, and wherein the LDA is configured to amplify the input signal received at the input port to output a first received signal at the second output port along a receive path.

10. The system of claim 9, wherein the LDA is configured to separate the transmit path and the receive path to isolate the second input signal from the input signal.

11. The system of claim 9, further comprising a splitter coupled to the first output port of the LDA, wherein the splitter is configured to separate the transmit path and the receive path to isolate the second input signal from the input signal.

12. The system of claim 7, wherein the input signal comprises one or more carriers and one or more modulations, and wherein the LDA is configured to amplify the input signal to produce the first output signal comprising substantially the one or more carriers and the one or more modulations when operating in a forward mode.

13. The system of claim 12, further comprising a splitter coupled to the first output port of the LDA, wherein the LDA is configured to operate in the reverse mode and the forward mode concurrently.

14. The system of claim 13, wherein a common port of the splitter is coupled to the first output port, a first splitter output port is coupled to a receive path, and a second splitter output port is coupled to a transmit path.

15. The system of claim 14, wherein the LDA is configured to operate as a receive low noise amplifier LNA and a transmit power amplifier concurrently in at least one of the reverse or the forward mode.

16. The system of claim 13, wherein the LDA is configured to operate as at least one of a bidirectional LDA, a full-duplex bidirectional amplifier, or a half-duplex bidirectional amplifier.

17. The system of claim 13, wherein the second input signal comprises one or more first carriers and one or more first modulations;
    wherein the splitter directs the second input signal to the first input port of the LDA; and
    wherein the LDA is configured to amplify the second input signal to produce the first transmit signal comprising substantially the one or more first carriers and the one or more first modulations;
    wherein the input signal comprises one or more second carriers and one or more second modulations;
    wherein the splitter directs the input signal to the first output port of the LDA; and
    wherein the LDA is configured to amplify the input signal to produce the first output signal comprising substantially the one or more second carriers and the one or more second modulations.

18. The system of claim 12, wherein the LDA functions as at least one of a receive low noise amplifier (LNA) or a transmit power amplifier when operating in the forward mode.

19. The system of claim 7, wherein the repetition frequency of the second output signal comprises power information associated with the input signal or the second input signal.

20. The system of claim 19, wherein the power information comprises a logarithmic scale conversion of power input in dB to a volts output.

21. The system of claim 19, wherein the power information is extracted from the second output signal by at least one of:
    measuring an instantaneous frequency output of the second output signal; or
    measuring an instantaneous period between pulses of the repetition frequency of the second output signal.

22. The system of claim 19, wherein input power information is extracted from the second output signal by applying a frequency to voltage conversion to the second output signal, filtering out at least one frequency component, and processing an analog output voltage.

23. The system of claim 19, wherein the LDA is configured to down convert in frequency the input signal or the second input signal to produce the second output signal having the third frequency at the second output port.

24. The system of claim 19, wherein the input signal or the second input signal comprises modulation information, and wherein the modulation information is extractable from the second output signal.

25. The system of claim 24, wherein the modulation information is extractable from the second output signal by frequency to voltage conversion and frequency selection through filtering.

26. A radio frequency (RF) front end comprising:
    a logarithmic detector amplifier (LDA) comprising:
        an amplifying circuit having an input port, and configured to receive, at the input port, an input signal having a first frequency and to generate an oscillation based on the input signal;
        one or more resonant circuits coupled to the amplifying circuit and configured to establish a frequency of operation of the system and to generate, at a first output port, a first output signal having a second frequency, the second frequency being substantially the same as the first frequency; and
        a controller circuit connected to the amplifier input and configured to cyclically terminate oscillation of the input signal each time a pre-determined threshold of voltage is detected, the controller circuit including a low pass filter configured to generate, at a second output port, a second output signal having a repetition frequency at a third frequency; and
    an antenna coupled to the input port of the LDA, wherein the first output port of the LDA is configured to receive a second input signal having a fourth frequency, wherein the LDA is configured to amplify the second input signal to output a first transmit signal having a fifth frequency at the input port along a transmit path, wherein the fifth frequency is substantially the same as the fourth frequency; and
    wherein the antenna is configured to receive the input signal, and the LDA is configured to amplify the input signal received at the input port to output a first received signal at the second output port along a receive path.

27. The RF front end of claim 26, wherein the LDA functions as at least one of a full-duplex bidirectional amplifier, a half-duplex bidirectional amplifier, a band pass filter, a transmit/receive switch, or a transmit power detector.

28. The RF front end of claim 26, wherein the LDA is configured to function as a bandpass filter.

29. The RF front end of claim 26, wherein the transmit path includes multiple transmit power amplifiers and the receive path comprises two or more LDAs connected in a half-duplex configuration.

30. The RF front end of claim 26 wherein the transmit path comprises a variable transmitter and the receive path comprises a variable receiver including an adjustable LDA to support frequency division duplex (FDD), frequency division multiplex, or full duplex or half-duplex time division multiplex.

31. The RF front end of claim 26, wherein the LDA functions as a receive low noise amplifier (LNA) along the receive path and as a transmit power amplifier along the transmit path.

32. The RF front end of claim 26, wherein the LDA FM modulates or demodulates at least one of the input signal or the second input signal.

33. The RF front end of claim 26, wherein the LDA AM or PM modulates or demodulates at least one of the input signal or the second input signal.

34. The RF front end of claim 26, wherein the LDA separates the transmit path and the receive path to isolate the second input signal from the input signal.

35. The RF front end of claim 26, further comprising a splitter coupled to the first output port of the LDA, wherein the splitter is configured to separate the transmit path and the receive path to isolate the second input signal from the input signal.

36. The RF front end of claim 26, wherein the LDA is configured to demodulate the input signal.

37. The RF front end of claim 26, wherein the antenna is at least one of steerable or adjustable.

38. The RF front end of claim 26, wherein the antenna is configured for beam forming and comprises:
M sub-antennas, the M sub-antennas connected by a decoupling line;
an adjustable phase shifter coupled to each M sub-antenna, each phase shifter configured to output a M phase-shifted output;
one or more controllers configured to control each phase shifter; and
a combiner coupled to each phase shifter and the LDA, wherein the combiner is configured to combine the M phase-shifted outputs.

39. The RF front end of claim 38, wherein each adjustable phase shifter comprises at least one of one or more lumped LC components with adjustable Li or Ci components; one or more microstrip lines and lumped adjustable capacitors; or a shunt single-pole-R-throw switch with R lines of different electrical phase Pi on each R switch position.

40. The RF front end of claim 26, further comprising a 1-to-N splitter or 1-to-N transmit/receive switch coupled to the RF front end and coupled to N adjustable antennas, wherein each of the N adjustable antennas is independently adjustable or steerable to select one or more frequency bands for transmission or reception.

41. The RF front end of claim 40, wherein at least one of the N adjustable antennas is steerable and operable to null out a portion of a radiation pattern of the at least one N adjustable antenna.

42. The RF front end of claim 40, wherein the N adjustable antennas are coupled to at least one adjustment circuit, wherein the adjustment circuit controls a radiation pattern of each of the N adjustable antennas.

43. The RF front end of claim 26, further comprising at least one matching circuit coupled to at least one of the input port, the first output port, or the second output port of the LDA.

44. The RF front end of claim 26, further comprising at least one of:
a logarithmic power detector configured to measure a transmit power or a receive power in dB and convert the transmit power or the receive power to a voltage output; or
a digital controller or an analog configured to control one or more parameters of the RF front end.

45. The system of claim 26, further comprising a second antenna coupled to the first output port of the LDA, the second antenna configured to transmit the first output signal amplified by the LDA operating in a forward mode.

46. The system of claim 45, further comprising a splitter coupled to the first output port of the LDA, wherein the LDA is configured to operate in a reverse mode and the forward mode concurrently.

47. The system of claim 46, wherein the second input signal comprises one or more first carriers and one or more first modulations;
wherein the splitter directs the second input signal to the first input port of the LDA;
wherein the LDA is configured to amplify the second input signal to produce the first transmit signal comprising substantially the one or more first carriers and the one or more first modulations;
wherein the input signal comprises one or more second carriers and one or more second modulations;
wherein the splitter directs the input signal to the first output port of the LDA; and
wherein the LDA is configured to amplify the input signal to produce the first output signal comprising substantially the one or more second carriers and the one or more second modulations.

48. A radio frequency (RF) front end comprising:
a logarithmic detector amplifier (LDA) comprising:
an amplifying circuit having an input port, and configured to receive, at the input port, an input signal having a first frequency and to generate an oscillation based on the input signal;
one or more resonant circuits coupled to the amplifying circuit and configured to establish a frequency of operation of the system and to generate, at a first output port, a first output signal having a second frequency, the second frequency being substantially the same as the first frequency; and
a controller circuit connected to the amplifier input and configured to cyclically terminate oscillation of the input signal each time a pre-determined threshold of voltage is detected, the controller circuit including a low pass filter configured to generate, at a second output port, a second output signal having a repetition frequency at a third frequency;
a first antenna coupled to the first output port of the LDA, wherein the first output port of the LDA is configured to receive a second input signal, wherein the LDA is configured to amplify the second input signal to output a first receive signal at the input port along a first receive path, and wherein the LDA is configured to amplify the input signal to output and transmit the first output signal using the first antenna along a first transmit path; and
a second antenna coupled to the second output port of the LDA, wherein the second output port of the LDA is configured to receive a third input signal, wherein the LDA is configured to amplify the third input signal to output a second receive signal at the input port along a second receive path, and wherein the LDA is configured to amplify the input signal to output and transmit the first output signal using the second antenna along a second transmit path.

* * * * *